United States Patent [19]

Shimizu et al.

[11] Patent Number: 5,325,583
[45] Date of Patent: Jul. 5, 1994

[54] METHOD FOR MANUFACTURING PRINTED CIRCUIT BOARD

[75] Inventors: Seizaburo Shimizu, Yokohama; Osamu Sasaki, Sagamihara; Akira Yoshizumi, Yokohama; Hideo Ohta, Tokyo, all of Japan

[73] Assignee: Kabushiki Kaisha Toshiba, Kawasaki, Japan

[21] Appl. No.: 958,476

[22] Filed: Oct. 8, 1992

Related U.S. Application Data

[63] Continuation of Ser. No. 766,670, Sep. 27, 1991, abandoned.

[30] Foreign Application Priority Data

Sep. 28, 1990 [JP] Japan ................ 2-259022
Nov. 16, 1990 [JP] Japan ................ 2-308474
May 30, 1991 [JP] Japan ................ 3-127810
Aug. 15, 1991 [JP] Japan ................ 3-205285

[51] Int. Cl.[5] .............. H05K 3/10; H01K 3/10; B23P 19/00
[52] U.S. Cl. ............ 29/849; 29/846; 29/852; 29/853; 29/745; 156/261; 156/298; 156/303.1
[58] Field of Search ........... 29/848, 849, 745, 755, 29/831, 846, 847, 852, 853; 156/261, 298, 303.1; 174/268; 361/414

[56] References Cited

U.S. PATENT DOCUMENTS 2,886,880 5/1959 Eisler .
4,313,995 2/1982 Delgadillo ............ 156/261

FOREIGN PATENT DOCUMENTS 808052 7/1951 Fed. Rep. of Germany .
1490231 11/1968 Fed. Rep. of Germany .
1816886 7/1969 Fed. Rep. of Germany .
2107591 8/1972 Fed. Rep. of Germany .
51-126277 11/1976 Japan .
231392 11/1985 Japan ................ 29/831
152792 6/1989 Japan ................ 29/831
410087 10/1966 Switzerland .
1259837 1/1968 United Kingdom .

OTHER PUBLICATIONS

Haddad, M. M. & Walsh, T. J.; IBM Tech. Disclosure Bull. "Mechanically Bonded Printed Circuit"; vol. 2, No. 1; Jun. 1959; p. 9.
Webb, E. J.; Walsh, T. J.; Bolda, F. J.; "Flush Molding of Printed Circuitry"; IBM Tech. Disclosure Bull.; vol. 8, No. 8; Jan. 1966; p. 1025.

*Primary Examiner*—P. W. Echols
*Attorney, Agent, or Firm*—Oblon, Spivak, McClelland, Maier & Neustadt

[57] ABSTRACT

There is disclosed a method for manufacturing a printed circuit board in which fine copper circuit patterns are transferred onto a thermoplastic resin, without producing a large amount of waste liquors in which copper is dissolved unlike in a subtract method. The method for manufacturing a printed circuit board includes the steps of manufacturing a printed circuit original plate having protruding patterns which have the same shape as circuit patterns to be formed and a height at least the same as the thickness of a copper foil used and each of which is constituted by a flat or projecting curved surface to be brought into contact with the copper foil and side surfaces different from the flat or projecting curved surface, and heating under pressure the protruding patterns of the original plate against a thermoplastic resin with the copper foil interposed therebetween to transfer portions of the copper foil in contact with the protruding patterns onto the surface of the thermoplastic resin, thereby forming the circuit patterns.

34 Claims, 38 Drawing Sheets

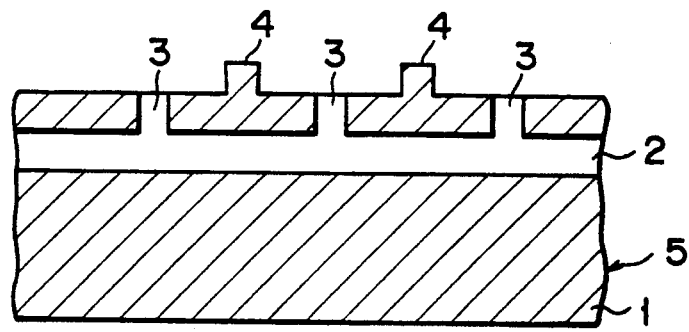
F I G. 1A
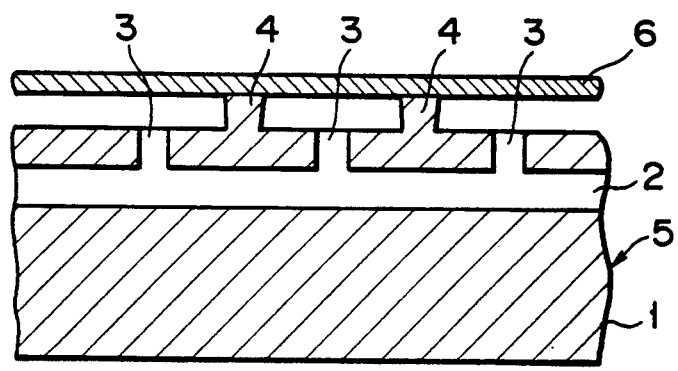
F I G. 1B
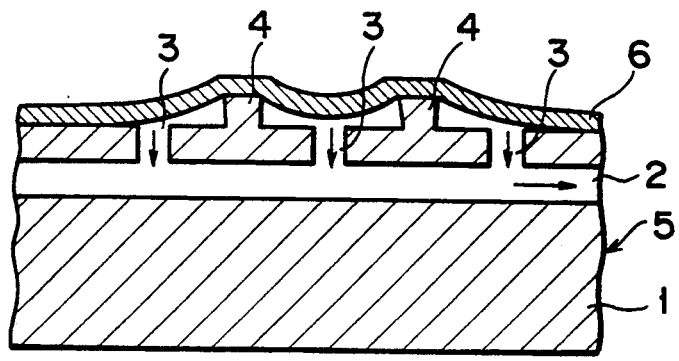
F I G. 1C

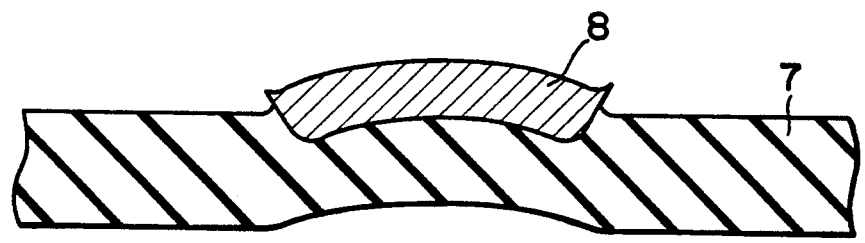
F I G. 2A
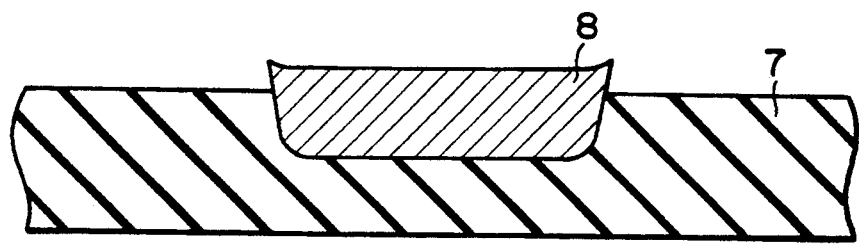
F I G. 2B

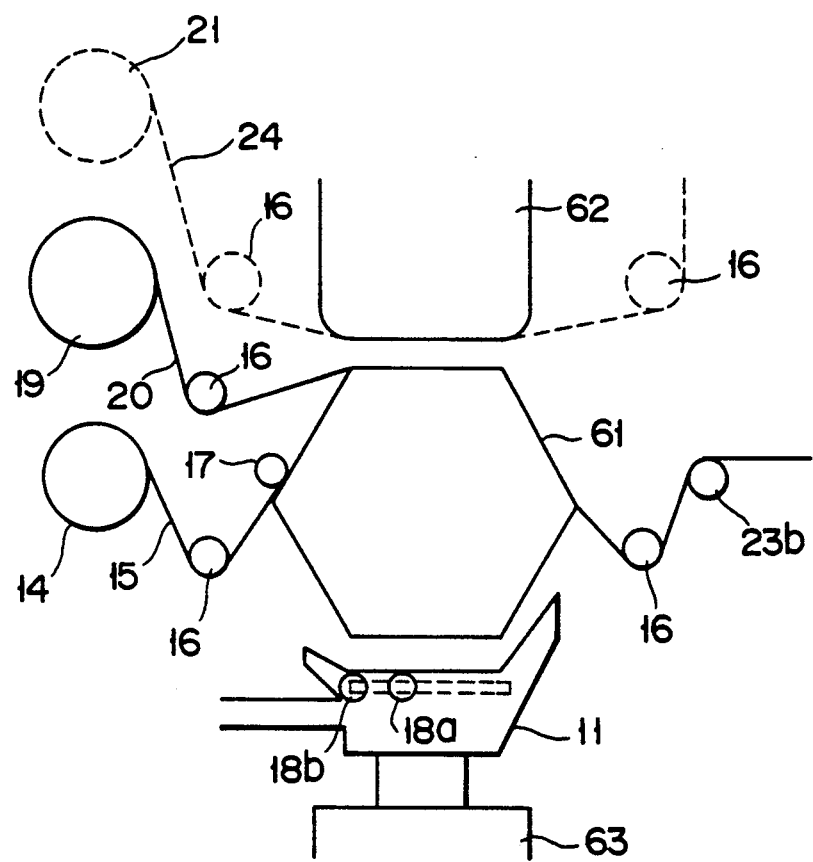
F I G. 7

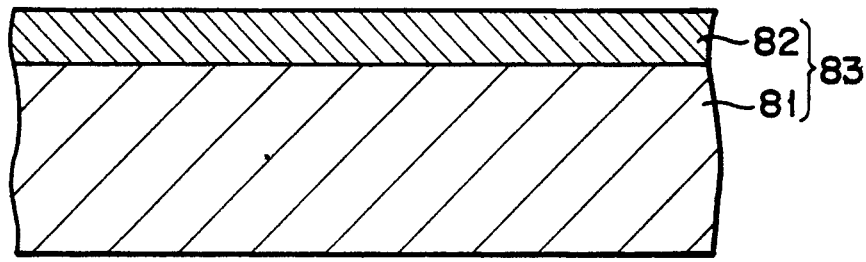
F I G. 8A
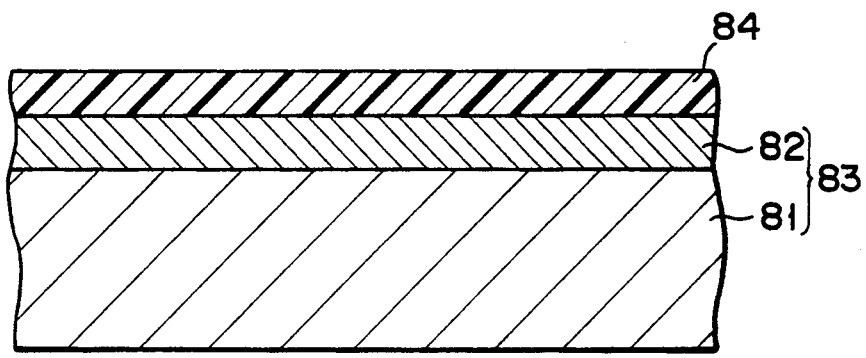
F I G. 8B
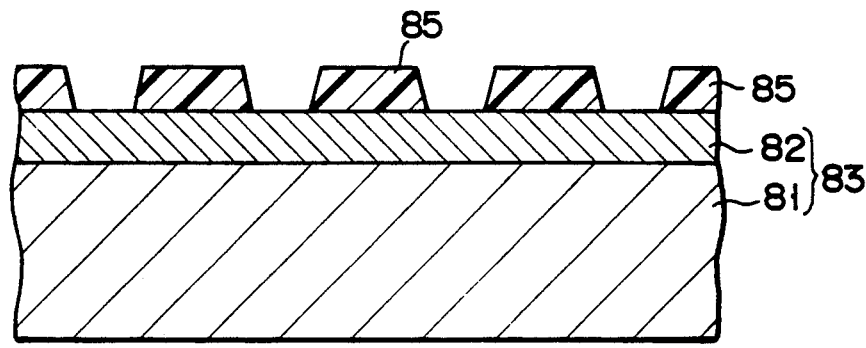
F I G. 8C

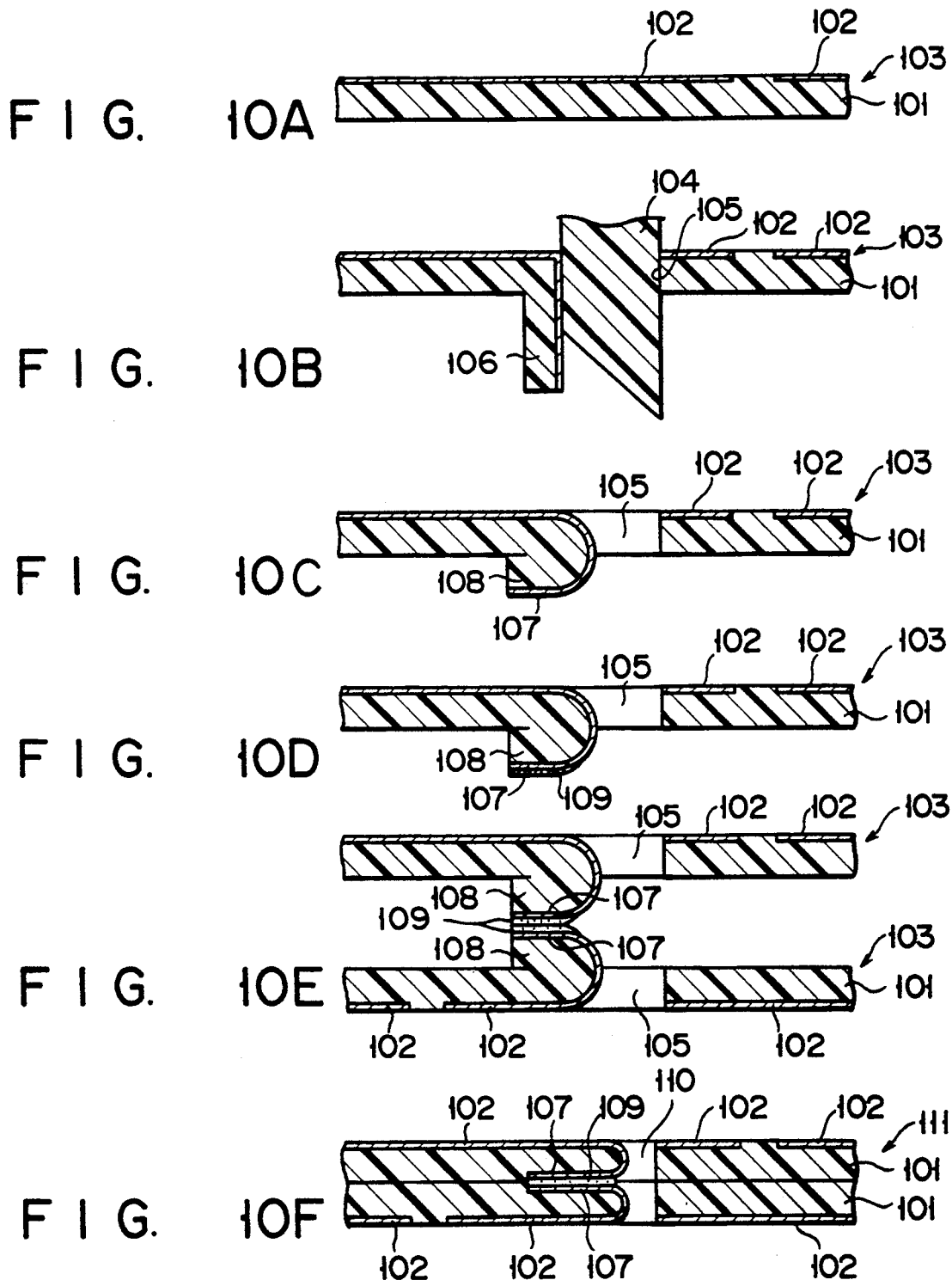

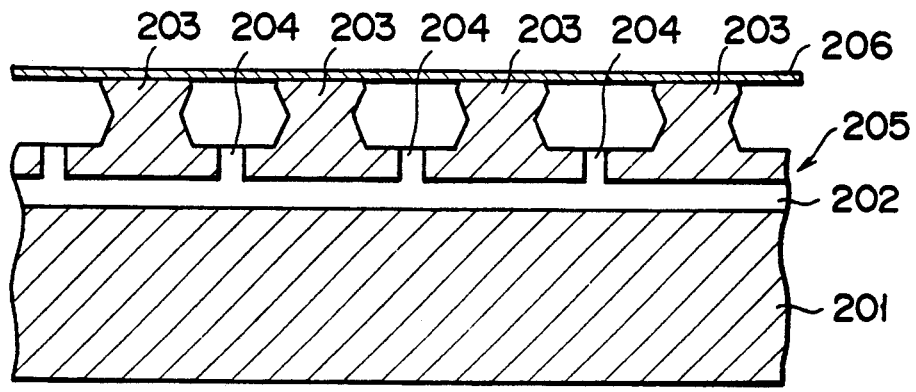
F I G. 15A
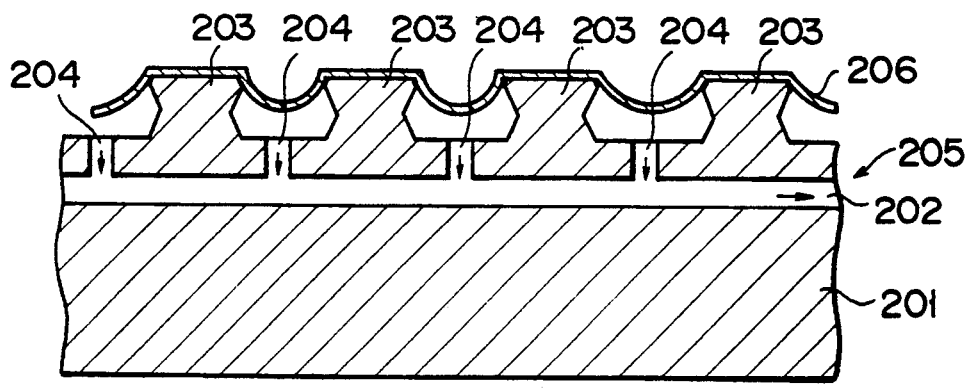
F I G. 15B
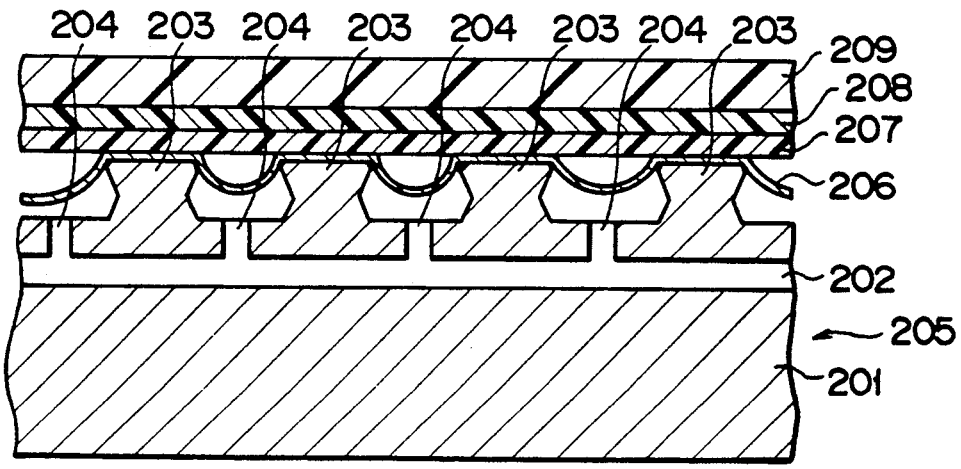
F I G. 15C

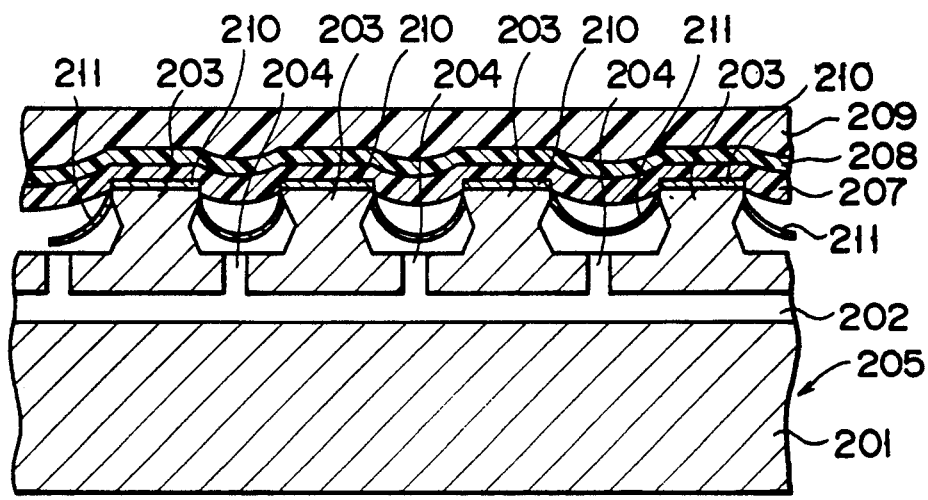
F I G. 15D
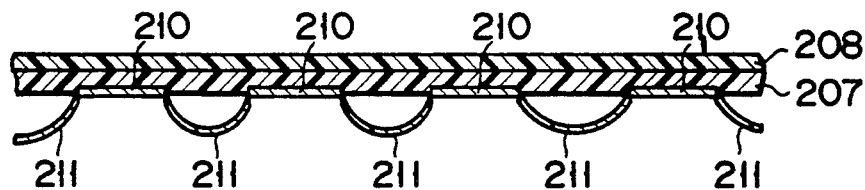
F I G. 15E
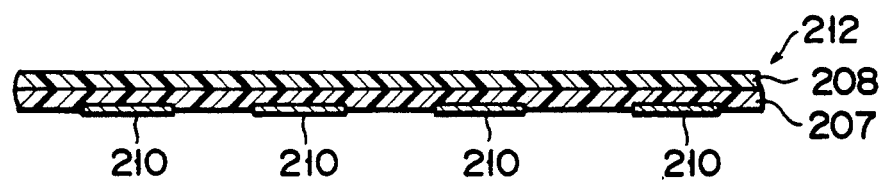
F I G. 15F

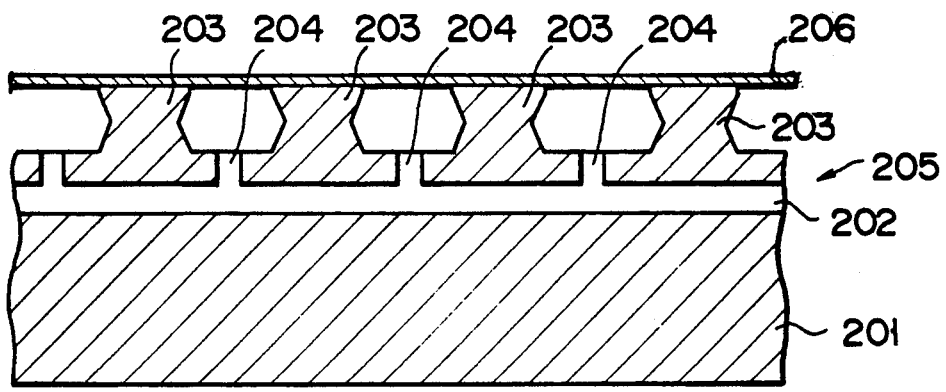
F I G. 18A
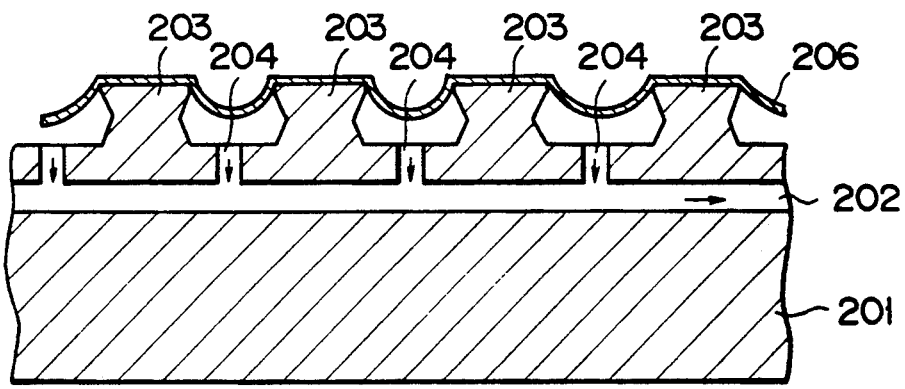
F I G. 18B
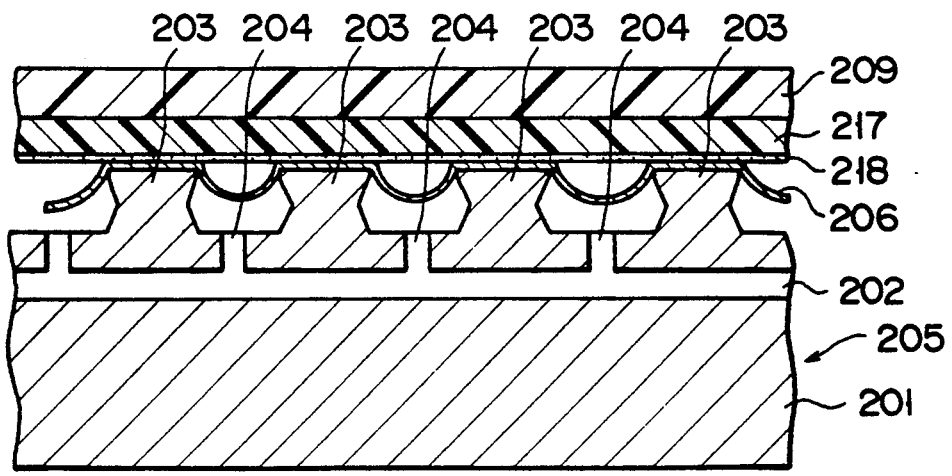
F I G. 18C

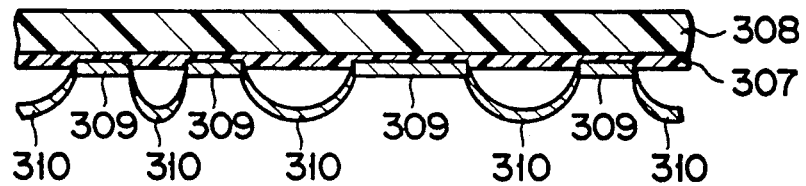
F I G. 19D
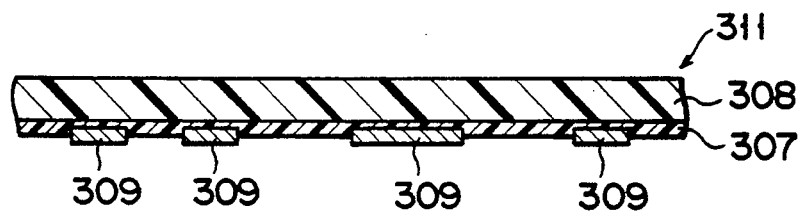
F I G. 19E

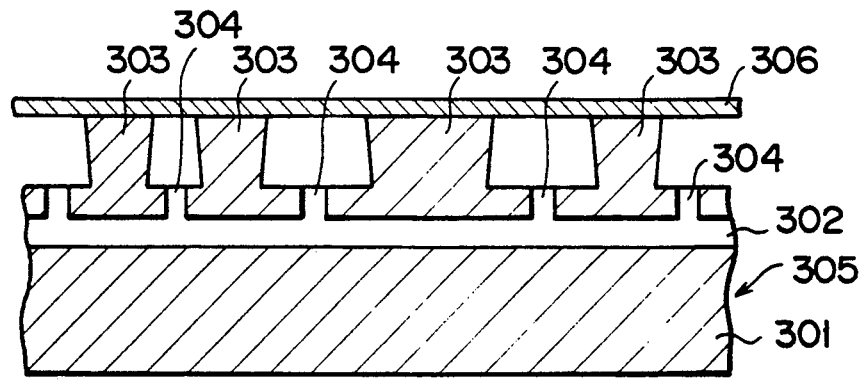
F I G. 21A
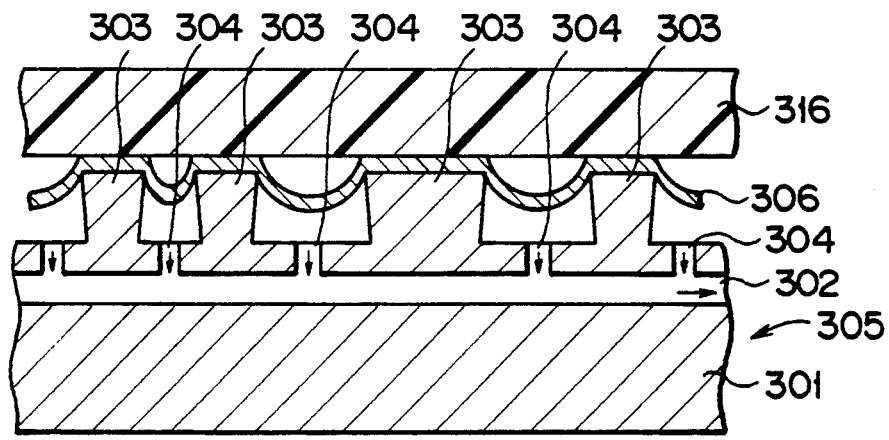
F I G. 21B
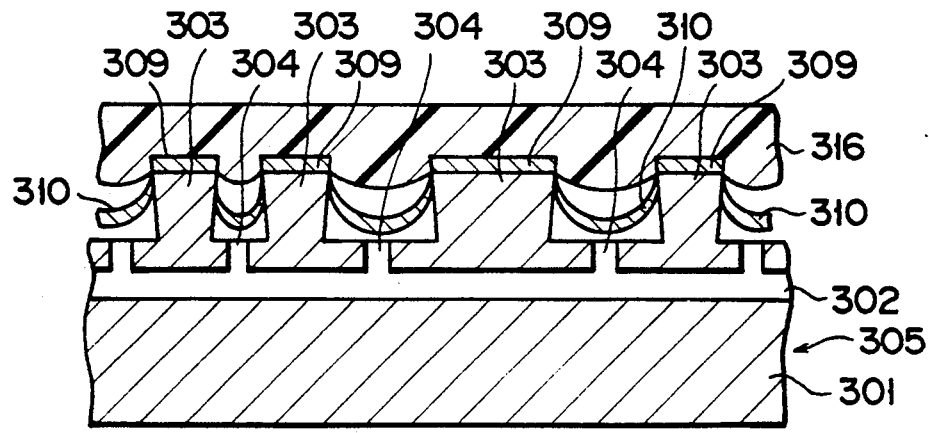
F I G. 21C

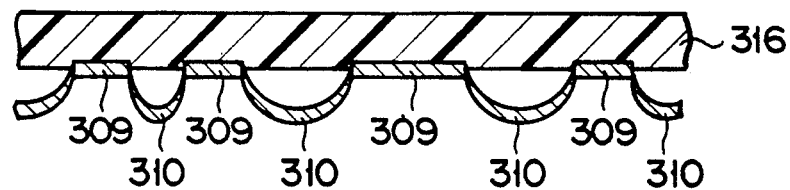
F I G. 21D
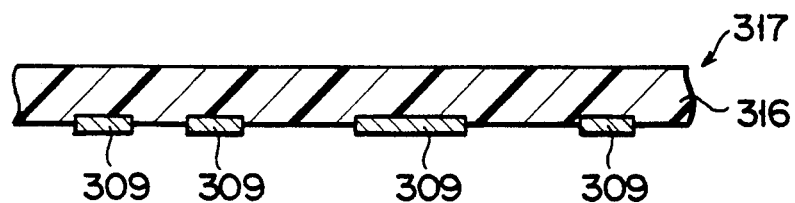
F I G. 21E

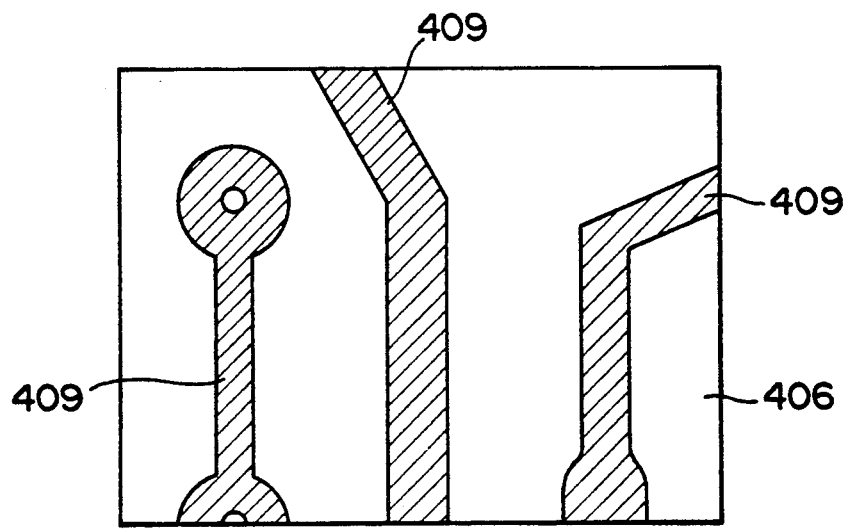
F I G. 24
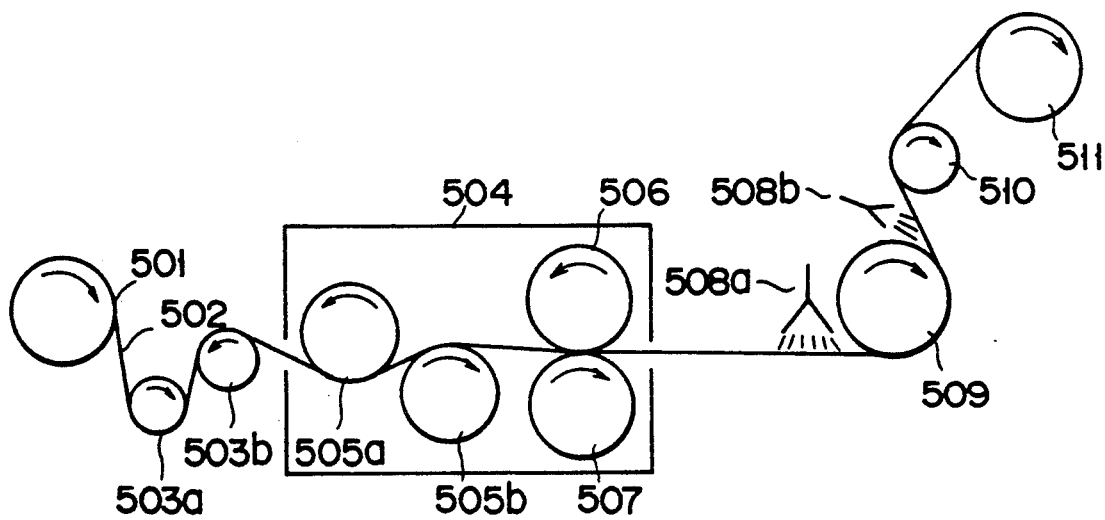
F I G. 25

METHOD FOR MANUFACTURING PRINTED CIRCUIT BOARD

This application is a continuation of application Ser. No. 07/766,670, filed on Sep. 27, 1991, now abandoned.

BACKGROUND OF THE INVENTION

1. Field of the Invention

The present invention relates to a method for manufacturing a printed circuit board and, more particularly, to a method for manufacturing a printed circuit board, in which a step of forming circuit patterns is improved.

2. Description of the Related Art

A subtract method is conventionally known as a method for manufacturing a printed circuit board, A method for manufacturing a through hole printed circuit board according to the subtract method will be described below. First, after drilling is performed for a copper-clad laminated to form a hole, and electroless copper plating and, if necessary, electric copperplating are performed on the entire surface of the copper-clad laminate including the hole, thereby depositing a copper plating film in the inner wall surface of the hole to form a through hole. Subsequently, a filler for protecting the through hole is filled in the through hole and on the peripheral portion of the hole, and etching resist patterns are formed on the copper plating film by a photolithography method or a tenting method. The resist patterns are used as a mask to remove portions of the copper plating film and a copper foil exposed from the mask by etching to form circuit patterns, thereby manufacturing a printed circuit board.

An operation, however, of the above subtract method is cumbersome because the method requires a large number of manufacturing steps. In addition, since a large amount of waste liquors in which copper is dissolved is produced upon etching, countermeasures against environmental pollutions such as waste liquor disposal are required to result in a high running cost. Furthermore, it is difficult to form circuit patterns having a fine line width because an undercut is formed or side etching occurs during etching.

In view of the foregoing, an additive method using no copper-clad laminate is developed. In this additive method, drilling is performed for a laminate to form a hole, and the entire surface of the laminate is subjected to a catalyst treatment. Subsequently, plating resist patterns as complementary patterns of circuit patterns to be formed are formed, and electroless copper plating is performed to deposit an electroless copper plating film on the inner wall surface of the hole and the surface of the laminate exposed from the resist patterns, thereby forming a through hole and circuit patterns. Thereafter, removal of the plating resist patterns and the catalyst layer is performed to manufacture a printed circuit board. This additive method, however, requires a special plating solution in order to improve adhesion properties between the copper plating film and the laminate. In addition, since copper tends to precipitate on portions of the laminate except for a necessary portion, it is difficult to form fine circuit patterns. Furthermore, this method also has the same problem of waste liquor disposal as the subtract method.

As a method for manufacturing a printed circuit board without producing any waste liquor, a conventional die stamp method (Published Unexamined Japanese Patent Application No. 51-126277) is known. In this method, a metal mold having a blade protruding toward the outer peripheries of protruding patterns having the same shape as circuit patterns to be formed is used, and a metal foil with an adhesive is superposed on the surface of an insulating base. The metal mold is heated or pressed at room temperature to cut the metal foil with an adhesive into the shape of the circuit patterns, and at the same time the periphery of the metal foil is pushed in and bonded to the insulating base. In this method, however, since the cutting blade is formed at the peripheries of the circuit patterns of the metal mold so as to be vertical with respect to the circuit surface, it is difficult to form fine circuit patterns. In addition, when the cutting blade wears in use, the cut circuit width becomes nonuniform. Since further use of the worn cut blade makes the blade unable to make a cut, noncircuit portions are bonded with each other. Since it is very difficult to sharpen such a dull blade because of the above-mentioned shape of the mold, the number of products manufacturable per blade is very small.

In addition, when a resin film is used as the insulating base, a cut portion is formed on the surface of the resin film upon punching by the blade of the metal mold to possibly cause poor insulation. Furthermore, when wide circuit patterns are to be formed, since the blade of the metal mold initially abuts against a copper foil, air cells are easily formed between the copper foil and the insulating base. As a result, since the air cells are not removed even when the protruding patterns of the metal mold are urged against punched portions of the copper foil, circuit patterns cannot be formed on the insulating base with high adhesion force. This method also has a problem of difficulty in micropatterning of circuit patterns.

SUMMARY OF THE INVENTION

It is an object of the present invention to provide a method for manufacturing a printed circuit board in which fine circuit patterns are transferred onto a thermoplastic resin by simple manufacturing steps without producing a large amount of waste liquors in which copper is dissolved unlike in a conventional subtract method.

It is another object of the present invention to provide a method for manufacturing a printed circuit board having a structure in which interlayer circuit patterns are connected by a dry process free from a problem of disposal of waste liquors such as a plating solution, an etching solution, and a washing solution.

It is still another object of the present invention to provide a method for manufacturing a printed circuit board having a multilayered structure in which circuit patterns are precisely formed by preventing positional deviation or deformation of the circuit patterns upon lamination of a single-sided printed circuit base plate having the circuit patterns.

It is still another object of the present invention to provide a method for manufacturing a printed circuit board in which circuit patterns having a fine line width are buried in a flat or curved surface at the same level as the surface by retransferring the circuit patterns onto an insulating base such as a prepreg by using a transfer film without producing waste liquors in which a large amount of copper is dissolved.

According to the present invention, there is provided a method for manufacturing a printed circuit board, comprising the steps of:

manufacturing a printed circuit original plate having protruding patterns which have the same shape as circuit patterns to be formed and a height at least the same as the thickness of a metal foil used and each of which is constituted by a flat or projecting curved surface to be brought into contact with the metal foil and side surfaces different from the flat or projecting curved surface; and heating under pressure the protruding patterns of the original plate against a thermoplastic resin with the metal foil interposed therebetween to transfer portions of the metal foil in contact with the protruding patterns onto the surface of the thermoplastic resin, thereby forming the circuit patterns.

The printed circuit original plate is used in the form of a flat plate or a ring fitted on a roll.

The printed circuit original plate is concretely manufactured by, e.g., the following methods.

(a) A base material is formed by coating a metal film having high hardness such as a nickel plating film on a polished surface of a steel member, and resist patterns having the same shape as circuit patterns to be formed are formed on the surface of the base material. Thereafter, the resist patterns are used as a mask to etch the surface of the base material to form protruding patterns having the same shape as the circuit patterns, thereby manufacturing the printed circuit original plate.

(b) The surface of the base material described above is processed by a milling machine to form the protruding patterns, thereby manufacturing the printed circuit original plate.

(c) The protruding patterns are directly formed on a metal base material by primary processing or laser processing, thereby manufacturing the printed circuit original plate.

(d) Protruding patterns, consisting of a metal different from that forming a base material and each having a lower portion wider than an upper portion, are formed such that the lower portion is buried in the surface of the base material, thereby manufacturing the printed circuit original plate.

Of the methods (a) to (d) described above, the method (d) is especially preferred because a printed circuit original plate having protruding patterns excellent in durability can be manufactured. As a result, even when the printed circuit original plate is repeatedly used in a transfer step performed by heating under pressure, high-precision circuit patterns having a target line width can be transferred.

In order to smoothly and easily perform transfer of the metal foil to the surface of the thermoplastic resin using the original plate and peeling of an unnecessary metal foil, it is preferred to form a large number of depressurizing/pressurizing holes in a region of the surface except for the protruding patterns of the original plate and to form a communication hole communicating with each of the large number of holes formed in the original plate and having an end connected to a depressurizing/pressurizing pipe. Alternatively, an original plate having a communication hole which communicates with a depressurizing/pressurizing channel formed in a receiving steel plate and has an end connected to a depressurizing/pressurizing pipe is preferably superposed on the receiving steel plate.

The height of the protruding patterns formed on the original plate is limited to at least the same as the thickness of the metal foil for the following reason. That is, if the height of the protruding portion is smaller than the thickness of the metal foil, the metal foil is deformed by the protruding patterns when the thermoplastic resin is heated under pressure via the metal foil by using the original plate. In addition, a stress cannot be concentrated on a corner portion of each protruding pattern between its surface in contact with the metal foil and its side surfaces to fail to break the metal foil or to fail to set the metal foil in an easy-to-break state. As a result, it is difficult to remove an unnecessary metal foil. The upper limit of the height of the protruding patterns is preferably 20 times the thickness of the metal foil for the following reason. That is, if the height of the protruding portion exceeds 20 times the thickness of the metal foil, fine line patterns cannot be formed due to side etching occurring upon formation of the protruding patterns, and the patterns may be damaged in the step of heating under pressure. Note that if circuit patterns to be formed are not so fine or a metal mold is manufactured by processing using a milling machine, discharge processing, or laser processing, the maximum height of the protruding patterns is not particularly limited.

The reason why the surface of each protruding pattern formed on the original plate, which is brought into contact with the metal foil, is a flat or projecting curved surface is that the metal foil and the thermoplastic resin can be bonded with each other without entrapping air cells therebetween when the surface is a flat surface. When, on the other hand, the surface is a projecting curved surface, in which case the protruding patterns are formed on the surface of a curved member such as a roll, the metal foil and the thermoplastic resin can be similarly bonded with each other without entrapping air cells therebetween. In addition, the reason why the surface of each protruding pattern to be brought into contact with the metal foil is different from its side surfaces is that a stress is concentrated on the metal foil by a corner of the pattern between its surface in contact with the metal foil and its side surfaces. As a result, the metal foil is extended to be thin at the corner portions and cut or set in an easy-to-cut state while the shape of the circuit patterns is maintained. If, on the contrary, the surface of each protruding pattern in contact with the metal foil and its side surfaces are continuously formed into one surface, the entire curved surface is extended and cut with nicks, resulting in a nonuniform circuit width. In the present invention, if an angle of a corner of each protruding pattern between its surface in contact with the metal foil and its each side surface is large, it may be hard to break the metal foil. If the angle is small, the protruding patterns are easily damaged. For this reason, the angle is preferably 60° to 90°.

In addition to the protruding patterns for forming the circuit patterns, the original plate is allowed to have protruding patterns having the same shape as patterns of characters or marks to be formed and a height at least the same as the thickness of the metal foil and each constituted by a flat or curved surface to be brought into contact with the metal foil and side surfaces different from the flat or curved surface. These protruding patterns are formed on a portion of the base material corresponding to a noncircuit pattern region of a printed circuit board to be manufactured.

Examples of the metal foil are a copper foil and a nickel foil.

The thermoplastic resin is used in the form of a flat plate or a film.

Examples of the thermoplastic resin are polymers such as polyethyleneterephthalate, polybutyleneterephthalate, polysulfone, polyethersulfone, polyphenylenesulfide, polyetheretherketone, polyphenyleneether, polyphenyleneoxide, a liquid crystal polymer, polyetherimide, polycarbonate, polytetrafluoroethylene, polytetrafluoroethyleneperfluoroalkylether, polyethylene, polypropylene, polymethylpentene, polyethercarbonate, oxybenzoylpolyester, polyketonesulfide, polyarylate, polyacetal, polyamide, polyethylene, polyamideimide, polyparabanic acid, polyester, ionomer, an EEA resin, an AAS resin, an acrylonitrilestyrene resin, an ACS resin, an ABS resin, polyvinyl chloride, polystyrene, an acrylic resin, polybutadiene, and an ethylene-vinyl acetate copolymer; modified resins of these polymers; and a polymer alloy thereof.

It is also possible to use a so-called thermosetting resin in place of the thermoplastic resin, provided that the surface layer of the thermosetting resin in a thickness corresponding to the thickness of the metal foil substantially exhibits a plasticity under the temperature in the pressurizing step under heat by the printed circuit original plate.

When the thermoplastic resin is an amorphous thermoplastic resin, the heating under pressure using the printed circuit original plate is preferably performed at a temperature higher by 10° C. to 40° C. than the heat deformation temperature of the resin. When the film consists of a crystalline thermoplastic resin, the heating under pressure is preferably performed at a temperature different by 20° C. or less from the melting point of the resin.

When the thermoplastic resin is a film, the heating under pressure using the printed circuit original plate is preferably performed by bonding a rubber or resin, which has an elastic modulus in use lower than that of the thermoplastic resin film and deforms upon pressing, as a caul on the surface of the film. Alternatively, a press jig coated with this rubber or resin is used to press the film surface opposite to the side where the metal foil is present, or a caul consisting of the rubber or resin is arranged between the film and a press jig to perform pressing.

After the portions of the metal foil in contact with the protruding patterns of the original plate are transferred onto the surface of the film by heating under pressure, in order to improve precision of the obtained circuit patterns, the metal foil portions (circuit patterns) on the film are preferably slightly ground by a roll having an abrasive material (e.g., sandpaper) on its surface or urged by a roll having a wavily roughened surface. The surface roughness of the latter roll preferably corresponds to #180 to #320 of sandpaper. If the surface roughness of the roll is less than #320, it is difficult to satisfactorily correct deformation on small portions of the metal foil (circuit patterns) transferred on the film. If the surface roughness of the roll exceeds #180, the circuit patterns may be peeled or cut when the roll is urged against it.

According to the present invention as described above, a printed circuit original plate having protruding patterns with the same shape as circuit patterns to be formed is heated under pressure on a thermoplastic resin with a metal foil interposed therebetween. In this step, since each protruding pattern of the original plate has a height at least the same as the thickness of the metal foil and is constituted by a flat or projecting curved surface to be brought into contact with the metal foil and side surfaces different from the flat or projecting curved surface, the metal foil is extended to be thin by stress concentration at a corner of each protruding pattern between its surface in contact with the metal foil and its side surfaces. Therefore, since the metal foil is cut or set in an easy-to-cut state, an unnecessary metal foil can be easily removed to transfer the circuit patterns. As a result, circuit patterns having high adhesion strength with respect to the thermoplastic resin can be formed. In addition, when the protruding patterns of the original plate are manufactured by etching using fine resist patterns formed by a photolithography method as a mask, the width and the interval of transferred circuit patterns can be decreased, and an angle of a corner of the pattern between its surface in contact with the metal foil and its each side surface can be defined to be 90° or less by side etching or the like. As a result, cutting of the metal foil is facilitated.

Since, therefore, the method of the present invention does not require a step of etching a metal foil (e.g., a copper foil) unlike in a conventional subtract method, a problem of producing a large amount of waste liquors in which copper is dissolved can be solved. In addition, a fine metal foil can be transferred onto a thermoplastic resin without forming an undercut or causing side etching during etching which is a problem in the subtract method. Therefore, a flexible printed circuit board in which circuit patterns having a fine line width are formed on a thermoplastic resin or a cubic printed circuit board formed on the inner surface of a box or the like can be easily manufactured. Furthermore, unlike in a conventional additive method, circuit patterns having high adhesion strength with respect to a thermoplastic resin can be formed without using any special plating solution.

Moreover, as compared with a conventional die stamp method using a metal mold having a blade protruding at the outer peripheries of protruding patterns, fine circuit patterns can be transferred on the lower surface of a metal foil without using an adhesive. In addition, since the surface of each protruding pattern, which is brought into contact with the metal foil, is a flat or projecting curved surface, deformation in a corner of the pattern between the surface and each side surface can be easily corrected by grinding the surface. Therefore, even when a large number of printed circuit boards are manufactured, uniform circuit patterns having no difference between those manufactured in the initial and final periods can be transferred. Since the elasticity of a thermoplastic resin on a transfer portion can be changed by the heating temperature, the pressure, and the press time of the metal upon transfer of the metal foil onto the resin, the depth of the buried metal foil into the thermoplastic resin can be controlled. As a result, the depth can be freely adjusted such that the metal foil is buried lower than the resin surface, only a bottom portion of the metal foil is buried, or the metal foil is buried at the same level as the resin surface.

In addition, when a large number of depressurizing/pressurizing holes are formed in a region of the surface of the original plate except for the protruding portion and a communication hole communicating with each of the large number of holes and having an end connected to a depressurizing/pressurizing pipe is formed in the original plate, a metal foil can be deflected in contact with the surfaces of the protruding patterns by vacuum suction through the holes via the pipe and the communication hole after the metal foil is placed on the protruding patterns of the original plate. As a result, in the heating under pressure using the original plate performed after a thermoplastic resin is arranged on the surface of the metal foil opposite to the original plate, the metal foil can be cut or set in an easy-to-cut state more easily in correspondence with the protruding patterns. Also, since unnecessary portions of the metal foil can be prevented from being bonded to the surface of the thermoplastic resin softened with heat, micropatterning and high precision of circuit patterns can be achieved. Note that an unnecessary metal foil not perfectly cut and removed in this step can be reliably removed by brushing the surface of the thermoplastic resin on which the circuit patterns are transferred. In addition, since the unnecessary portions of the metal foil are moved to a region of the surface of the original plate except for the protruding patterns after the circuit patterns are formed by heating under pressure, the unnecessary portions of the metal foil can be easily peeled and removed from the original plate by supplying a pressure gas into the holes through the pipe and the communication hole.

When the thermoplastic resin is a film, in the step of heating under pressure, a rubber or resin which has an elastic modulus in use lower than that of the thermoplastic resin film and deforms upon pressing is bonded as a caul on the surface of the film, a press jig coated with this rubber or resin is used to press the film, or a caul consisting of the rubber or resin is arranged between the original plate and a press jig to perform pressing. According to this method, even when the film consists of a thermoplastic resin having a comparatively high elastic modulus, the metal foil arranged between the film and the original plate can be reliably cut or set in an easy-to-cut state by corners of the protruding patterns of the original plate.

That is, when the film consists of a thermoplastic resin having a comparatively high elastic modulus, in the step of heating under pressure using the original plate and a press jig, the metal foil may not be cut or set in an easy-to-cut state by the corners of the protruding patterns of the original plate, or the film may be fused when the pressure is unnecessarily increased if it is thin. For this reason, a rubber or resin which has an elastic modulus in use lower than that of the thermoplastic resin film and deforms upon pressing is interposed as a caul between the film and a press jig to perform heating under pressure using the original plate and the jig. As a result, the caul portion consisting of the rubber or resin against which the protruding patterns of the original plate are urged can be preferentially deformed. Since a force of urging the film from its back surface is generated by deformation of the caul, the film is deflected to surround the protruding patterns, and a metal foil arranged between the protruding patterns and the film is cut or set in an easy-to-cut state at the corners of the protruding patterns by the deflection force. Therefore, even when the film consists of a thermoplastic resin having a comparatively high elastic modulus, predetermined circuit patterns can be transferred onto the film.

In addition, after the metal foil brought into contact with the protruding patterns of the original plate by heating under pressure is transferred onto the surface of the thermoplastic resin film, the metal foil portions (circuit patterns) on the film are slightly ground by a roll having an abrasive material on its surface or pressed by a roll having a wavily roughened surfaced. As a result, a flexible printed circuit board having circuit patterns with high planar and dimensional precision can be obtained.

That is, when the film is removed from the original plate after the portions of the metal foil brought into contact with the protruding patterns of the original plate by heating under pressure are transferred onto the surface of the film, distortion in the thermoplastic resin film caused by pressing is released. In addition, when the film is cooled to room temperature, the transferred metal foil portions (circuit patterns) are curved to project from the film surface due to a thermal expansion coefficient difference between the film and the metal foil, thereby degrading the planar precision or the like. For this reason, the metal foil portions (circuit patterns) on the surface of the film are slightly ground by a roll having an abrasive material on its surface to smoothen the curved circuit pattern portions or are pressed by a roll having a wavily roughened surface to correct the curved circuit pattern portions. As a result, a flexible printed circuit board having circuit patterns with high planar and dimensional precision can be manufactured.

Furthermore, a printed circuit original plate may have, in addition to protruding patterns for forming circuit patterns, protruding patterns which have the same shape as patterns of characters or marks to be formed and a height at least the same as the thickness of the metal foil and each of which is constituted by a flat or curved surface to be brought into contact with the metal foil and side surfaces different from the flat or curved surface. When this printed circuit original plate is used, a printed circuit board having circuit patterns and metal patterns of characters or marks (e.g., a reference code) formed in a noncircuit pattern region can be manufactured by one transfer operation cycle.

In addition, according to the present invention, there is provided a method for manufacturing a printed circuit board, comprising the steps of:

manufacturing a printed circuit original plate having protruding patterns which have the same shape as circuit patterns to be formed and a height at least the same as the thickness of a metal foil used and each of which is constituted by a flat or projecting curved surface to be brought into contact with the metal foil and side surfaces different from the flat or projecting curved surface;

heating under pressure the protruding patterns of the original plate against a thermoplastic resin film with a metal foil interposed therebetween to transfer portions of the metal foil in contact with the protruding patterns onto the surface of the thermoplastic resin film to form the circuit patterns, thereby manufacturing a single-sided printed circuit base plate;

folding the circuit patterns of the single-sided printed circuit base plate and desired portions of the film toward the lower surface of the film, thereby forming a large number of folded portions having conductive portions formed integrally with the circuit patterns; and superposing a plurality of single-sided printed circuit base plates having the folded portions, and laminating the base plates by heating under pressure.

The printed circuit original plate is used in the form of a flat plate or a ring fitted on a roll.

The printed circuit original plate is manufactured by, e.g., the methods (a) to (d) described above.

In order to smoothly and easily perform transfer of the metal foil onto the surface of the thermoplastic resin using the original plate and peeling of an unnecessary metal foil, it is preferred to form a large number of depressurizing/pressurizing holes in a region of the surface of the original plate except for the protruding patterns and to form a communication hole communicating with each of the large number of holes formed in the original plate and having an end connected to a depressurizing/pressurizing pipe. Alternatively, an original plate having a communication hole which communicates with a depressurizing/pressurizing channel formed in a receiving steel plate and has an end connected to a depressurizing/pressurizing pipe is preferably superposed on the receiving steel plate.

The height of the protruding patterns formed on the original plate must be at least the same as the thickness of the metal foil for the same reason as described above.

The surface of each protruding pattern formed on the original plate, which is brought into contact with the metal foil, must be a flat or projecting curved surface for the same reason as described above.

In addition to protruding patterns for forming circuit patterns, the original plate is allowed to have protruding patterns having the same shape as patterns of characters or marks to be formed and a height at least the same as the thickness of the metal foil and each constituted by a flat or curved surface to be brought into contact with the metal foil and side surfaces different from the flat or curved surface. These protruding patterns are formed on a portion of the base material corresponding to a noncircuit pattern region of a printed circuit board to be manufactured.

Examples of the thermoplastic resin film are (1) a monolayered resin film, (2) a thermoplastic resin film having a softening temperature difference between its upper and lower surfaces, (3) a thermoplastic resin film having a softening temperature difference between its upper and lower surfaces and interior, and (4) a thermoplastic film having one surface coated with an adhesive layer to be described below.

(1) Monolayered resin film

As this resin film, a thermoplastic film consisting of a material selected from the materials described above or a thermosetting resin film consisting of polyimide can be used.

(2) Thermoplastic resin film having softening temperature difference between its upper and lower surfaces A softening temperature difference in this thermoplastic resin film is preferably 20° C. or more for the following reason. That is, if the softening temperature difference is less than 20° C., this temperature difference falls in the range of temperature variation during heating under pressure in the laminating step. Therefore, it is difficult to obtain a proper softening temperature difference, i.e., to prevent positional deviation or deformation of the circuit patterns formed in the laminating step.

Examples of the thermoplastic resin film are a thermoplastic resin film formed by laminating thermoplastic resin layers of the same type having different softening temperatures, and a thermoplastic resin film formed by laminating thermoplastic resin layers of different types having different softening temperatures. In the thermoplastic resin film consisting of one type of a resin, a thermoplastic resin layer to serve as a high-softening temperature layer may be added with a filler or the like to reduce its flowability, thereby increasing its apparent softening temperature. A thermoplastic resin layer having a low softening temperature serves as an adhesion layer for bonding thermoplastic resin films each having circuit patterns in the laminating step.

Examples of the thermoplastic resin film are combinations of thermoplastic resins of the same or different types having different softening temperatures such as polyethyleneterephthalate, polybutyleneterephthalate, polysulfone, polyethersulfone, polyphenylenesulfide, polyetheretherketone, polyphenyleneether, polyphenyleneoxide, a liquid crystal polymer, polyetherimide, polycarbonate, polytetrafluoroethylene, polytetrafluoroethyleneperfluoroalkylether, polyethylene, polypropylene, polymethylpentene, polyethercarbonate, oxybenzoylpolyester, polyketonesulfide, polyarylate, polyacetal, polyamide, polyethylene, polyamideimide, polyparabanic acid, polyester, ionomer, polyvinyl chloride, polyvinylidene chloride, and polystyrene.

In the step of transferring the circuit patterns onto the thermoplastic resin film, the protruding patterns of the original plate may be brought into contact with either the high-softening temperature thermoplastic resin layer or the low-softening temperature thermoplastic resin layer with the metal foil interposed therebetween. However, when the protruding patterns of the original plate are to be brought into contact with the low-softening temperature thermoplastic resin layer of the film with the metal foil interposed therebetween, the thickness of the low-softening temperature thermoplastic resin layer is preferably equal to or smaller than that of the metal foil. When such a thermoplastic resin film is used, the circuit patterns of the transferred metal foil can be stably buried and fixed in also the high-softening temperature thermoplastic resin layer of the film.

(3) Thermoplastic resin film having softening temperature difference between its upper and lower surfaces and interior As this thermoplastic resin film, a thermoplastic resin film formed by coating or laminating low-softening temperature thermoplastic resin layers on both surfaces of a high-softening temperature thermoplastic resin layer can be used. The thickness of the low-softening temperature thermoplastic resin layer is preferably equal to or smaller than that of the metal foil. In the thermoplastic resin film consisting of one type of a resin, a thermoplastic resin layer to serve as a high-softening temperature layer may be added with a filler or the like to reduce its flowability, thereby increasing its apparent softening temperature. A thermoplastic resin layer having a low softening temperature serves as an adhesion layer for bonding thermoplastic resin films each having circuit patterns in the laminating step.

(4) Thermoplastic resin film having one surface coated with adhesive layer

When this film is used, the protruding patterns of the printed circuit original plate are brought into contact with the adhesive layer with the metal foil interposed therebetween.

Examples of the adhesive are a hot-melt adhesive, a thermosetting resin, and a pressure-sensitive adhesive. Examples of the hot-melt adhesive are a thermoplastic resin and a rubber adhesive, each having a softening temperature lower than that of a thermoplastic resin used. Examples of the thermosetting resin are an epoxy resin adhesive, an urethane resin adhesive, an acrylic resin adhesive, a phenolic resin adhesive, and a polyester adhesive. Examples of the pressure-sensitive adhesive are an epoxy resin adhesive, an urethane resin adhesive, an acrylic resin adhesive, and a phenolic resin adhesive, in each of which an encapsulized hardener is added to the resin. In particular, it is preferred to use an adhesive layer which is solid at room temperature and has high viscosity upon melt-hardening because a shearing force is increased when the melt viscosity is high upon cutting in the step of transferring the metal foil using the original plate.

The thickness of the adhesive layer is preferably smaller than that of the metal foil used. Otherwise, the amount of the adhesive moving to the side surfaces of the circuit patterns becomes larger than that of the adhesive moving to the lower surfaces of the circuit patterns in the step of transferring the metal foil using the original plate. As a result, an excessive metal foil on a noncircuit pattern portion adheres on the adhesive layer to become difficult to peel.

Examples of the metal foil are a copper foil and a nickel foil.

When the thermoplastic resin film in contact with the metal foil consists of an amorphous thermoplastic resin, the heating under pressure using the printed circuit original plate is preferably performed at a temperature higher by 10° C. to 40° C. than the heat deformation temperature of the resin. When the film consists of a crystalline thermoplastic resin, the heating under pressure is preferably performed at a temperature different by 20° C. or less from the melting point of the resin.

The heating under pressure using the printed circuit original plate is preferably performed by bonding a rubber or resin, which has an elastic modulus in use lower than that of the thermoplastic resin film and deforms upon pressing, as a caul on the surface of the film. Alternatively, a press jig coated with this rubber or resin is used to press the film surface opposite to the side where the metal foil is present, or a caul consisting of the rubber or resin is arranged between the film and a press jig to perform pressing.

In the step of forming folded portions on the single-sided printed circuit base plate, a notching member having a single-edged blade at its distal end is inserted in the circuit patterns and a desired portion of the film to bend notched portions of the circuit patterns and the film downward in the insertion direction of the notching member, and each notched portion is folded such that its film overlaps the lower surface of the film on the base plate.

The notching member having a single-edged blade at its distal end may have a shape of a circular column, an elliptical column, or of a prism such as a triangular prism, a quadrangular prism, or a hexagonal prism. When a circular-columnar notching member is used, a notched portion is formed into a substantially semicircular shape. When a quadrangular prism-like notching member is used, a notched portion is formed into a rectangular shape. The notch length formed by the notching member is preferably three or more times the thickness of the film so that a notched portion can be satisfactorily folded in the folding step.

In the folding step, the notched portion may be locally heated while being folded so that the film of the notched portion is fused to the lower surface of the film on the base plate.

When the resin film is monolayered, in the laminating step, the film is heated and pressed at a temperature at which the film is melted. When the thermoplastic resin described in item (2) or (3) above is used as the resin film, the film is heated and pressed at a temperature at which the low-softening temperature thermoplastic resin is melted, and is laminated. When the thermoplastic resin film having an adhesive layer on one surface described in item (4) above is used as the resin film, the film is heated and pressed at a temperature at which the adhesive layer is hardened, and is laminated.

According to the present invention as described above, a printed circuit original plate having protruding patterns with the same shape as circuit patterns to be formed is heated under pressure on a resin film (e.g., a thermoplastic resin film) with a metal foil interposed therebetween. In this step, since each protruding pattern of the original plate has a height at least the same as the thickness of the metal foil and is constituted by a flat or projecting curved surface to be brought into contact with the metal foil and side surfaces different from the flat or protruding curved surface, the metal foil is extended to be thin by stress concentration at a corner of each protruding pattern between its surface in contact with the metal foil and its side surfaces. Therefore, since the metal foil is cut or set in an easy-to-cut state, an unnecessary metal foil can be easily removed to transfer the circuit patterns. As a result, a single-sided printed circuit base plate having circuit patterns formed to have high adhesion strength with respect to the thermoplastic resin can be manufactured. In addition, when the protruding patterns of the original plate are manufactured by etching using fine resist patterns formed by a photolithography method as a mask, the width and the interval of transferred circuit patterns can be decreased, and an angle of a corner of the pattern between its surface in contact with the metal foil and its each side surface can be defined to be 90° or less by side etching or the like. As a result, cutting of the metal foil is facilitated.

Subsequently, the circuit patterns of the single-sided printed circuit base plate and desired portions of the film are folded toward the lower surface of the film to form a large number of folded portions having conductive portions formed integrally with the circuit patterns. By superposing and heating under pressure a plurality of, e.g., two single-sided printed circuit base plates having the folded portions, a flexible double-sided printed circuit board in which the circuit patterns of the upper and lower single-sided printed circuit base plates are connected with each other through the conductive portions of the folded portions can be manufactured. In addition, by superposing and heating under pressure three or more single-sided printed circuit base plates, a flexible multilayered printed circuit board in which the circuit patterns of the respective single-sided printed circuit base plates are connected with each other through the conductive portions of the folded portions can be manufactured.

According to the present invention, therefore, printed circuit boards such as a flexible double-sided printed circuit board and a flexible multilayered printed circuit board can be manufactured by a dry process free from the problem of producing waste liquors such as an etching solution, a plating solution, and a washing solution.

According to the present invention, a thermoplastic resin film having a softening temperature difference between its upper and lower surfaces is used as the resin film, and circuit patterns are formed on, e.g., a high-softening temperature thermoplastic resin layer by the transfer step to manufacture a single-sided printed circuit base plate. Folded portions having conductive portions formed integrally with the circuit patterns are formed in the single-sided printed circuit base plate. After a plurality of single-sided printed circuit base plates are superposed, they are heated and pressed at a temperature at which a low-softening temperature thermoplastic resin is melted, and are laminated. In this laminating step, since the circuit patterns of the single-sided printed circuit base plate are buried and fixed in the high-softening temperature thermoplastic resin layer which is not softened in the above heating step, only the low-softening temperature thermoplastic resin layers are melted and flowed to bond the layers without flowing, cutting, or deforming the circuit patterns. As a result, a flexible double-sided printed circuit board or a flexible multilayered printed circuit board in which the circuit patterns of each single-sided printed circuit base plate are precisely arranged at predetermined positions and the respective circuit patterns of the base plates are connected with each other through the conductive portions of the folded portions can be manufactured.

In addition, a thermoplastic resin film having a softening temperature difference between its upper and lower surfaces is used as the resin film, and circuit patterns are formed on, e.g., a low-softening temperature thermoplastic resin layer, and preferably, a low-softening temperature thermoplastic resin layer having a thickness smaller than that of the circuit patterns in the transfer step. As a result, the circuit patterns are bonded or almost bonded to a high-softening temperature thermoplastic resin layer while pushing the low-softening temperature thermoplastic resin layer aside to manufacture a single-sided printed circuit base plate. Thereafter, folded portions having conductive portions formed integrally with the circuit patterns are formed in the single-sided printed circuit base plate. After a plurality of single-sided printed circuit base plates are superposed, they are heated and pressed at a temperature at which the low-softening temperature thermoplastic resin is melted, and are laminated. In this laminating step, since the circuit patterns of each single-sided printed circuit base plate are buried and fixed in the high-softening temperature thermoplastic resin layer which is not softened in the above heating step, only the low-softening temperature thermoplastic resin layers are melted and flowed to bond the layers without flowing, cutting, or deforming the circuit patterns. As a result, a flexible double-sided printed circuit board or a flexible multilayered printed circuit board in which the circuit patterns of each single-sided printed circuit base plate are precisely arranged at predetermined positions and the respective circuit patterns of the base plates are connected with each other through the conductive portions of the folded portions can be manufactured.

Furthermore, a thermoplastic resin film having a three-layered structure in which low-softening temperature thermoplastic resin layers having a thickness smaller than the metal foil are laminated on both surfaces of a high-softening temperature thermoplastic resin layer is used as the resin film, and circuit patterns are formed on the low-softening temperature thermoplastic resin layer in the transfer step. As a result, the circuit patterns are bonded or almost bonded to a high-softening temperature thermoplastic resin layer while pushing the low-softening temperature thermoplastic resin layer aside to manufacture a single-sided printed circuit base plate. Thereafter, folded portions having conductive portions formed integrally with the circuit patterns are formed in the single-sided printed circuit base plate. After a plurality of single-sided printed circuit base plates are superposed, they are heated and pressed at a temperature at which the low-softening temperature thermoplastic resin is melted, and are laminated. In this laminating step, since the circuit patterns of the single-sided printed circuit base plate are buried and fixed in the high-softening temperature thermoplastic resin layer which is not softened in the above heating step, only the low-softening temperature thermoplastic resin layers are melted and flowed to bond the layers without flowing, cutting, or deforming the circuit patterns. As a result, a flexible double-sided printed circuit board or a flexible multilayered printed circuit board in which the circuit patterns of each single-sided printed circuit base plate are precisely arranged at predetermined positions and the respective circuit patterns of the base plates are connected with each other through the conductive portions of the folded portions can be manufactured. In addition, since the low-softening temperature thermoplastic resin layer on the side of each single-sided printed circuit base plate opposite to the circuit pattern formation surface can be used to bond the layers, the adhesion strength between the layers can be improved as compared with the structure using the thermoplastic resin film having a softening temperature difference between its upper and lower surfaces. As a result, single-sided printed circuit base plates each having wider circuit patterns can be easily laminated.

Moreover, a thermoplastic resin film having a surface coated with an adhesive layer is used as the resin film, and circuit patterns are formed on the adhesive layer side in the transfer step to manufacture a single-sided printed circuit base plate. Thereafter, folded portions having conductive portions formed integrally with the circuit patterns are formed in the single-sided printed circuit base plate. After a plurality of single-sided printed circuit base plates are superposed, they are heated and pressed at a temperature at which adhesive layers are hardened, and are laminated. As a result, a flexible double-sided printed circuit board or a flexible multilayered printed circuit board in which the circuit patterns of each single-sided printed circuit base plate are precisely arranged at predetermined positions and the respective circuit patterns of the base plates are connected with each other through the conductive portions of the folded portions can be manufactured.

Moreover, according to the present invention, there is provided a method for manufacturing a printed circuit board, comprising the steps of:

manufacturing a printed circuit original plate having protruding patterns which have the same shape as circuit patterns to be formed and a height at least the same as the thickness of a metal foil used and each of which is constituted by a flat or projecting curved surface to be brought into contact with the metal foil and side surfaces different from the flat or projecting curved surface;

pressing the protruding patterns of the original plate against a film consisting of a resin or rubber with a metal foil interposed therebetween to transfer portions of the metal foil in contact with the protruding patterns onto the surface of the film to form the circuit patterns, thereby manufacturing a transfer film; and retransferring the circuit patterns of the transfer film onto an insulating base.

The printed circuit original plate is used in the form of a flat plate or a ring fitted on a roll.

The printed circuit original plate is manufactured by, e.g., the methods (a) to (d) described above.

In order to smoothly and easily perform transfer of the metal foil onto the surface of the thermoplastic resin using the original plate and peeling of an unnecessary metal foil, it is preferred to form a large number of depressurizing/pressurizing holes in a region of the surface of the original plate except for the protruding patterns and to form a communication hole communicating with each of the large number of holes formed in the original plate and having an end connected to a depressurizing/pressurizing pipe. Alternatively, an original plate having a communication hole which communicates with a depressurizing/pressurizing channel formed in a receiving steel plate and has an end connected to a depressurizing/pressurizing pipe is preferably superposed on the receiving steel plate.

The height of the protruding patterns formed on the original plate must be at least the same as the thickness of the metal foil for the same reason as described above.

The surface of each protruding pattern formed on the original plate, which is brought into contact with the metal foil, must be a flat or projecting curved surface for the same reason as described above.

In addition to protruding patterns for forming circuit patterns, the original plate is allowed to have protruding patterns having the same shape as patterns of characters or marks to be formed and a height at least the same as the thickness of the metal foil and each constituted by a flat or curved surface to be brought into contact with the metal foil and side surfaces different from the flat or curved surface. These protruding patterns are formed on a portion of the base material corresponding to a noncircuit pattern region of a printed circuit board to be manufactured.

Examples of the resin film are films consisting of a thermoplastic resin such as a polyfluoroethylene-perfluoroalkylvinylether copolymer and a resin containing a silicone compound. A silicone rubber film, e.g., may be used as the rubber film.

As the method for performing retransfer onto the insulating base using the transfer film, a method for superposing the transfer film on a prepreg or a resin film coated with an adhesive and heating under pressure the resultant structure to retransfer the circuit patterns onto the laminate consisting of the prepreg or the like can be adopted. Alternatively, a method for inserting the transfer film into an injection mold and retransferring the circuit patterns onto a molded body can be adopted. After this retransfer step, the transfer film is peeled and removed from the laminate and the molded product.

An example of the prepreg serving as the insulating base is a material formed by impregnating a thermosetting resin solution such as an epoxy resin into a glass cloth, and examples of the adhesive coated on the resin film are thermosetting resin-based adhesives such as an epoxy resin adhesive and a phenolic resin adhesive.

According to the present invention, a printed circuit original plate having protruding patterns having the same shape as that of circuit patterns to be formed is pressed against a film consisting of a resin or rubber with a metal foil interposed therebetween. In this step, since the original plate has protruding patterns each having a height at least the same as the thickness of the metal foil and constituted by a flat or projecting curved surface to be brought into contact with the metal foil and side surfaces different from the flat or projecting curved surface, the metal foil is extended to be thin by stress concentration at a corner of each protruding pattern between its surface in contact with the metal foil and its side surfaces and is cut or set in an easy-to-cut state. Therefore, an unnecessary metal foil is easily removed to transfer the circuit patterns. As a result, a transfer film on which the circuit patterns are formed with high adhesion strength with respect to the film can be manufactured. In addition, when the protruding patterns of the original plate are manufactured by etching using fine resist patterns formed by photolithography as a mask, the width and the interval of transferred circuit patterns can be decreased. In addition, since an angle of a corner of each protruding pattern between its surface in contact with the metal foil and its each side surface can be set to be 90° or less by side etching or the like, cutting of the metal foil is facilitated.

The transfer film obtained by the above method is superposed on a prepreg formed by impregnating an epoxy resin into a glass cloth and is heated and pressed at a setting temperature of the epoxy resin, thereby burying and bonding the circuit patterns into the prepreg to manufacture a laminate. In this step, since the transfer film has a structure in which the circuit patterns are bonded to a resin or rubber film, cutting or deformation of the circuit patterns can be avoided by flowing of the epoxy resin of the prepreg. When the epoxy resin is set, the adhesion strength of the circuit patterns with respect to the set epoxy resin is higher than that with respect to the film, and the circuit patterns are buried in the surface of the laminate. Therefore, after the manufacture of the laminate, the resin or rubber film can be easily peeled to form a printed circuit board on which the circuit patterns are retransferred. Since the circuit patterns are buried in the surface of the laminate in this printed circuit board, peeling or cutting of the circuit patterns upon mounting of parts can be avoided.

Alternatively, a printed circuit board consisting of a molded product on which circuit patterns are transferred can be manufactured by arranging a transfer film in a cavity of an injection mold, injection-molding the film, and then peeling and removing the film.

According to the present invention, therefore, by retransferring circuit patterns onto an insulating material such as a prepreg by using a transfer film, a printed circuit board in which the circuit patterns having a fine line width can be buried at the same level as the flat or curved surface can be manufactured without producing waste liquors in which a large amount of copper is dissolved.

Note that the present invention allows a method for manufacturing a rigid printed circuit board, comprising the steps of:

preparing a resin base with a metal foil, and heating under pressure protruding patterns of a metal mold, which have the same shape as circuit patterns to be formed and a height at least the same as the thickness of the metal foil, against the metal foil of the resin base with the metal foil, thereby forming recess patterns on the metal foil of the base; and mechanically removing portions of the metal foil as protruding portions of the base to leave the recess patterns of the metal foil buried in the base, thereby forming circuit patterns.

In addition, the present invention allows a method for manufacturing a rigid printed circuit board, comprising the steps of:

mounting a cavity core having protruding patterns which have the same shape as circuit patterns to be formed and a height at least the same as the thickness of a metal foil used in a movable mold such that the protruding patterns of the core face outside, and arranging the movable mold in a stationary mold having a cavity with a metal foil interposed therebetween and clamping the molds;

injecting a synthetic resin into the cavity of the stationary mold to mold a base bonded to the metal foil, and transferring the protruding patterns of the core onto the metal foil, thereby manufacturing a resin base with a metal foil having recess patterns; and mechanically removing portions of the metal foil as protruding portions of the base to leave the recess patterns of the metal foil buried in the base, thereby forming circuit patterns.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A to 1F are sectional views showing manufacturing steps of a flexible printed circuit board according to Example 1 of the present invention;

FIGS. 2A and 2B are sectional views showing manufacturing steps of a flexible printed circuit board according to Example 2 of the present invention;

FIG. 7 is a schematic view showing another example of the continuous printed circuit film manufacturing apparatus;

FIGS. 8A to 8F are sectional views showing manufacturing steps of a printed circuit original plate according to Example 5 of the present invention;

FIGS. 10A to 10F are sectional views showing manufacturing steps of a flexible double-sided printed circuit board according to Example 8 of the present invention;

FIGS. 15A to 15F are sectional views showing manufacturing steps of a single-sided printed circuit base plate according to Example 15 of the present invention;

FIGS. 18A to 18F are sectional views showing manufacturing steps of a single-sided printed circuit base plate according to Example 21 of the present invention;

FIGS. 19A to 19H are sectional views showing manufacturing steps of a single-sided printed circuit board according to Example 22 of the present invention;

FIGS. 21A to 21H are sectional views showing manufacturing steps of a flexible single-sided printed circuit board according to Example 24 of the present invention;

FIG. 24 is a plan view of FIG. 23H;

FIG. 25 is a schematic view showing a continuous printed circuit film manufacturing apparatus used in Example 29 of the present invention;

DETAILED DESCRIPTION OF THE PREFERRED EMBODIMENTS

Figure 1D:
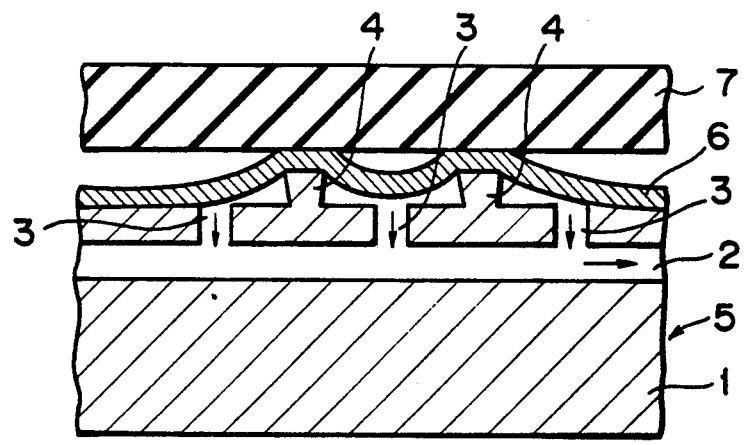

The present invention will be described in detail below by way of its examples.

EXAMPLE 1

As shown in FIG. 1A, the surface of a steel material was polished and nickel-plated, and then polished again to manufacture a base material 1. A passage 2 having an open end in a side surface of the base material 1 was formed in the base material 1 so as to be parallel to the surface of the base material 1. A plurality of holes 3 each communicating with the passage 2 and having a diameter of 0.2 mm were formed with intervals of 2 cm therebetween in a non-protruding region on the surface of the base material 1. Subsequently, a photosensitive film was bonded on the surface having the holes 3, and exposure and development were performed to form film patterns. These film patterns were used as a mask to etch the surface of the base material 1 to a depth of 50 $\mu$m, thereby forming protruding patterns 4 having the same shape as circuit patterns. In this etching step, an angle defined by a side surface of each protruding pattern 4 and a surface thereof to be brought into contact with a metal foil was set to be 85° by performing overetching. In addition, fins formed around the holes 3 of the base material 1 were removed in the etching step. Thereafter, the film patterns were peeled and the resultant structure was washed to manufacture a printed circuit original plate 5.

Subsequently, as shown in FIG. 1B, an 18 μm thick copper foil 6 was placed on the protruding patterns 4 of the original plate 5. A pipe (not shown) was connected to one end of the passage 2 of the original plate 5, and a vacuum pump connected to the other end of the pipe was activated to draw the copper foil 6 by suction through the plurality of holes 3 via the pipe and the passage 2, thereby deflecting the copper foil 6 while the copper foil 6 was in contact with the upper surfaces of the protruding patterns 4, as shown in FIG. 1C.

Figure 1E:
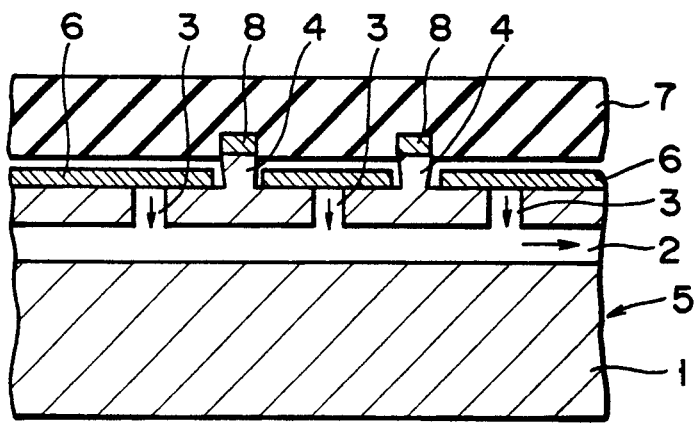

As shown in FIG. 1D, while the copper foil 6 was continuously drawn by suction, a film 7 consisting of a thermoplastic resin having a thickness shown in Table 1 below was placed on the copper foil 6. Subsequently, a caul film (not shown) consisting of polyethylene fluoride was arranged on the upper surface of the film 7, and the copper foil 6 and the film 7 were heated under pressure for three to ten seconds using the original plate 5 and a press jig (not shown) arranged above the caul film, thereby performing transfer processing. Note that in this transfer processing, the temperature of the original plate 5 and the pressure between the original plate 5 and the press jig were set as shown in Table 1. When the film 7 arranged on the copper foil 6 consisted of polytetrafluoroethyleneperfluoroalkylvinylether, the polyethylene fluoride film described above was not interposed between the film 7 and the press jig. In this heating under pressure, as shown in FIG. 1E, portions of the copper foil 6 corresponding to the protruding patterns 4 of the original plate 5 were cut by corners of the protruding patterns 4, and the cut portions of the copper foil 6 were transferred and buried into the softened film 7, thereby forming circuit patterns 8. The remaining portions of the copper foil 6 were moved to the surface of the original plate 5 by vacuum suction through the holes 3 of the original plate.

Figure 1F:
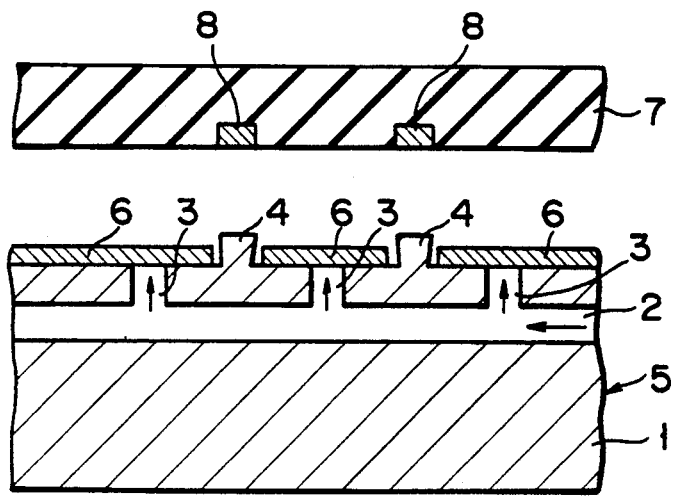

Subsequently, as shown FIG. 1F, after the film 7 was removed from the original plate 5, a compressor was connected in place of the vacuum pump to the end of the pipe (not shown) connected to one end of the passage 2 of the original plate 5 and was activated to inject pressurized air through the plurality of holes 3 via the pipe and the passage 2, thereby peeling and removing the copper foil 6 remaining on the original plate 5. Thereafter, the film in which the copper foil circuit patterns were buried was subjected to fixing for three to ten seconds under the conditions as shown in Table 1 to manufacture 13 types of flexible printed circuit boards.

The peeling strength of the circuit patterns of each flexible printed circuit board of Example 1 was measured. The measurement result was summarized in Table 1.

TABLE 1

| | Film | | Transfer processing | | Fixing processing | | Peeling |
|---|---|---|---|---|---|---|---|
| No | Type | Thickness (mm) | Temperature (°C.) | Pressure (Kg/cm$^2$) | Temperature (°C.) | Pressure (Kg/cm$^2$) | Strength (kg/cm) |
| 1 | Polytetrafluoro-ethyleneperfluoro-alkylvinylether | 100 | 260 | 60 | 230 | 100 | 1.5 |
| 2 | Polyethylene-terephthalate | 100 | 230 | 90 | 230 | 100 | 1.9 |
| 3 | Polyphenylenesulfide | 100 | 250 | 90 | Not heated | Not pressed | 2.4 |
| 4 | Modified phenylenoxide | 1000 | 150 | 50 | 120 | 100 | 1.6 |
| 5 | polysulfone | 50 | 200 | 80 | Not heated | Not pressed | 1.7 |
| 6 | Polyethersulfone | 100 | 230 | 50 | Not heated | Not pressed | 1.9 |
| 7 | Polyetheretherketone | 100 | 300 | 90 | Not heated | Not pressed | 1.6 |
| 8 | Liquid crystal polymer | 125 | 190 | 70 | Not heated | Not pressed | 1.7 |
| 9 | Polyarylate | 75 | 240 | 70 | Not heated | Not pressed | 1.9 |
| 10 | Acrylic resin | 1000 | 110 | 50 | Not heated | Not pressed | 1.7 |
| 11 | Polycarbonate | 1000 | 130 | 50 | 120 | 100 | 1.6 |
| 12 | Polyetherimide | 100 | 320 | 80 | 280 | 100 | 1.6 |
| 13 | Polyparabanic acid | 100 | 300 | 90 | Not heated | Not pressed | 1.8 |

As is apparent from Table 1, the circuit patterns of each of the flexible printed circuit boards manufactured by Example 1 have a very high peeling strength.

EXAMPLE 2

The sectional shape of the flexible printed circuit board having a polyphenylenesulfide film manufactured under condition No. 3 shown in Table 1 according to Example 1 was checked. As a result, the circuit patterns 8 buried in the film 7 were deformed and curved upward as shown in FIG. 2A.

Therefore, a roll (not shown) with sandpaper of #240 was rotated and urged against the circuit patterns 8 at a contact pressure of 200 g/cm$^2$ for three seconds. As a result, deformation of the circuit patterns 8 could be removed, as shown in FIG. 2B.

EXAMPLE 3

A roll (not shown) having wavy projections and a surface roughened by sandpaper of #240 was rotated and urged against the circuit patterns 8 shown in FIG. 2A at a contact pressure of 200 g/cm$^2$ for three seconds. As a result, a flexible printed circuit board from which deformation of the circuit patterns was removed and which had high film flatness could be obtained.

EXAMPLE 4

Figure 3:
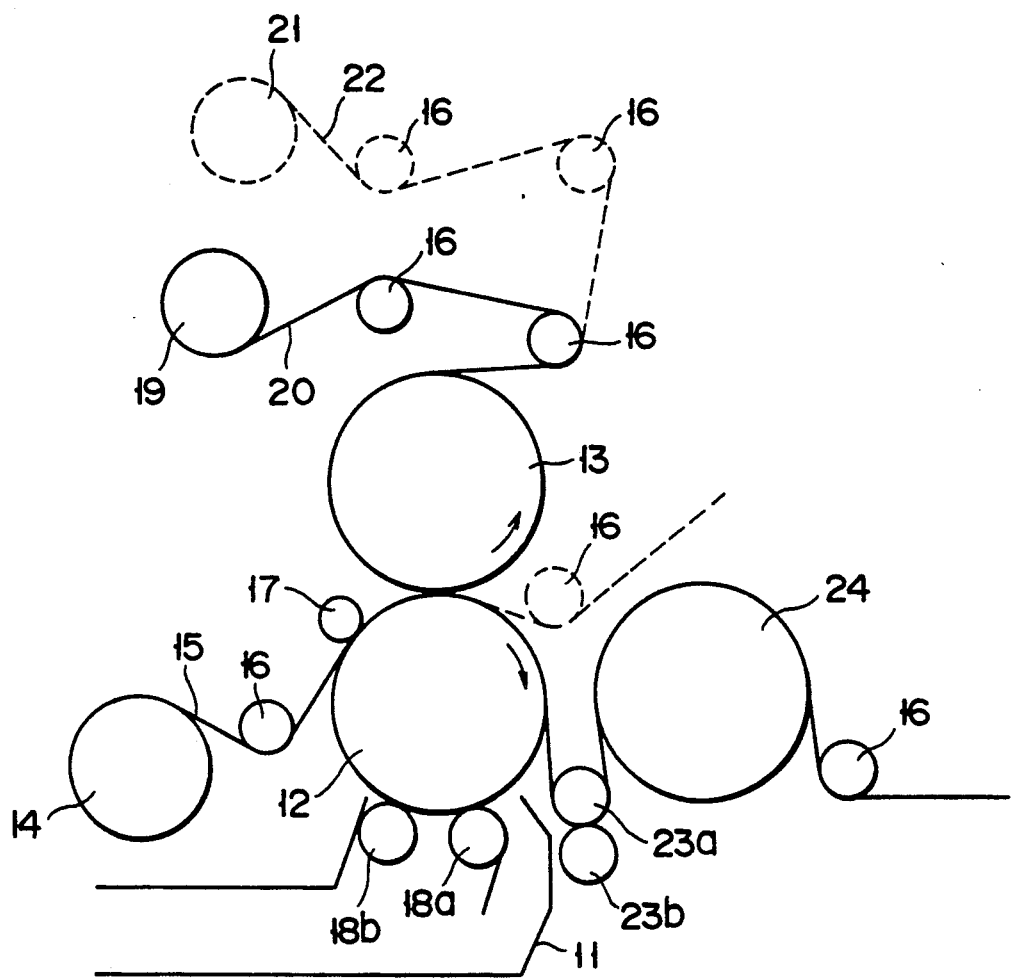
FIG. 3 is a schematic view showing a continuous printed circuit film manufacturing apparatus used in Example 4 of the present invention.
Figure 4:
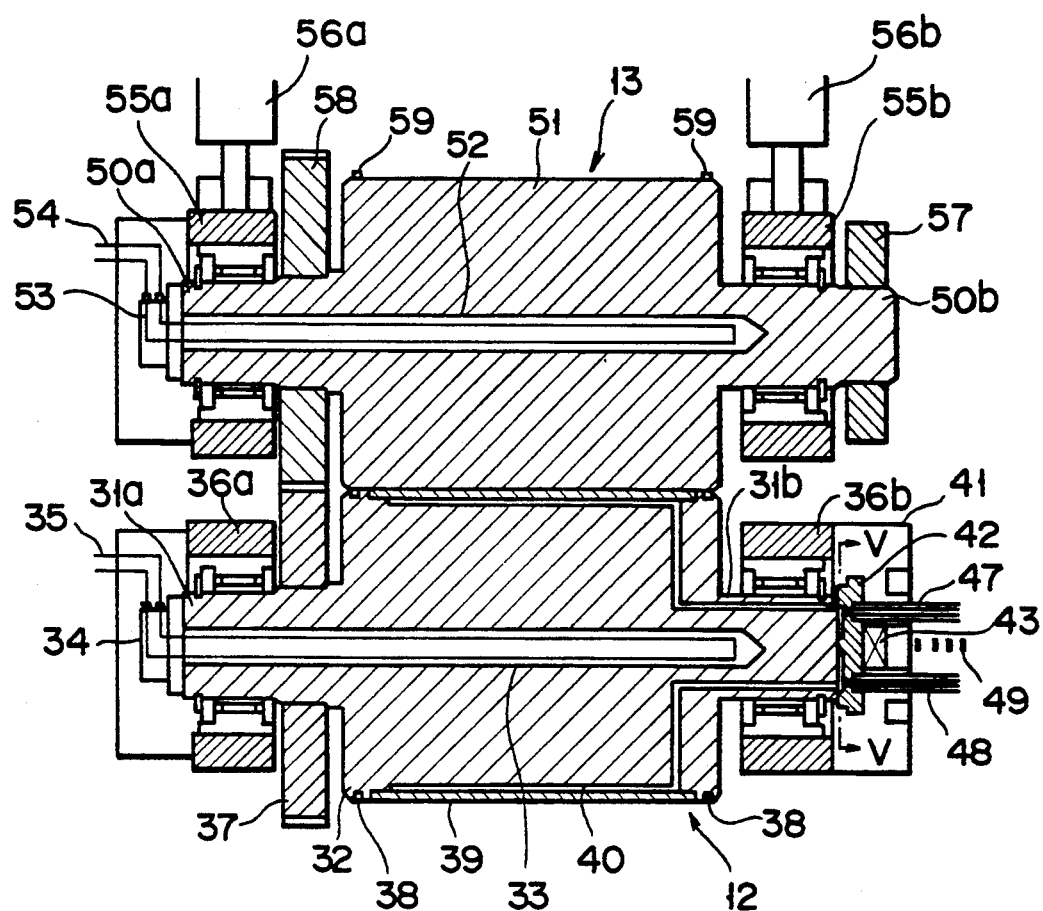
FIG. 4 is a sectional view showing an original plate mount roll, a preheat roll, and a rotating mechanism associated with the rolls.
Figure 5:
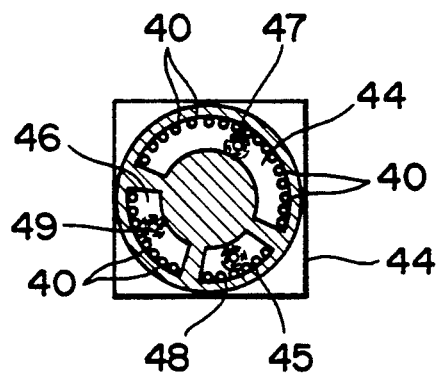
FIG. 5 is a sectional view taken along a line V—V in FIG. 4.
Figure 6:
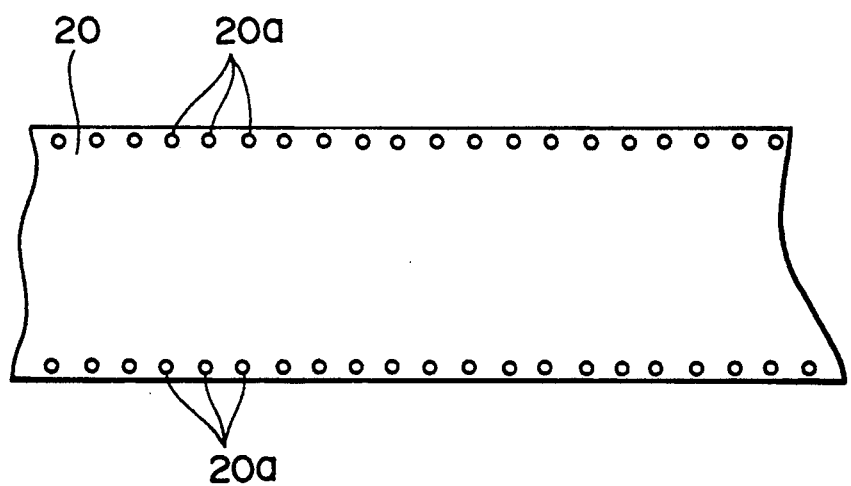
FIG. 6 is a plan view showing a film used in Example 4.

FIG. 3 is a schematic view showing a continuous printed circuit film manufacturing apparatus used in Example 4, FIG. 4 is a sectional view showing an original plate mount roll, a preheat roll, and a rotating mechanism associated with these rolls, and FIG. 5 is a sectional view taken along a line V—V in FIG. 4. Referring to FIG. 3, reference numeral 11 denotes a dust collector for collecting copper foil scraps. A columnar original plate mount roll 12 is arranged above the dust collector 11, and a preheat-press roll 13 is arranged close to the original plate mount roll 12. An 18 μm thick copper foil 15 is supplied from a copper foil supply hoop 14 to the original plate mount roll 12 via a feed roll 16. A contact assistant roll 17 is arranged at a portion where the copper foil 15 is supplied to the original plate mount roll 12. A peeling brush 18a for scraping copper foil scraps and a mold grinding roll 18b are arranged on the lower circumferential surface of the original plate mount roll 12. A film 20 consisting of a material and having a thickness shown in Table 2 below is supplied from a film supply hoop 19 to the preheat-press roll 13 via two feed rolls 16. As shown in FIG. 6, sprocket holes 20a are formed in both side edge portions along the longitudinal direction of the film 20. A caul film 22 consisting of 100 μm thick polyethylene tetrafluoride is supplied from a caul film supply hoop 21 so as to be interposed between the preheat-press roll 13 and the film 20 via three feed rolls 16. The caul film 22 is conveyed between the original plate mount roll 12 and the preheat-press roll 13 and taken up by a take-up roll (not shown) via the feed roll 16. Note that the film 22 is supplied in accordance with the properties of the film 20. On the film feed side from the original plate mount roll 12, a reverse roll 23a, an unnecessary metal foil removing brush 23b, a fixing roll 24, the feed roll 16, and a take-up roll (not shown) of a printed circuit film are sequentially arranged in this order.

FIGS. 4 and 5 show a structure of the original plate mount roll 12, the preheat-press roll 13, and a rotating mechanism associated with these rolls. The original plate mount roll 12 includes a roll main body 32 having shafts 31a and 31b on its two ends. An elongated hollow portion 33 is formed in the central portion of the roll main body 32 from the left end face of the main body, and a heater 35 powered via a terminal 34 is inserted in the hollow portion 33. Bearings 36a and 36b are provided for the shafts 31a and 31b. A gear 37 is axially fitted on a portion of the shaft 31a inside the bearing 36a positioned at the left end. A plurality of sprocket receiving holes 38 are formed in the outer circumferential surface of the main body 32 near its two ends. A ring-like original plate 39 having protruding patterns manufactured in accordance with the method of Example 1 and a plurality of depressurizing/pressurizing holes is provided on the outer circumferential surface of the main body 32. A plurality of depressurizing/pressurizing passages 40 are cylindrically formed from the circumferential surface of the main body 32 where the ring-like original plate 39 is present to the end face of the shaft 31b on the right side. The plurality of depressurizing/pressurizing passages 40 positioned on the original plate 39 side communicate with the plurality of holes formed in the original plate 39. A cover 41 is mounted on the end face of the bearing 36b positioned on the right side so as to cover the end portion of the shaft 31b. A core 42 is brought into contact with the end face of the shaft 31b by the biasing force of a spring 43. A depressurizing chamber 44, a pressurizing chamber 45, and a normal pressure chamber 46 partitioned from each other by the core 42 and the end face of the shaft 31b as shown in FIG. 5 are formed, and the plurality of passages 40 open in the end face of the shaft 31b communicate with the three chambers 44 to 46. A depressurizing pipe 47, a pressurizing pipe 48, and a normal pressure pipe 49 inserted through the cover 41 communicate with the chambers 44, 45, and 46, respectively. Since the core 42 having the above arrangement, the depressurizing pipe 47, the pressurizing pipe 48, and the normal pressure pipe 49 are connected, when the roll main body 32 is rotated, a plurality of passages 40 of the roll main body 32 communicating with the depressurizing chamber 44 and arranged on the preheat-press roll 13 side are maintained in a depressurized state, a plurality of passages 40 communicating with the pressurizing chamber 45 and located in the lower portion of the roll main body 32 are maintained in a pressurized state, and a plurality of passages 40 of the roll main body 32 communicating with the normal pressure chamber 46 are maintained in a normal pressure state, regardless of rotation of the roll main body 32. Note that the peeling brush 18a is brought into contact with a portion of the ring-like original plate 39 of the roll main body 32 in which the passages 40 to be maintained in the pressurized state are formed.

The preheat-press roll 13 includes a roll main body 51 having shafts 50a and 50b at its two ends. An elongated hollow portion 52 is formed in the central portion of the roll main body 51 from the left end face of the main body 51, and a heater 54 powered via a terminal 53 is inserted in the hollow portion 52. Bearings 55a and 55b are fitted on the shafts 50a and 50b of the main body 51, and press shafts 56a and 56b are mounted on the bearings 55a and 55b. A pulley 57 is axially fitted on a portion of the shaft 50b outside the bearing 55b located at the right end, and an endless belt of a motor shaft (not shown) is looped on the pulley 57. A gear 58 to be meshed with the gear 37 of the original plate mount roll 12 is axially fitted on a portion of the shaft 50a inside the bearing 55a located at the left end. A plurality of sprockets 59 to be at engaged with the sprocket holes 20a of the supplied film 20 are formed on the outer circumferential surface near the two ends of the main body 51.

A method of manufacturing a printed circuit film using the above manufacturing apparatus shown in FIGS. 3 to 5 will be described below.

First, the heater 35 incorporated in the original plate mount roll 12 and the heater 54 incorporated in the preheat-press roll 13 were powered to heat the rolls 12 and 13 under the temperature conditions shown in Table 2 below. Subsequently, the 18-μm thick copper foil 15 was supplied from the copper foil supply hoop 14 to a portion between the rolls 12 and 13, and at the same time the film 20 and the caul film 22 consisting of 100-μm thick polyethylene tetrafluoride were supplied from the film supply hoop 19 and the caul film supply hoop 21, respectively, to the portion between the rolls 12 and 13 such that the caul film 22 was positioned on the side of the preheat-press roll 13. In this case, the sprocket holes 20a of the film 20 were engaged with the sprockets 59 of the preheat-press roll 13. At the same time, the depressurizing chamber 44, the pressurizing chamber 45, and the normal pressure chamber 46 were set in a depressurized state at 50 to 150 torr, a pressurized state at 3 to 5 kg/cm$^2$, and a normal pressure state through the depressurizing pipe 47, the pressurizing pipe 48, and the normal pressure pipe 49, respectively, which communicated with these chambers. As a result, a plurality of passages 40 of the original plate mount roll 12 arranged on the preheat-press roll 13 side and communicating with the depressurizing chamber 44 are set in the depressurized state, and vacuum suction is performed through the holes of the original plate 39 communicating with these passages 40. Meanwhile, a plurality of passages 40 located in the lower portion of the roll 12 and communicating with the pressurizing chamber 45 are set in the pressurized state, and a pressure gas is injected from the holes of the original plate 39 communicating with the passages 40. A plurality of passages 40 of the roll 12 communicating with the normal pressure chamber 46 were set in the normal pressure state. Since the copper foil 15 supplied on the original plate mount roll 12 was drawn by suction through the plurality of holes of the original plate 39 on the outer circumferential surface of the roll 12 by the above operation, the copper foil 15 was deflected while being in contact with the upper surfaces of the protruding patterns formed on the original plate 39. Subsequently, the preheat-press roll 13 was pressed by the press shafts 56a and 56b, and the pulley 57 of the roll 13 was rotated counterclockwise, thereby transmitting the rotational force to the gear 37 of the original plate mount roll 12 meshed with the gear 58 to rotate the roll 12 clockwise. By the press operation of the press shafts 56a and 56b for the preheat-press roll 13 and the rotation of the rolls 12 and 13, circuit patterns were formed on the film 20 as described in Example 1.

That is, portions of the copper foil 15 corresponding to the protruding patterns of the original plate 39 of the roll 12 were cut by corners of the protruding patterns, and the cut portions of the copper foil 15 were transferred and buried into the softened surface of the film 20 supplied between the rolls 12 and 13 together with the copper foil 15, thereby forming circuit patterns. Portions of the copper foil 15 remaining as non-buried portions were moved to the surface of the original plate 39 by vacuum suction through the plurality of holes of the ring-like original plate 39. These portions of the copper foil 15 were peeled from the surface of the original plate 39 when the passages 40 communicating with the plurality of holes of the original plate 39 were moved to communicate with the pressurizing chamber 45 upon rotation of the roll 12 and a pressure gas was injected through the holes of the original plate 39, scraped by the peeling brush 18 located below the roll 12, and collected into the dust collector 11.

The film 20 having the transferred circuit patterns was supplied to the fixing roll 24 set under the temperature condition shown in Table 2, and the circuit pattern transferred surface of the film 20 was brought into contact with the surface of the fixing roll 24 to perform fixing. Thereafter, the printed circuit film was taken up by the take-up roll (not shown) via the feed roll.

The peeling strength of the circuit patterns of each of the 13 types of printed circuit films manufactured by the steps of Example 4 was measured. The result is summarized in Table 2.

Although Example 4 describes the method for manufacturing a printed circuit film using the original plate mount roll in which an original plate was mounted on a columnar roll as shown in FIG. 3, the present invention is not limited to the above example. For example, as shown in FIG. 7, a continuous printed circuit film manufacturing apparatus having a structure in which a vertically movable press jig 62 is arranged above an original plate mount roll 61 having a hexagonal section and a dust collector 11 which is vertically moved by a cylinder 63 is arranged below the original plate mount roll 61 may be used. In this system, the original plate mount roll 61 is intermittently operated to manufacture a printed circuit film such that each side surface of the roll 61 opposes the press jig 62, and a copper foil remaining after transfer is peeled and removed by urging the dust collector 11 against the lower surface of the roll 61 by using the cylinder 63 and using a peeling brush 18a.

EXAMPLE 5

As shown in FIG. 8A, the surface of a steel plate 81 was polished, coated with a 50 μm thick tin-plating layer 82, and polished again to manufacture a base material 83. As shown in FIG. 8B, a 50 μm thick photosensitive dry film 84 was bonded on the tin-plating layer 82 of the base material 83.

Figure 8D:
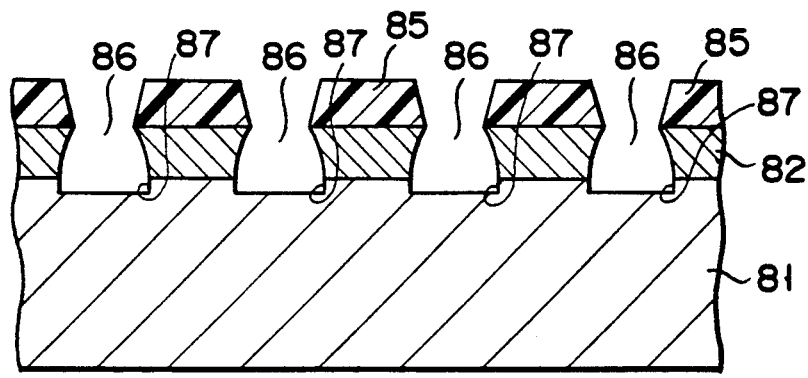

Subsequently, as shown in FIG. 8C, the photosensitive dry film 84 was exposed and developed to form 125 μm wide film patterns 85 with an interval of 75 μm therebetween as complementary patterns of circuit patterns to be formed. The film patterns 85 were used as a mask to selectively etch the tin-plating layer 82. In this etching step, over-etching was performed to form opening portions 86 wider than the circuit patterns to be formed on the tin-plating layer 82, as shown in FIG. 8D. Thereafter, the exposed surface of the steel plate 81 was etched to form recess portions 87.

Figure 8E:
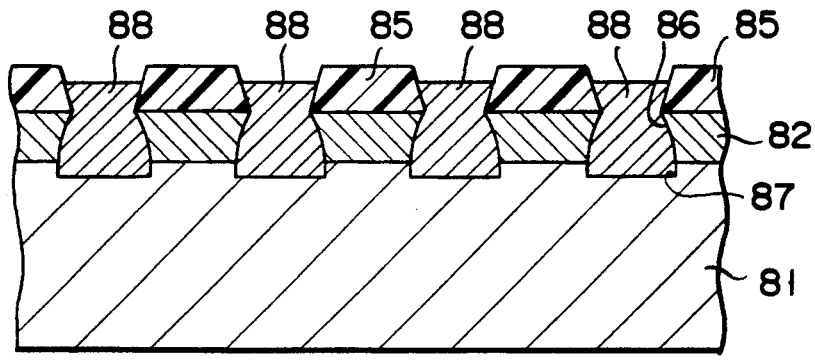

As shown in FIG. 8E, nickel plating was performed to bury a nickel plating layer 88 having a thickness of about 100 μm in gaps each constituted by the recess portion 87, the opening portion 86, and the interval between the film patterns 85. Subsequently, as shown in

TABLE 2

| | Film | | Original plate roll | Preheat-press roll | | Fixing roll | Peeling |
|---|---|---|---|---|---|---|---|
| No | Type | Thickness (mm) | temperature (°C.) | Temperature (°C.) | Pressure (kg/cm$^2$) | temperature (°C.) | strength (kg/cm) |
| 1 | Polytetrafluoro-ethyleneperfluoro-alkylvinylether | 100 | 260 | 230 | 60 | 240 | 1.5 |
| 2 | Polyethyleneterephthalate | 100 | 230 | 190 | 90 | 210 | 1.9 |
| 3 | Polyphenylenesulfide | 100 | 250 | 210 | 90 | 230 | 2.4 |
| 4 | Modified phenylenoxide | 1000 | 150 | 100 | 50 | Not heated | 1.6 |
| 5 | Polysulfone | 50 | 200 | 170 | 80 | 180 | 1.7 |
| 6 | Polyethersulfone | 100 | 230 | 200 | 50 | 210 | 1.9 |
| 7 | Polyetheretherketone | 100 | 300 | 250 | 90 | Not heated | 1.6 |
| 8 | Liquid crystal polymer | 125 | 190 | 150 | 70 | Not heated | 1.7 |
| 9 | Polyarylate | 75 | 240 | 190 | 70 | Not heated | 1.9 |
| 10 | Acrylic resin | 1000 | 110 | 70 | 50 | Not heated | 1.7 |
| 11 | Polycarbonate | 1000 | 140 | 100 | 50 | Not heated | 1.6 |
| 12 | Polyetherimide | 100 | 320 | 290 | 80 | 300 | 1.6 |
| 13 | Polyparabanic acid | 100 | 300 | 270 | 90 | 280 | 1.8 |

As is apparent from Table 2, the circuit patterns of each of the printed circuit films manufactured by Example 4 have a very high peeling strength. In addition, neither disconnection nor peeling of the circuit patterns were found in the manufacturing steps.

Figure 8F:
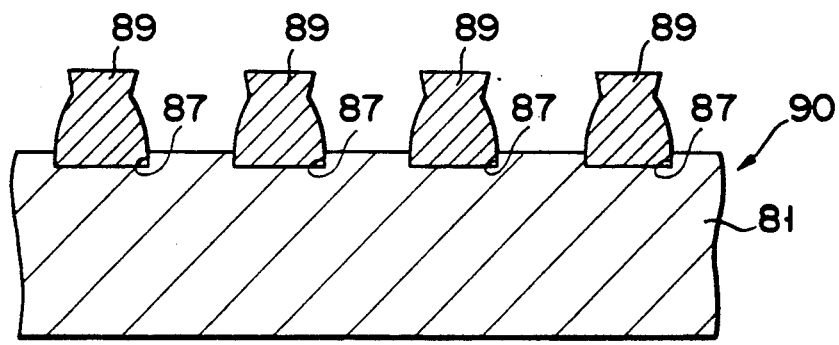

FIG. 8F, after the film patterns 85 were peeled and the tin-plating layer 82 was dissolved and removed, the resultant structure was washed to form nickel protruding patterns 89. Each of the protruding patterns 89 has an upper portion similar to the circuit patterns, and a lower portion buried in the recess portion 87 of the steel plate 81 and being wider than the upper portion. In this manner, a printed circuit original plate 90 was manufactured.

EXAMPLE 6

A printed circuit original plate was manufactured by forming protruding patterns following the same procedures as in Example 5 except that a solder alloy was used as a plating layer formed on the surface of a steel plate, and after formation of film patterns, etching of the solder alloy plating layer, nickel plating, and removal of the film patterns, the formed solder alloy layer was removed by heat-melting.

EXAMPLE 7

Figure 9A:
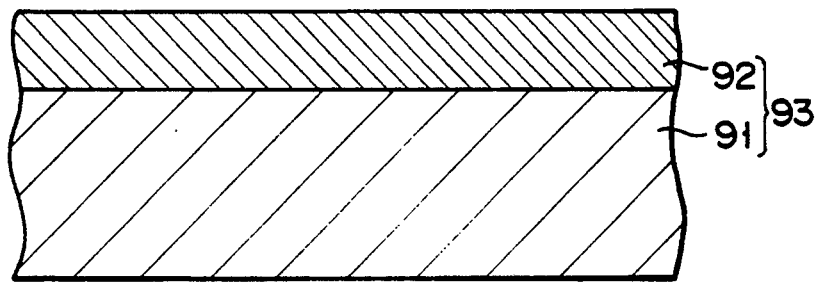
FIGS. 9A to 9E are sectional views showing manufacturing steps of a printed circuit original plate according to Example 7 of the present invention.
Figure 9B:
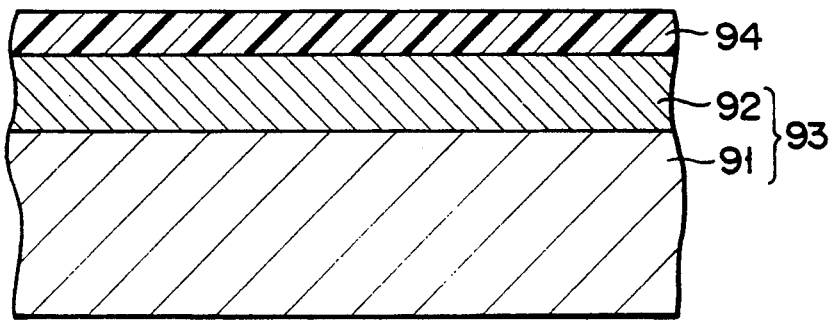
Figure 9C:
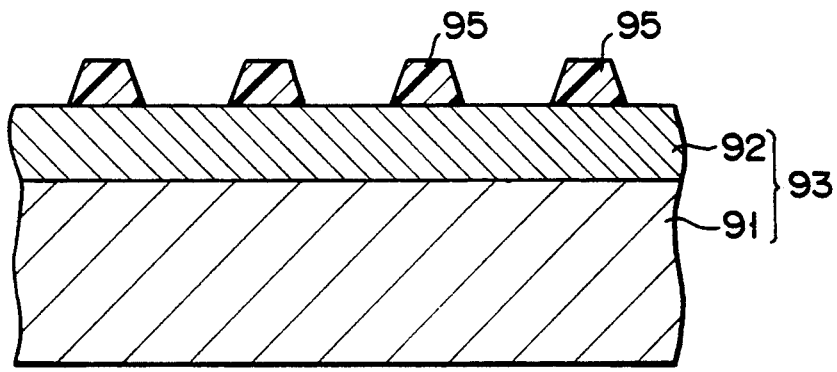

First, as shown in FIG. 9A, the surface of a steel plate 91 was polished, coated with a 100 μm thick nickel plating layer 92, and polished again to manufacture a base material 93. As shown in FIG. 9B, a 50 μm thick photosensitive dry film 94 was bonded on the nickel plating layer 92 of the base material 93. Subsequently, as shown in FIG. 9C, the photosensitive dry film 94 was exposed and developed to form 75 μm wide film patterns 95 similar to circuit patterns to be formed with an interval of 125 μm therebetween.

Figure 9D:
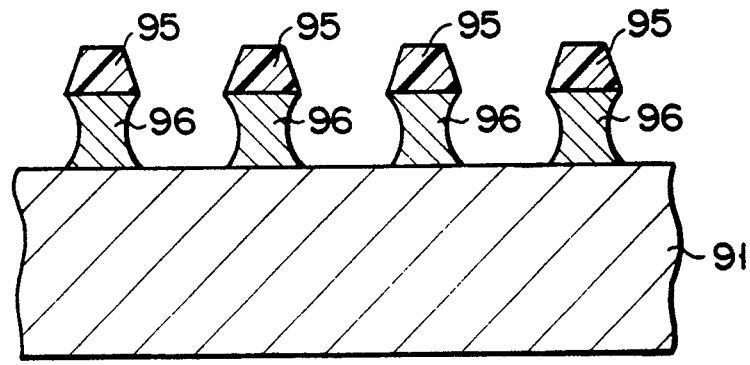
Figure 9E:
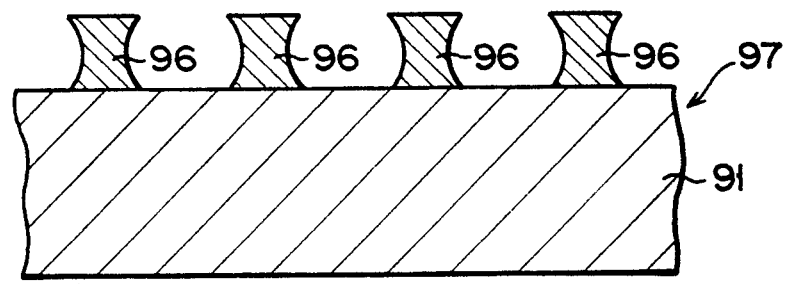

As shown in FIG. 9D, the film patterns 95 were used as a mask to selectively etch the nickel plating layer 92 to form protruding patterns 96 consisting of nickel. Subsequently, as shown in FIG. 9E, after the film patterns 95 were peeled, the resultant structure was washed to manufacture a printed circuit original plate 97.

The printed circuit original plate (protruding pattern width=75 μm) obtained in each of Examples 5 to was used to repeatedly perform an operation of heating under pressure a 12 μm thick copper foil onto a 100 μm thick polyphenylenesulfide resin film to transfer circuit patterns a plurality of times, and the circuit pattern width obtained after the transfer operation was repeated a predetermined number of times was measured. The result is summarized in Table 3 below.

TABLE 3

| | Number of transfer times | | | |
|---|---|---|---|---|
| | 250 | 500 | 1,000 | 2,000 |
| Example 5 | 75 μm | 75 μm | 76 μm | 80 μm |
| Example 6 | 65 μm | 75 μm | 77 μm | 79 μm |
| Example 7 | 60 μm | 70 μm | 88 μm | * |

(*in Table 3 indicated that formation of circuit patterns was impossible due to deformation of protruding patterns)

As is apparent from Table 3, the printed circuit original plate of each of Examples 5 and 6, which has protruding patterns of the structure shown in FIG. 8F, enables formation of circuit patterns having a target width even after being used to transfer circuit patterns a large number of times and is excellent in durability, as compared with the printed circuit original plate of Example 7 shown in FIG. 9E.

EXAMPLE 8

Circuit patterns 102 consisting of copper were formed on the surface of a polyphenylenesulfide resin (PPS) film 101 shown in FIG. 10A following the same procedures as in Example 1, thereby manufacturing a single-sided printed circuit base plate 103.

As shown in FIG. 10B, a quadrangular prism-like notching member 104 having a single-edged blade at its distal end was inserted from the side of the circuit patterns 102 of the single-sided printed circuit base plate 103. In this step, a hole 105 was formed in the single-sided printed circuit base plate 103, and a notched portion 106 constituted by the circuit pattern 102 and the film 101 corresponding to the area of the hole 105 was extended downward (toward the lower surface of the film 102) by the extensibility of the film 101. Subsequently, the notched portion 106 was bent such that the film 101 of the notched portion was brought into contact with the lower surface of the single-sided printed circuit base plate 103. In this step, as shown in FIG. 10C, a folded portion 108 having a conductive portion 107 formed integrally with the circuit pattern 102 was formed.

As shown in FIG. 10D, a solder layer 109 was formed on the conductive portion 107 of the folded portion 108 of the single-sided printed circuit base plate 103. Subsequently, as shown in FIG. 10E, the single-sided printed circuit base plate 103 and another single-sided printed circuit base plate 103 which had a folded portion 108 formed following the same procedures as described above and different circuit patterns 102 were superposed on each other such that their folded portions 108 opposed each other. The resultant laminate was heated under pressure at a reduced pressure of 10 torr, a temperature of 300° C. and a pressure of 30 kg/cm² for two minutes. In this step, the conductive portions 107 of the folded portions 108 were bonded with each other via the solder layers 109, and a portion of the film 101 around each of the holes 105 was extended toward the center of the hole 105 to decrease the size of the hole 105. As a result, as shown in FIG. 10F, a flexible double-sided printed circuit board 111 in which the upper and lower circuit patterns 102 were connected with each other via the conductive portions 107 formed integrally with the circuit patterns 102 and via the solder layers 109 and which had a through hole 110 smaller than that formed in each single-sided printed circuit base plate 103 was manufactured.

It was confirmed that, in the double-sided printed circuit board 111 obtained in Example 8, no air cells were formed between the films 101, and the circuit patterns 102 on the two surfaces were conducted and connected well through the through hole 110.

EXAMPLE 9

Figure 11A:
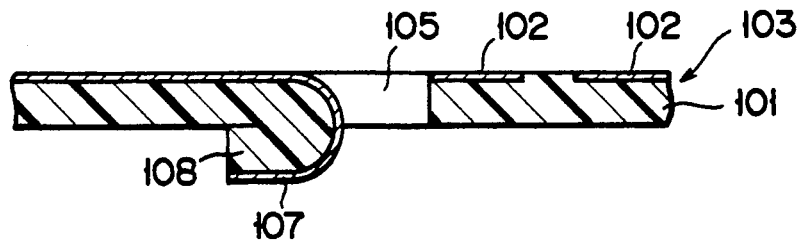
FIGS. 11A to 11C are sectional views showing manufacturing steps of a flexible multilayered printed circuit board according to Example 9 of the present invention.

First, as shown in FIG. 11A, following the same procedures as shown in FIGS. 10A to 10C described in Example 8, a hole 105 was formed in a single-sided printed circuit base plate 103, and a folded portion 108 having a conductive portion 107 formed integrally with a circuit pattern 102 was formed.

Figure 11B:
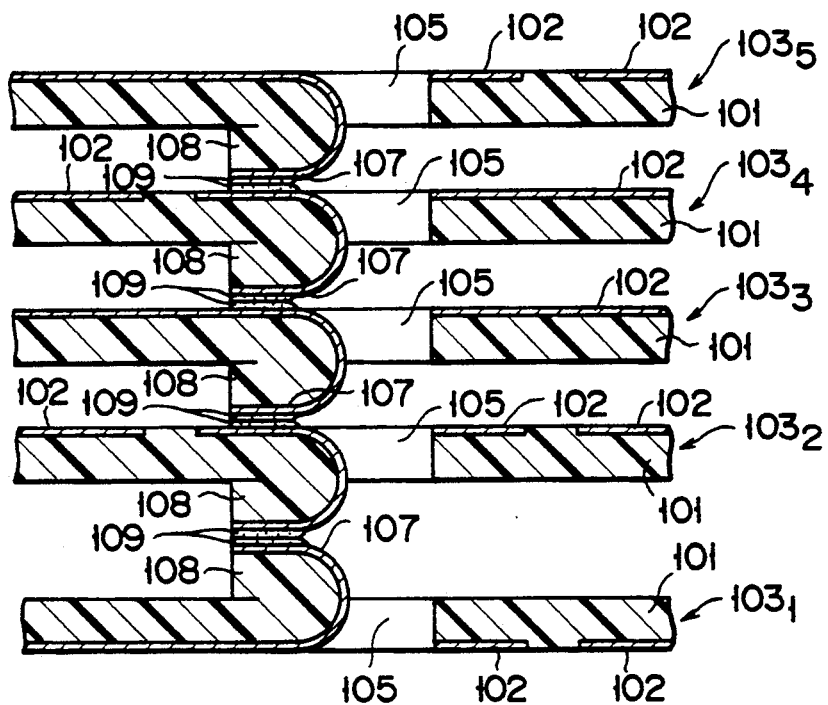
Figure 11C:
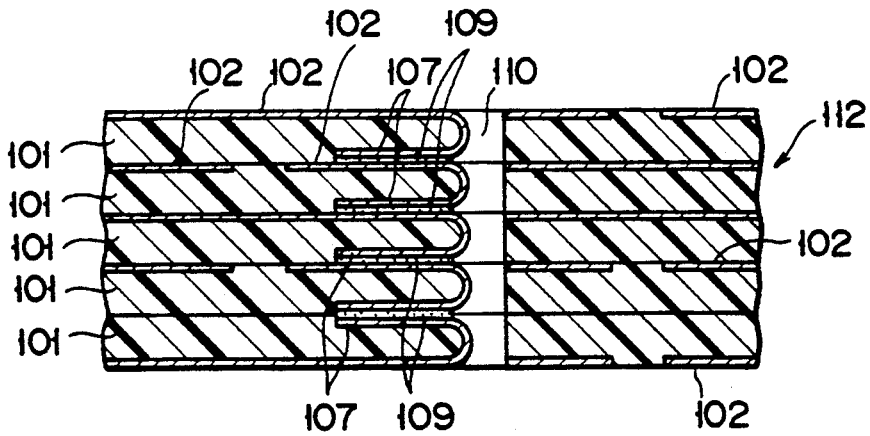

Subsequently, as shown in FIG. 11B, five single-sided printed circuit base plates $103_1$ to $103_5$ were superposed on each other such that their holes 105 were aligned. In this step, the first single-sided printed circuit base plate $103_1$ as the lowermost layer and the overlying second single-sided printed circuit base plate $103_2$ were arranged with solder layers 109 therebetween such that their folded portions 108 opposed each other. The second to fifth single-sided printed circuit base plates $103_2$ to $103_5$ were arranged with solder layers 109 therebetween such that the folded portion 108 of one of two adjacent single-sided printed circuit base plates opposed the circuit pattern on the surface of the other. Subsequently, the resultant laminate was heated under pressure at a reduced pressure of 10 torr, a temperature of 300° C. and a pressure of 30 kg/cm² for two minutes. In this step, the conductive portions 107 themselves of the folded portions 108, and the conductive portions 107 and the circuit patterns 102 were bonded with each other by the solder layers 109, and a portion of the film 101 around each of the holes 105 was extended toward the center of the hole 105 to decrease the size of the hole 105. As a result, as shown in FIG. 11C, a flexible multilayered printed circuit board 112 in which the circuit patterns 102 of the respective layers were connected with each other via the conductive portions 107 formed integrally with the circuit patterns 102 and via the solder layers 109 and which had a through hole 110 smaller than that formed in each single-sided printed circuit base plate 103 was manufactured.

It was confirmed that, in the multilayered printed circuit board 112 obtained in Example 9, no air cells were formed between the films 101, and the circuit patterns 102 of the respective layers were conducted and connected well through the through hole 110.

EXAMPLE 10

Figure 12A:
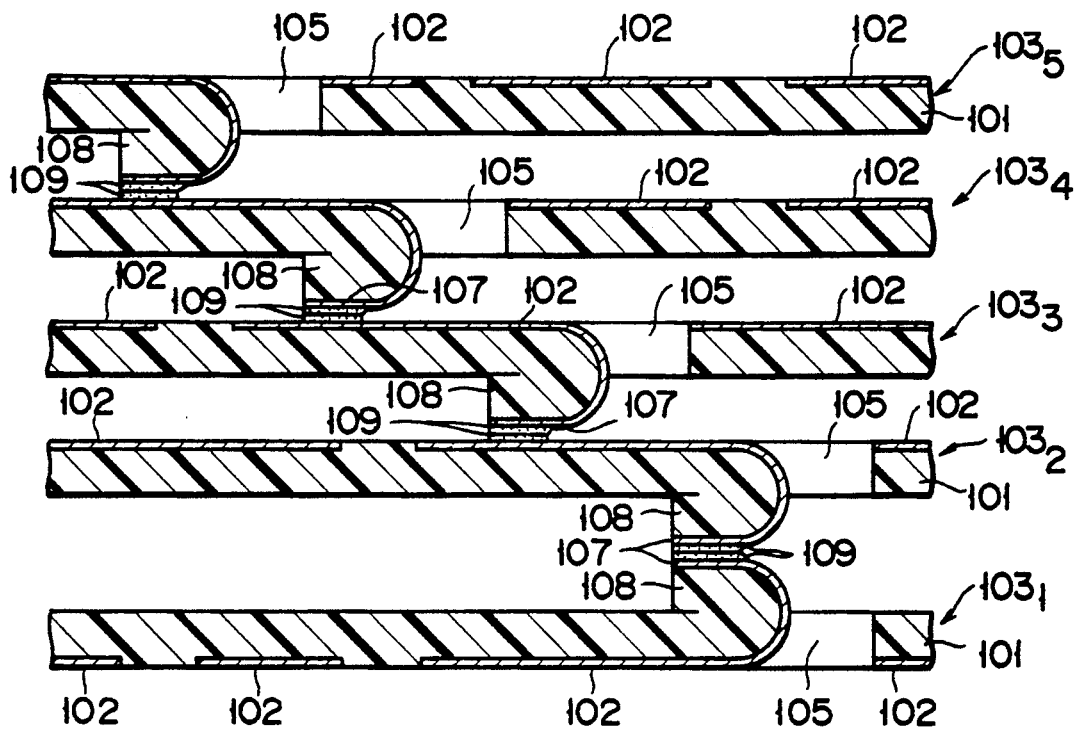
FIGS. 12A and 12B are sectional views showing manufacturing steps of a flexible multilayered printed circuit board according to Example 10 of the present invention.

First, following the same procedures as shown in FIGS. 10A to 10C described in Example 8, a hole 105 was formed in a single-sided printed circuit base plate 103, and a folded portion 108 having a conductive portion 107 formed integrally with a circuit pattern 102 was formed, and five single-sided printed circuit base plates $103_1$ to $103_5$ were superposed on each other. In this step, as shown in FIG. 12A, the first single-sided printed circuit base plate $103_1$ as the lowermost layer and the overlying second single-sided printed circuit base plate $103_2$ were arranged with solder layers 109 therebetween such that their folded portions 108 opposed each other. The second to fifth single-sided printed circuit base plates $103_2$ to $103_5$ were arranged with solder layers 109 therebetween such that their folded portions 108 were shifted in the surface direction of the layers, and the folded portion 108 of one of two adjacent single-sided printed circuit base plates opposed the circuit pattern on the surface of the other.

Figure 12B:
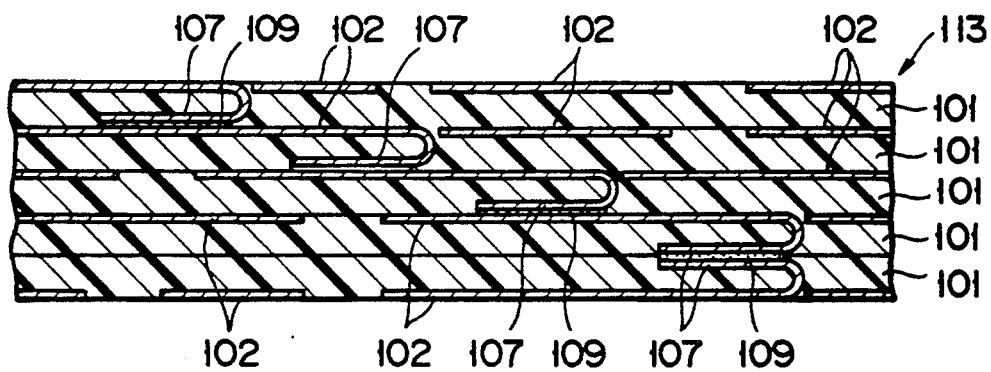

Subsequently, the resultant laminate was heated under pressure at a reduced pressure of 10 torr, a temperature of 300° C. and a pressure of 30 kg/cm² for two minutes. In this step, the conductive portions 107 themselves of the folded portions 108, and the conductive portions 107 and the circuit patterns 102 were bonded with each other by the solder layers 109, and a portion of the film 101 around each hole 105 and portions of the upper, the lower, or the upper and lower films 101 of the hole 105 were extended toward the center of the hole 105 to bury the hole 105 with the film material. As a result, as shown in FIG. 12B, a flexible multilayered printed circuit board 113 in which the circuit patterns 102 of the respective layers were connected with each other via the conductive portions 107 formed integrally with the circuit patterns 102 and via the solder layers 109, and the holes 105 of the single-sided printed circuit base plates $103_1$ to $103_5$ were buried with the films 101 was manufactured.

It was confirmed that, in the multilayered printed circuit board 113 obtained in Example 10, no air cells were formed between the films 101, and the circuit patterns 102 of the respective layers were conducted and connected well via the conductive portions 107.

EXAMPLE 11

Figure 13:
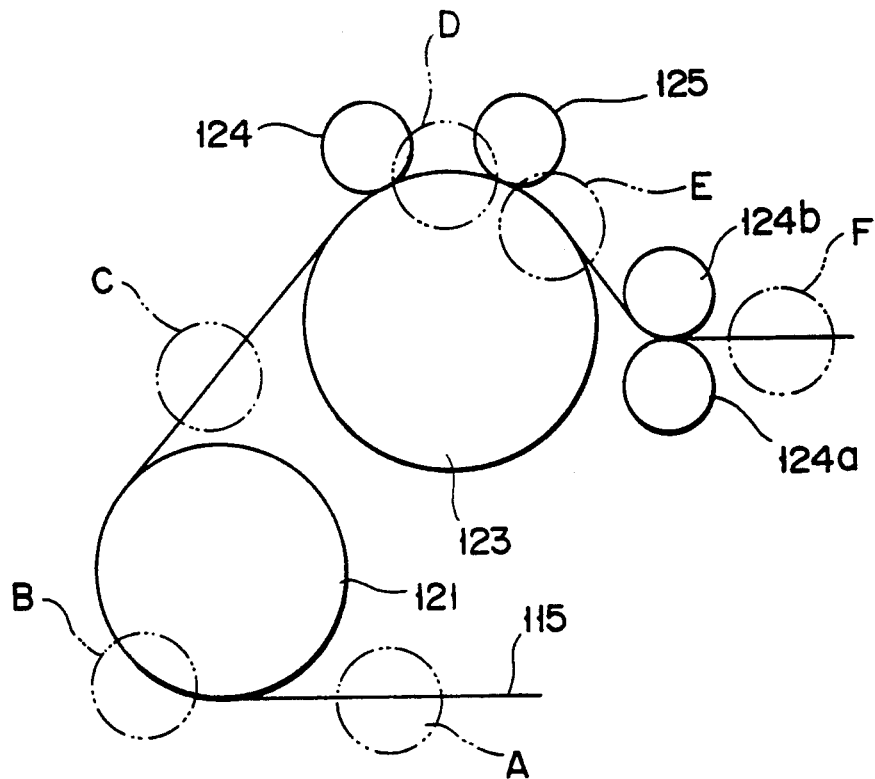
FIG. 13 is a schematic view showing an apparatus for forming folded portions having conductive portions in a single-sided printed circuit film according to Example 11 of the present invention.
Figure 14A:
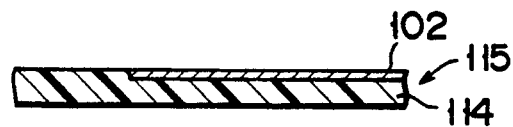
FIGS. 14A to 14F are enlarged sectional views showing portions A to F shown in FIG. 13 respectively.
Figure 14B:
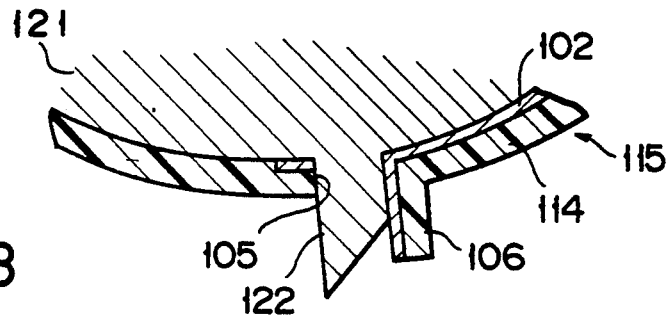

First, as shown in FIGS. 13 and 14A, following the same procedures as in Example 4, a single-sided printed circuit film 115 obtained by forming a circuit pattern 102 on a 50 μm thick continuous PPS resin film 114 was conveyed to a rotating notching roll 121. In the conveyance of the single-sided printed circuit film 115 to the notching roll 121, as shown in FIG. 14B illustrating a portion B of FIG. 13 in an enlarged scale, a circular columnar notching member 122 provided at the distal end of the notching roll 121 and having a single-edged blade was inserted in the film 114 from the side of the circuit pattern 102 to form a hole 105, and a semicircular notched portion 106 constituted by the circuit pattern 102 and the film 114 corresponding to the area of the hole 105 was extended downward in the insertion direction of the notching member 122 by the extensibility of the film 114.

Figure 14C:
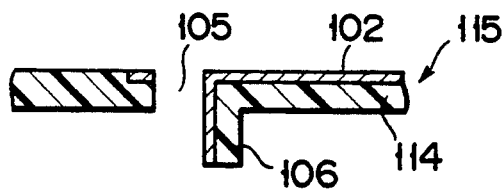
Figure 14D:
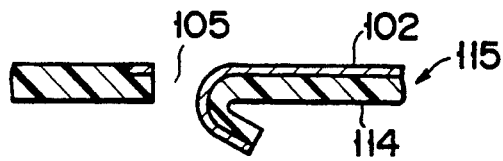
Figure 14E:
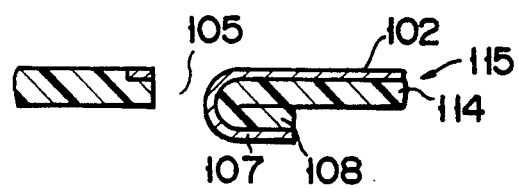
Figure 14F:
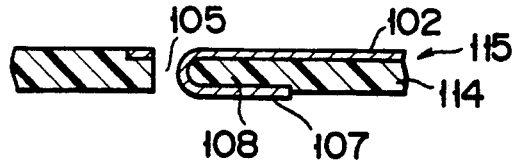

Subsequently, the single-sided printed circuit film 115 was conveyed along the roll 121 and separated from the notching member 122 of the roll 121 to obtain the shape of a portion processed by the notching member 122, as shown in FIG. 14C illustrating a portion C of FIG. 13 in an enlarged scale. The single-sided printed circuit film 115 was conveyed to a rotating receiving roll 123 and inserted between the receiving roll 123 and a first folding roll 124 arranged opposite to the receiving roll 123. In this step, as shown in FIG. 14D illustrating a portion D of FIG. 13 in an enlarged scale, the notched portion 106 of the single-sided printed circuit film 115 was bent such that the surface of the film 114 opposed the surface (lower surface) opposite to the circuit pattern 102. The single-sided printed circuit film 115 was conveyed along the rotating receiving roll 123 and inserted between the receiving roll 123 and a second folding roll 125 arranged opposite to the receiving roll 123. In this step, as shown in FIG. 14E illustrating a portion E of FIG. 13 in an enlarged scale, the notched portion 106 of the single-sided printed circuit film 115 was further bent such that the surface of the film 114 was brought into contact with the surface (lower surface) opposite to the circuit pattern 102, thereby forming a folded portion 108 having a conductive portion 107 formed integrally with the circuit pattern 102. Thereafter, the single-sided printed circuit film 115 was inserted between heat rolls 124a and 124b. In this step, a portion of the single-sided printed circuit film 115 at the folded portion 108 was heat-melted to have the same thickness as the original film thickness. As a result, as shown in FIG. 14F illustrating a portion F of FIG. 13 in an enlarged scale, the conductive portion 107 of the folded portion 108 was buried at substantially the same level as the lower surface of the film 114.

Subsequently, after a solder layer was bonded on the conductive portion of each folded portion of the single-sided printed circuit film, the film was cut by a predetermined length to manufacture six single-sided printed circuit base plates each having 100 folded portions. These monolayered printed circuit base plates were superposed on each other following the same procedures as in Example 9 and heated under pressure at a reduced pressure of 10 torr, a temperature of 300° C. and a pressure of 30 kg/cm² for two minutes. As a result, a flexible multilayered printed circuit board in which the circuit patterns of the respective layers were bonded with each other via the conductive portions formed integrally with the circuit patterns and via the solder layers, and which had a through hole smaller than that of each single-sided printed circuit base plate was manufactured.

EXAMPLE 12 to 14

Following the same procedures as in Example 4, circuit patterns were formed on a 50 μm thick continuous polyetheretherketone resin (PEEK resin) film, a 50 μm thick continuous polyparabanic acid resin (PPA resin) film and 50 μm thick continuous polythersulfone resin (PES resin) film, thereby forming single-sided printed circuit films. These single-sided printed circuit films were used to manufacture three types of flexible multilayered printed circuit boards following the same procedures as in Example 11 except that each of the PEEK resin film and the PPA resin film was heated under pressure at a reduced pressure of 10 torr, a temperature of 330° C. and a pressure of 30 kg/cm² for two minutes and the PES resin film was heated under pressure at a reduced pressure of 10 torr, a temperature of 260° C. and a pressure of 30 kg/cm² for two minutes.

It was confirmed that, in each of the multilayered printed circuit boards obtained in Examples 11 to 14, no air cells were formed between the films. In addition, when the conductivity of the connection portions was checked through the through hole, all of the 100 portions had high conductivity.

In each of Examples 11 to 14, the continuous single-sided printed circuit film was cut by a predetermined length to manufacture a plurality of single-sided printed circuit base plates, and these base plates were used to manufacture a flexible multilayered printed circuit board. However, the present invention is not limited to this method. For example, the method may be modified such that a plurality of apparatuses each having the notching roll described above are used to manufacture a plurality of single-sided printed circuit films having folded portions and these single-sided printed circuit films are superposed and heated under pressure to continuously manufacture a flexible multilayered printed circuit board.

EXAMPLE 15

First, as shown in FIG. 15A, a printed circuit original plate 205 constituted by a base material 201 consisting of a nickel-plated steel, a passage 202, a plurality of protruding patterns 203, and a plurality of holes 204 was manufactured. The passage 202 was formed inside the base material 201 and had one end open in the side surface of the base material. The protruding patterns 203 were formed on the surface of the base material 201 and had a height of 50 μm. An angle defined by the side and upper surfaces of each protruding pattern 203 was 85°. The holes 204 were formed in the surface layer of the base material 201 located between the protruding patterns 203 and communicated with the passage 202. Thereafter, an 18 μm thick copper foil 206 was placed on the protruding patterns 203.

Subsequently, a pipe (not shown) was connected to one end of the passage 202 of the printed circuit original plate 205, and a vacuum pump connected to the other end of the pipe was activated to perform vacuum suction through the plurality of holes 204 via the passage 202, via deflecting the copper foil 206 while the copper foil was in contact with the upper surfaces of the protruding patterns 203, as shown in FIG. 15B. A film 207 obtained by performing a heat treatment for a 50 μm thick polyphenylenesulfide resin (PPS resin) to have a softening temperature of about 310° C., and a similar PPS resin film (softening temperature=270° C.) 208 not subjected to the heat treatment were heat-melted to manufacture a thermoplastic resin film having a softening temperature difference between its upper and lower surfaces. As shown in FIG. 15C, this thermoplastic resin film was superposed on the copper foil 206 of the printed circuit original plate 205 such that the PPS resin film 207 having a high softening temperature was brought into contact with the copper foil 206, and a caul film 209 consisting of polyethylene fluoride was superposed on the PPS resin film 208 having a low softening temperature.

While vacuum suction was continued, the printed circuit original plate 205 and a press jig (not shown) arranged above the caul film 209 were used to heat under pressure the copper foil 206 and the thermoplastic resin film at 300° C. for 30 seconds thereby performing transfer processing. In this step of heating under pressure, as shown in FIG. 15D, portions of the copper foil 206 corresponding to the protruding patterns 203 of the original plate 205 were cut by corners of the protruding patterns 203, and cut copper foil portions (circuit patterns) 210 were transferred and buried into the softened PPS resin film 207 having a high softening temperature. Subsequently, as shown in FIG. 15E, the thermoplastic resin film having the circuit patterns 210 and excessive copper foil pieces 211 was removed from the original plate 205 and the press jig (not shown). The surface of the thermoplastic resin film was brushed to remove the excessive copper foil pieces 211, thereby manufacturing a single-sided printed circuit base plate 212 shown in FIG. 15F.

Subsequently, following the same procedures as in Example 10, the obtained single-sided printed circuit base plate was used to form folded portions having conductive portions, and five single-sided printed circuit base plates were laminated and heated under pressure to form a multilayered structure, thereby manufacturing a flexible multilayered printed circuit board in which the circuit patterns of the respective layers were connected with each other via the conducive portions formed integrally with the circuit patterns and via solder layers. Note that the heating under pressure was performed at a reduced pressure of 10 torr, a temperature of 270° C. and a pressure of 10 kg/cm² for two minutes, thereby softening the PPS resin film having a low softening temperature to bond the base plates.

In the obtained multilayered printed circuit board, the circuit patterns were neither horizontally shifted nor cut in the laminating step but located in the same positions as obtained when each single-sided printed circuit base plate was manufactured.

EXAMPLE 16

A 50 μm thick polyetheretherketone (PEEK) film (softening temperature=334° C.) and a 15 μm thick polyethyleneterephthalate (PET) film (softening temperature=260° C.) were heat-melted to form a thermoplastic resin film having a softening temperature difference between its upper and lower surfaces. This thermoplastic resin film was used to manufacture a flexible multilayered printed circuit board following the same procedures as in Example 15 except that a transfer step was performed at a temperature of 350° C. and a laminating step was performed at a temperature of 280° C. and a pressure of 10 kg/cm².

In the obtained multilayered printed circuit board, the circuit patterns were neither horizontally shifted nor cut in the laminating step but located in the same positions as obtained when each single-sided printed circuit base plate was manufactured.

EXAMPLE 17

Figure 16A:
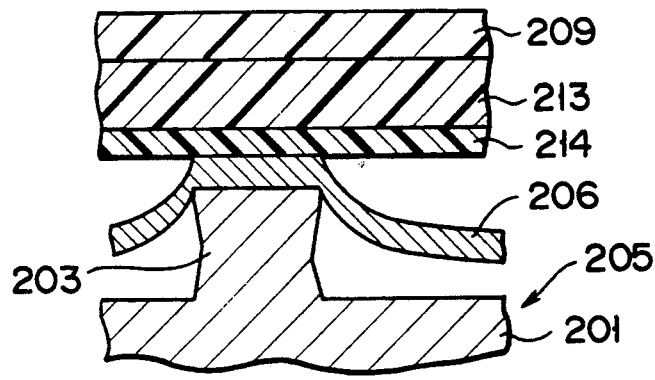
FIGS. 16A to 16C are sectional views showing manufacturing steps of a single-sided printed circuit base plate according to Example 17 of the present invention.

First, a printed circuit original plate 205 similar to that in Example 15 was manufactured, and an 18 μm thick copper foil 206 was placed on each protruding pattern 203. A pipe (not shown) was connected to one end of a passage (not shown) of the original plate 205, and a vacuum pump connected to the other end of the pipe was activated to perform vacuum suction through a plurality of holes (not shown) via the pipe and the passage, thereby deflecting the copper foil 206 while the copper foil 206 was in contact with the upper surface of the protruding pattern 203. Subsequently, a 50 μm thick polyparabanic acid film 213 and a 12 μm thick polyethersulfone film (softening temperature=225° C.) 214 were heat-melted to manufacture a thermoplastic resin film having a softening temperature difference between its upper and lower surfaces. This thermoplastic resin film was superposed on the copper foil 206 of the printed circuit original plate 205 such that the polyethersulfone film 214 having a low softening temperature was brought into contact with the copper foil 206, and a caul film 209 consisting of polyethylene fluoride was superposed on the polyparabanic acid film 213 having a high softening temperature (FIG. 16A).

Figure 16B:
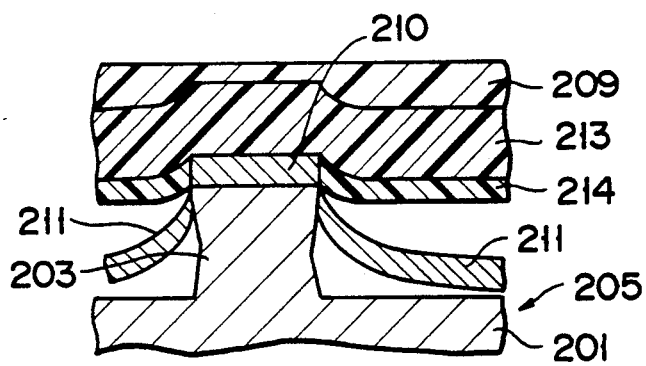
Figure 16C:
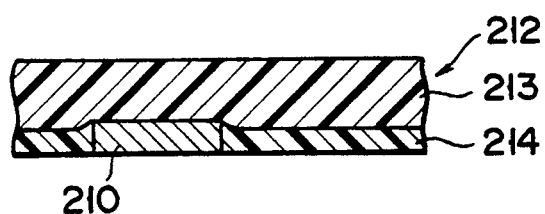

While vacuum suction was continued, the printed circuit original plate 205 and a press jig (not shown) arranged above the caul film 209 were used to heat under pressure the copper foil 206 and the thermoplastic resin film at 260° C. for 30 seconds, thereby performing transfer processing. In this step of heating under pressure, as shown in FIG. 16B, a portion of the copper foil 206 corresponding to the protruding pattern 203 of the original plate 205 was cut by corners of the protruding pattern 203, and a cut copper foil portion (a circuit pattern) 210 was transferred and buried into the softened polyethersulfone film 214 having a low softening temperature, and the film 214 corresponding to the buried portion was buried in the polyparabanic acid film 213 having a high softening temperature. Subsequently, the thermoplastic resin film having the circuit pattern 210 and excessive copper foil pieces 211 was removed from the original plate 205 and the press jig (not shown). The surface of the thermoplastic resin film was brushed to remove the excessive copper foil pieces 211, thereby manufacturing a single-sided printed circuit base plate 212 shown in FIG. 16C.

Subsequently, following the same procedures as in Example 10, the obtained single-sided printed circuit base plate was used to form folded portions having conductive portions, and five single-sided printed circuit base plates were laminated and heated under pressure to form a multilayered structure, thereby manufacturing a flexible multilayered printed circuit board in which the circuit patterns of the respective layers were connected with each other via the conducive portions formed integrally with the circuit patterns and via solder layers. Note that the heating under pressure was performed at a reduced pressure of 10 torr, a temperature of 270° C. and a pressure of 10 kg/cm² for two minutes, thereby softening the polyethersulfone resin film having a low softening temperature to bond the base plates.

In the obtained multilayered printed circuit board, the circuit patterns were neither horizontally shifted nor cut in the laminating step but located in the same positions as obtained when each single-sided printed circuit base plate was manufactured, and had a uniform thickness.

EXAMPLE 18

A 50 μm thick PPS resin film (softening temperature=310° C.) and a 15 μm thick PPS film (softening temperature=270° C.) were heat-melted to form a thermoplastic resin film having a softening temperature difference between its upper and lower surfaces. This thermoplastic resin film was used to manufacture a flexible multilayered printed circuit board following the same procedures as in Example 17 except that a transfer step was performed at a temperature of 270° C. and a laminating step was performed at a temperature of 270° C. and a pressure of 10 kg/cm².

In the obtained multilayered printed circuit board, the circuit patterns were neither horizontally shifted nor cut in the laminating step but located in the same position as obtained when each single-sided printed circuit base plate was manufactured, and had a uniform thickness.

EXAMPLE 19

Figure 17A:
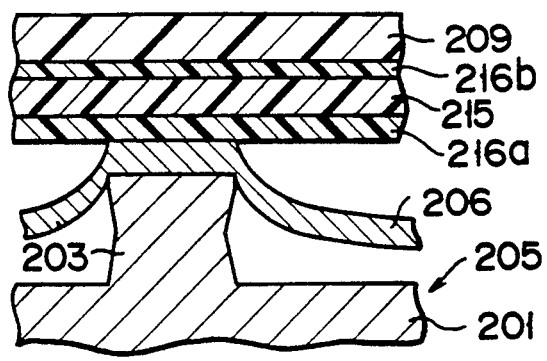
FIGS. 17A to 17C are sectional views showing manufacturing steps of a single-sided printed circuit base plate according to Example 19 of the present invention.

First, a printed circuit original plate 205 similar to that in Example 15 was manufactured, and an 18 μm thick copper foil 206 was placed on each protruding pattern 203. A pipe (not shown) was connected to one end of a passage (not shown) of the original plate 205, and a vacuum pump connected to the other end of the pipe was activated to perform vacuum suction through from a plurality of holes (not shown) via the pipe and the passage, thereby deflecting the copper foil 206 while the copper foil was in contact with the upper surface of the protruding pattern 203. Subsequently, 12 μm thick PPS resin films 216a and 216b having a low softening temperature (softening temperature=270° C.) were heat-melted on two surfaces of a 50 μm thick PPS resin film 215 having a high softening temperature (softening temperature=310° C.) to manufacture a thermoplastic resin film having a softening temperature difference between its upper and lower surfaces and interior. This thermoplastic resin film was superposed on the copper foil 206 of the printed circuit original plate 205 such that the PPS resin film 216a having a low softening temperature was brought into contact with the copper foil 206, and a caul film 209 consisting of polyethylene fluoride was superposed on the low-softening temperature PPS resin film 216b on the opposite side (FIG. 17A).

Figure 17B:
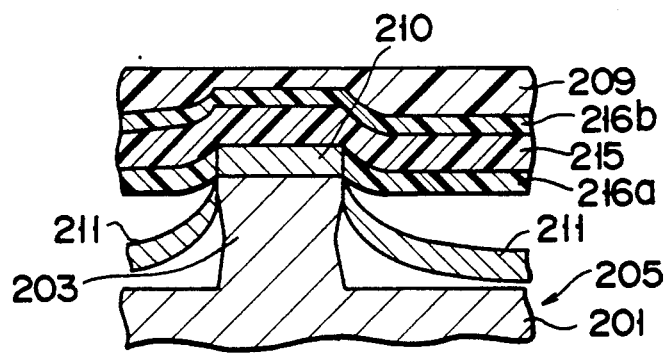
Figure 17C:
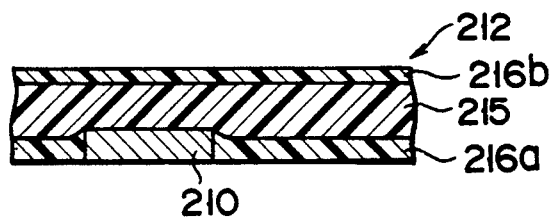

While vacuum suction was continued, the printed circuit original plate 205 and a press jig (not shown) arranged above the caul film 209 were used to heat under pressure the copper foil 206 and the thermoplastic resin film at 270° C. for 30 seconds, thereby performing transfer processing. In this step of heating under pressure step, as shown in FIG. 17B, a portion of the copper foil 206 corresponding to the protruding pattern 203 of the original plate 205 was cut by corners of the protruding pattern 203, and a cut copper foil portion (a circuit pattern) 210 was transferred and buried into the softened low-softening temperature PPS resin film 216a, and the film 216a corresponding to the buried portion was buried in the high-softening temperature PPS resin film 215 and the low-softening temperature PPS resin film 216b. Subsequently, after the thermoplastic resin film having the circuit pattern 210 and excessive copper foil pieces 211 was removed from the original plate 205 and the press jig (not shown), the surface of the thermoplastic resin film was brushed to remove the excessive copper foil pieces 211, thereby manufacturing a single-sided printed circuit base plate 212 shown in FIG. 17C.

Subsequently, following the same procedures as in Example 10, the obtained single-sided printed circuit base plate was used to form folded portions having conductive portions, and five single-sided printed circuit base plates were laminated and heated under pressure to form a multilayered structure, thereby manufacturing a flexible multilayered printed circuit board in which the circuit patterns of the respective layers were connected with each other via the conducive portions formed integrally with the circuit patterns and via solder layers. Note that the heating under pressure was performed at a reduced pressure of 10 torr, a temperature of 270° C. and a pressure of 10 kg/cm$^2$ for two minutes, thereby mainly softening the PPS resin film on the opposite side of the circuit pattern formation surface to bond the base plates.

In the obtained multilayered printed circuit board, the circuit patterns were neither horizontally shifted nor cut in the laminating step but located in the same positions as obtained when each single-sided printed circuit base plate was manufactured and had a uniform thickness.

EXAMPLE 20

10 μm thick polyvinylidene chloride films (softening temperature=160° C.) were heat-melted on two surfaces of a 50 μm thick polyethersulfone film (softening temperature=225° C.) to form a thermoplastic resin film having a softening temperature difference between its upper and lower surfaces and interior. This thermoplastic resin film was used to manufacture a flexible multilayered printed circuit board following the same procedures as in Example 19 except that a transfer step was performed at a temperature of 170° C. and a laminating step was performed at a temperature of 270° C. and a pressure of 10 kg/cm$^2$.

In the obtained multilayered printed circuit board, the circuit patterns were neither horizontally shifted nor cut in the laminating step but located in the same position as obtained when each single-sided printed circuit base plate was manufactured, and had a uniform thickness.

EXAMPLE 21

First, as shown in FIG. 18A, a printed circuit original plate 205 similar to that in Example 15 was manufactured, and an 18 μm thick copper foil 206 was placed on protruding patterns 203. A pipe (not shown) was connected to one end of a passage 202 of the original plate 205, and a vacuum pump connected to the other end of the pipe was activated to perform vacuum suction via a plurality of holes 204 through the pipe and the passage 202, thereby deflecting the copper foil 206 while the copper foil 206 was in contact with the upper surfaces of the protruding patterns 203, as shown in FIG. 18B. Subsequently, a 10 μm thick epoxy resin adhesive layer 218 was coated on a 50 μm thick polyethersulfone film 217 to manufacture a film with an adhesive. As shown in FIG. 18C, this thermoplastic resin film was superposed on the copper foil 206 of the printed circuit original plate 205 such that the adhesive layer 218 was brought into contact with the copper foil 206, and a caul film 209 consisting of polyethylene fluoride was superposed on the polyethersulfone film 217.

Figure 18D:
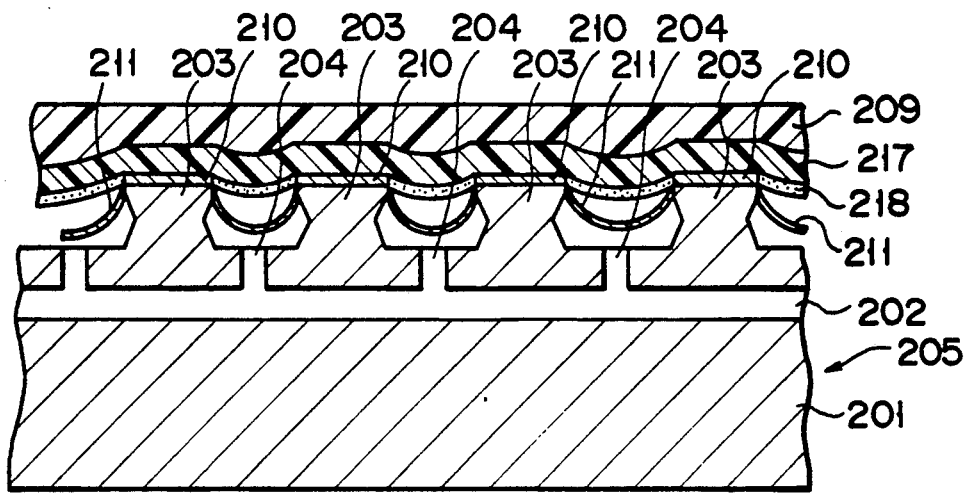
Figure 18E:
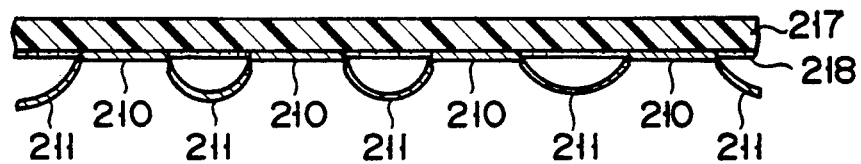
Figure 18F:
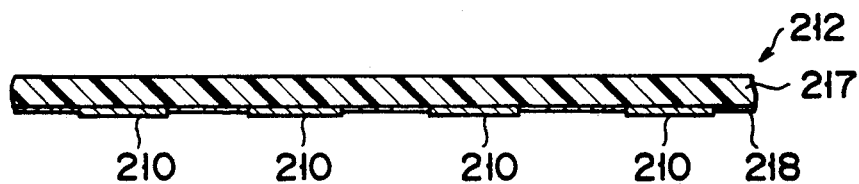

While vacuum suction was continued, the printed circuit original plate 205 and a press jig (not shown) arranged above the caul film 209 were used to heat under pressure the copper foil 206 and the film with an adhesive at a pressure of 100 kg/cm$^2$ for one minute, thereby performing transfer processing. In this step of heating under pressure, as shown in FIG. 18D, portions of the copper foil 206 corresponding to the protruding patterns 203 of the original plate 205 were cut by corners of the protruding patterns 203, cut copper foil portions (circuit patterns) 210 were transferred and buried into the softened adhesive layer 218, and the layer 218 was hardened. Subsequently, as shown in FIG. 18E, the film having the circuit patterns 210 and excessive copper foil pieces 211 was removed from the original plate 205 and the press jig (not shown). The surface of the film was brushed to remove the excessive copper foil pieces 211, thereby manufacturing a single-sided printed circuit base plate 212 shown in FIG. 18F.

Subsequently, an adhesive layer consisting of an epoxy resin was coated on the film surface opposite to the circuit patterns of the single-sided printed circuit base plate. Thereafter, following the same procedures as in Example 10, the obtained single-sided printed circuit base plate was used to form folded portions having conductive portions, and five single-sided printed circuit base plates were laminated and heated under pressure to form a multilayered structure, thereby manufacturing a flexible multilayered printed circuit board in which the circuit patterns of the respective layers were connected with each other via the conducive portions formed integrally with the circuit patterns and via solder layers. Note that the heating under pressure was performed at a reduced pressure of 10 torr, a temperature of 150° C. and a pressure of 20 kg/cm$^2$ for 10 minutes, thereby bonding the base plates by the hardened adhesive layers.

In the obtained multilayered printed circuit board, the circuit patterns were neither horizontally shifted nor cut in the laminating step but located in the same positions as obtained when each single-sided printed circuit base plate was manufactured, and had a uniform thickness.

EXAMPLE 22

Figure 19A:
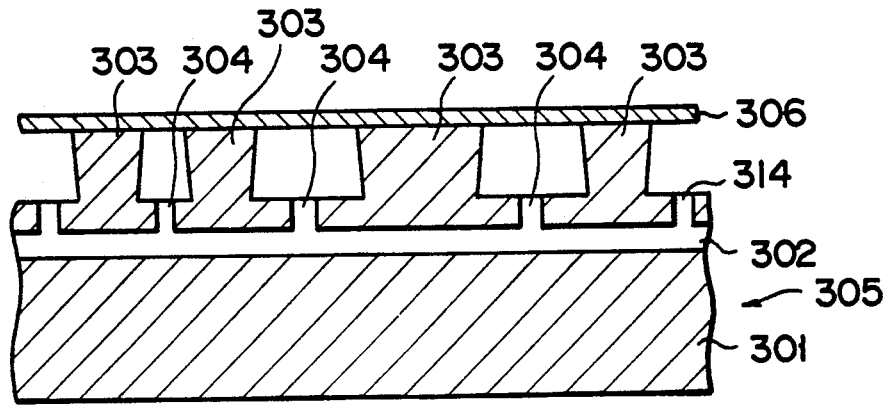

First, as shown in FIG. 19A, a printed circuit original plate 305 constituted by a base material 301 consisting of a nickel-plated steel, a passage 302, a plurality of protruding patterns 303, and a plurality of holes 304 was manufactured. The passage 302 was formed inside the base material 301 and had one end open in the side surface of the base material. The protruding patterns 303 were formed on the surface of the base material 301 and had a height of 50 μm. An angle defined by the side and upper surfaces of each protruding pattern was 85°. The holes 304 were formed in the surface layer of the base material 301 located between the protruding patterns 303 and communicated with the passage 302. Thereafter, an 18 μm thick copper foil 306 was placed on the protruding patterns 303.

Figure 19B:
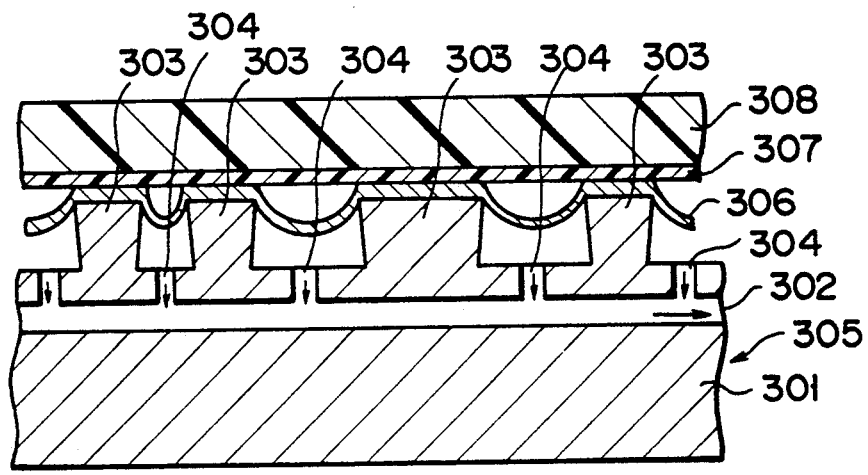

Subsequently, a pipe (not shown) was connected to one end of the passage 302 of the printed circuit original plate 305, and a vacuum pump connected to the other end of the pipe was activated to perform vacuum suction through the plurality of holes 304 via the passage 302, thereby deflecting the copper foil 306 while the copper foil 306 was in contact with the upper surfaces of the protruding patterns 303. A 50 μm thick resin layer 308 formed by adding 3% of a silicone mold lubricating agent to a phenoxy resin was coated on a polyethyleneterephthalate (PET) film 307. The film was superposed on the copper foil 306 of the printed circuit original plate 305 such that the PET film 307 was brought into contact with the copper foil 306, as shown in FIG. 19B.

Figure 19C:
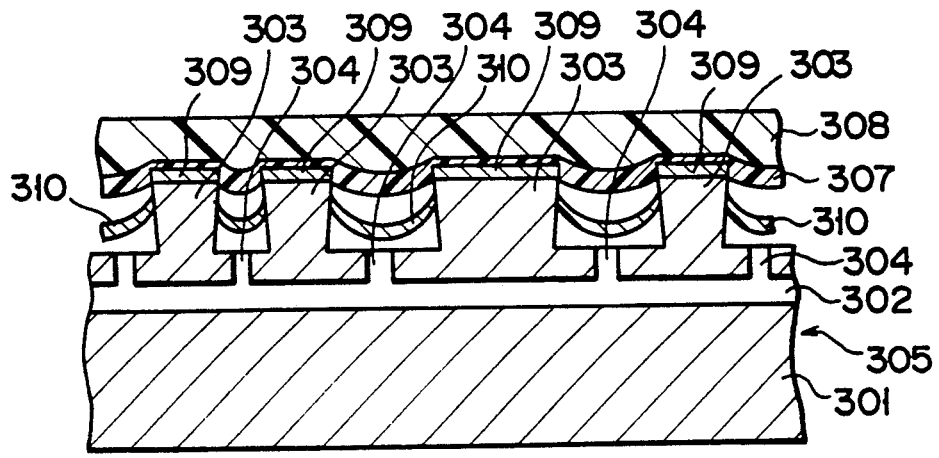

While vacuum suction was continued, the printed circuit original plate 305 and a press jig (not shown) arranged above the resin layer 308 were used to heat under pressure the copper foil 306 and the film at 300° C. for 30 seconds, thereby performing transfer processing. In this step of heating under pressure, as shown in FIG. 19C, portions of the copper foil 306 corresponding to the protruding patterns 303 of the original plate 305 were cut by corners of the protruding patterns 303, and cut copper foil portions (circuit patterns) 309 were transferred and buried into the softened PET film 307. Subsequently, as shown in FIG. 19D, the film having the circuit patterns 309 and excessive copper foil pieces 310 was removed from the original plate 305 and the press jig (not shown). The surface of the film was brushed to remove the excessive copper foil pieces 310, thereby manufacturing a transfer film 311 shown in FIG. 19E.

Figure 19F:
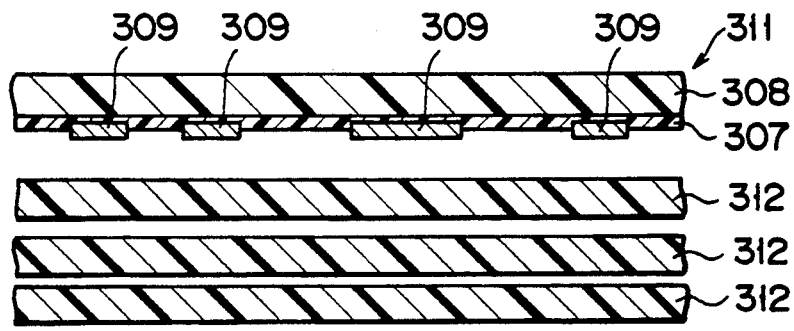
Figure 19G:
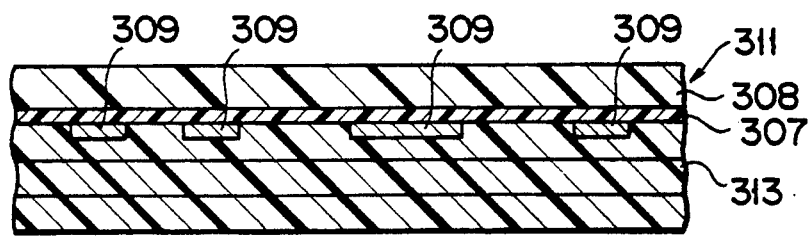
Figure 19H:
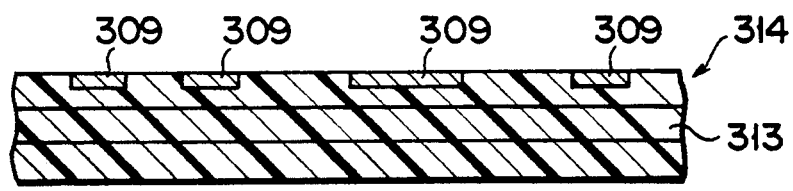

Subsequently, as shown in FIG. 19F, the transfer film 311 was arranged above three prepregs 312 each obtained by impregnating an epoxy resin into a glass cloth, such that the circuit patterns 309 of the transfer film 311 were located on the side of the prepreg 312. Following the same procedures as for manufacturing an epoxy resin laminate, the resultant structure was heated under pressure to harden the epoxy resin, thereby manufacturing a laminate 313 on which the transfer film 31 was retransferred, as shown in FIG. 19G. Thereafter, the PET film 307 and the resin layer 308 of the transfer film 311 were peeled and removed to manufacture a single-sided printed circuit board 314 shown in FIG. 19H.

EXAMPLE 23

Figure 20A:
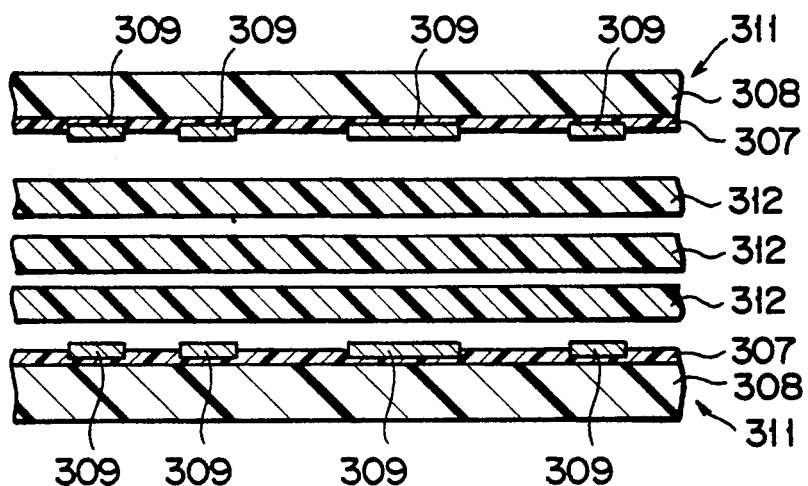
FIGS. 20A to 20C are sectional views showing manufacturing steps of a double-sided printed circuit board according to Example 23 of the present invention.
Figure 20B:
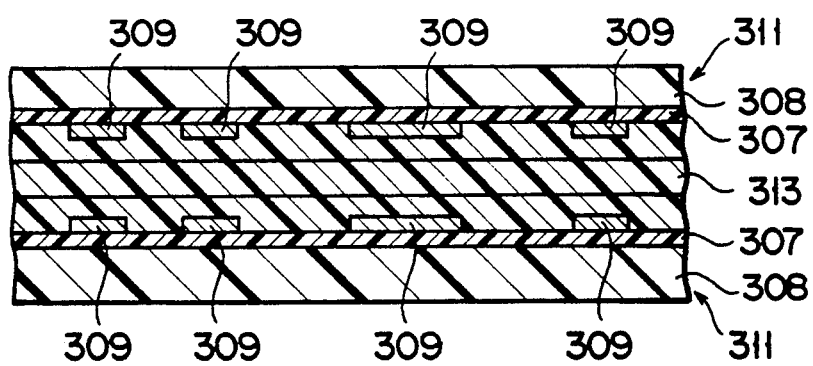
Figure 20C:
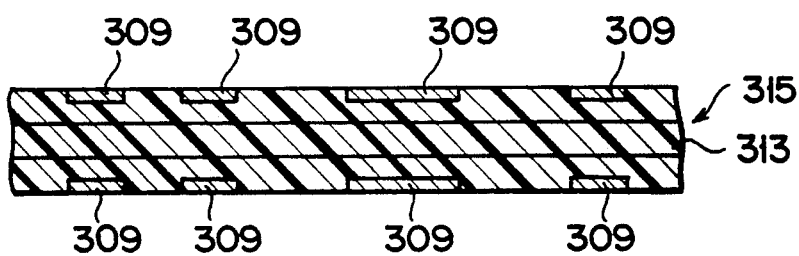

As shown in FIG. 20A, two transfer films 311 manufactured in Example 22 were arranged above and below three prepregs 312 each obtained by impregnating an epoxy resin into a glass cloth, such that circuit patterns 309 of each transfer film 311 were located on the side of the prepreg 312. Following the same procedures as for manufacturing an epoxy resin laminate, the resultant structure was heated under pressure to harden the epoxy resin, thereby manufacturing a laminate 313, on both the surfaces of which the transfer film 311 was retransferred, as shown in FIG. 20B. Thereafter, a PET film 307 and a resin layer 308 of each transfer film 311 were peeled and removed to manufacture a double-sided printed circuit board 315 shown in FIG. 20C.

EXAMPLE 24

First, as shown in FIG. 21A, a printed circuit original plate 305 similar to that in Example 22 was manufactured, and an 18 μm thick copper foil 306 was placed on protruding patterns 303. A pipe (not shown) was connected to one end of a passage 302 of the original plate 305, and a vacuum pump connected to the other end of the pipe was activated to perform vacuum suction through a plurality of holes 304 via the pipe and the passage 302, thereby deflecting the copper foil 306 while the copper foil was in contact with the upper surfaces of the protruding patterns 303. Subsequently, a 50 μm thick silicone rubber film 316 was superposed on the copper foil 306 of the printed circuit original plate 305, as shown in FIG. 21B.

While vacuum suction was continued, the printed circuit original plate 305 and a press jig (not shown) arranged above the silicone rubber film 316 were used to heat under pressure the silicone rubber film 316 and the copper foil 306 at a temperature of 300° C. for 30 seconds, thereby performing transfer processing. In this step of heating under pressure, as shown in FIG. 21C, portions of the copper foil 306 corresponding to the protruding patterns 303 of the original plate 305 were cut by corners of the protruding patterns 303, and cut copper foil portions (circuit patterns) 309 were transferred and buried into the softened silicone rubber film 316. Subsequently, as shown in FIG. 21D, the film 316 having the circuit patterns 309 and excessive copper foil pieces 310 was removed from the original plate 305 and the press jig (not shown). The surface of the film 316 was brushed to remove the excessive copper foil pieces 310, thereby manufacturing a transfer film 317 shown in FIG. 21E.

Figure 21F:
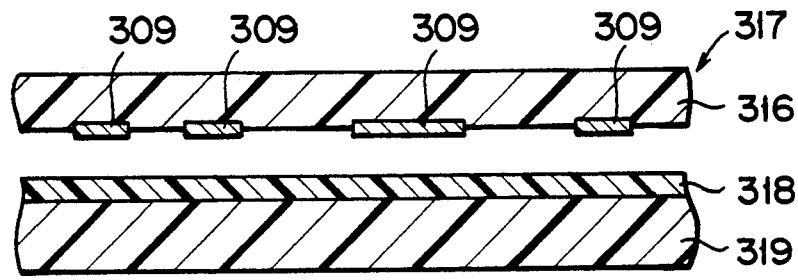
Figure 21G:
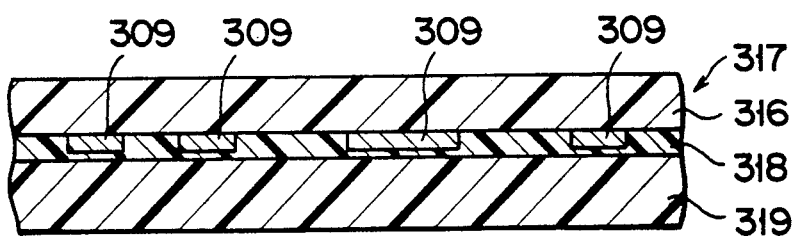
Figure 21H:
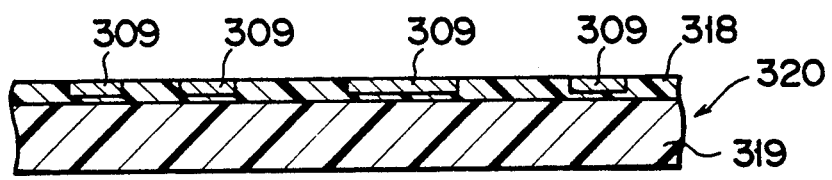

As shown in FIG. 21F, the transfer film 317 was arranged above a polyimide film 319 having an epoxy resin adhesive layer 318 on its one surface, such that the circuit patterns 309 of the transfer film were located on the side of the adhesive layer 318. Subsequently, the resultant structure was heated under pressure at a hardening temperature of the adhesive to harden the epoxy resin adhesive layer 318, thereby retransferring the transfer film 317, as shown in FIG. 21G. Thereafter, the silicone rubber film 316 of the transfer film 317 was peeled and removed to manufacture a flexible single-sided printed circuit board 320 shown in FIG. 21H.

EXAMPLE 25

Figure 22A:
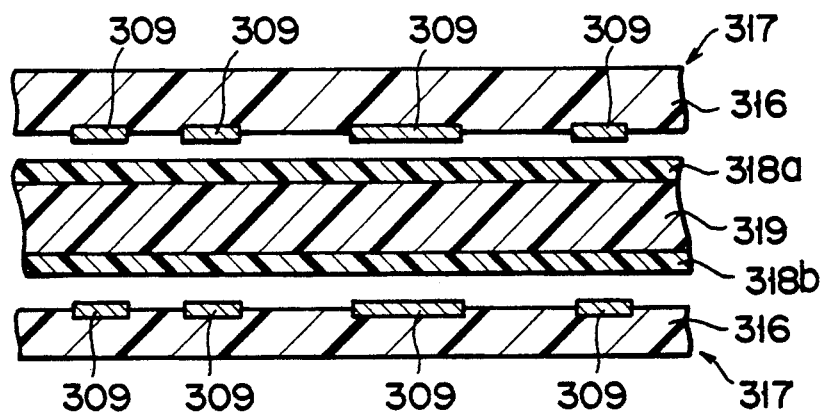
FIGS. 22A to 22C are sectional views showing manufacturing steps of a flexible double-sided printed circuit board according to Example 25 of the present invention.
Figure 22B:
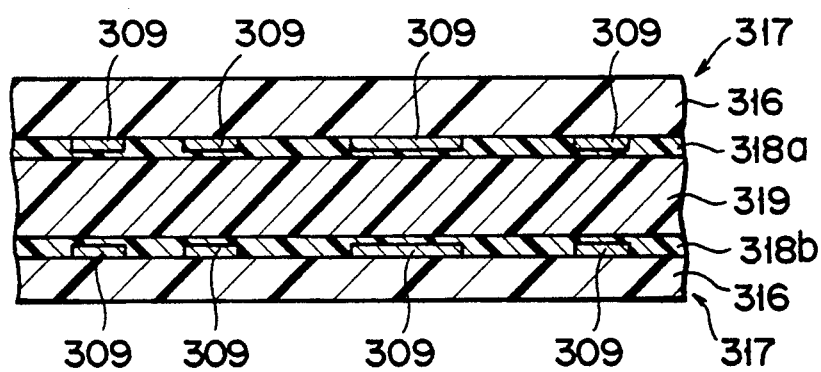
Figure 22C:
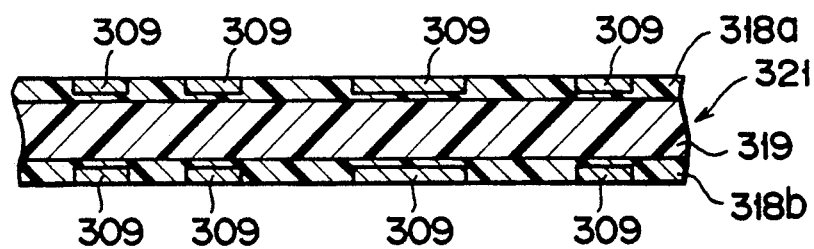

As shown in FIG. 22A, two transfer films 317 manufactured in Example 24 were arranged above and below a polyimide film 319 having epoxy resin adhesive layers 318a and 318b on its two surfaces, such that circuit patterns 309 of the transfer films 317 were located on the sides of the adhesive layers 318a and 318b. The resultant structure was heated under pressure at a hardening temperature of the adhesive to harden the epoxy resin adhesive layers 318a and 318b, thereby retransferring the two transfer films 317, as shown in FIG. 22B. Thereafter, a silicone rubber film 316 of each transfer film 317 was peeled and removed to manufacture a flexible double-sided printed circuit board 321 shown in FIG. 22C.

EXAMPLE 26

A transfer film manufactured following the same procedures as in Example 22 was mounted in an injection box member mold, and a PPS resin was injection-molded. After the box member was removed from the mold, a PET film and a resin layer of the transfer film were peeled and removed to manufacture a three-dimensional printed circuit board onto which circuit patterns were transferred.

EXAMPLE 27

Figure 23A:
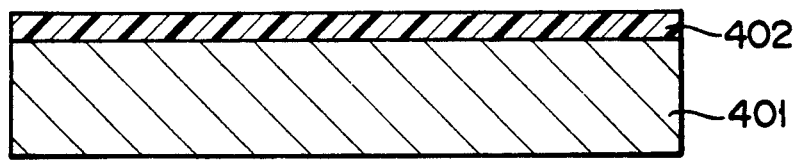
FIGS. 23A to 23H are sectional views showing manufacturing steps of a printed circuit board according to Example 27 of the present invention.
Figure 23B:
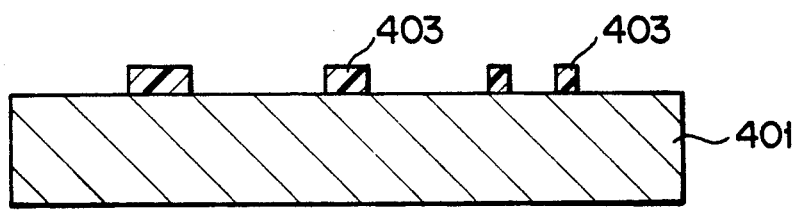
Figure 23C:
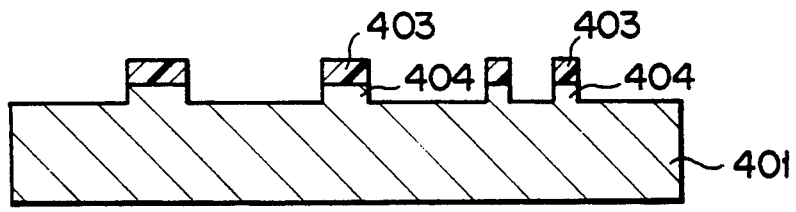
Figure 23D:
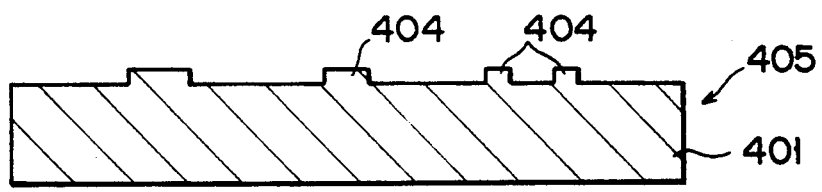

First, as shown in FIG. 23A, a photoresist was coated on a mirror-polished surface of a 30 cm × 30 cm metal plate 401 and dried to form a resist film 402. The resist film 402 was exposed and developed to form resist patterns 403, as shown in FIG. 23B. The resist patterns 403 were used as a mask to etch the exposed surface of the metal plate 401 to a depth of 20 μm, thereby forming protruding patterns 404 having the same shape as circuit patterns, as shown in FIG. 23C. Thereafter, the resist patterns 403 were peeled to manufacture a metal mold 405 having the protruding patterns 404, as shown in FIG. 23D.

Figure 23E:
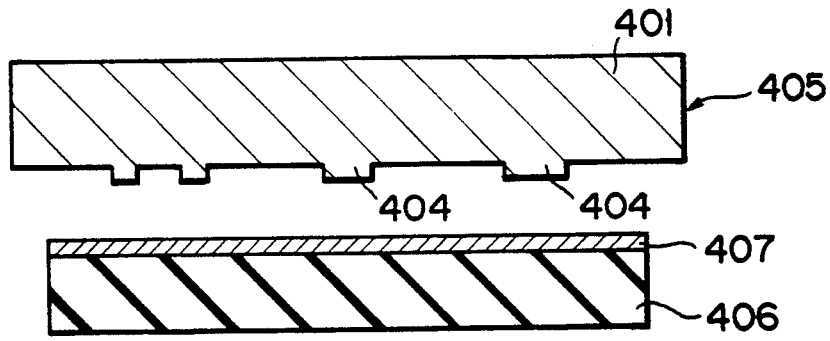
Figure 23F:
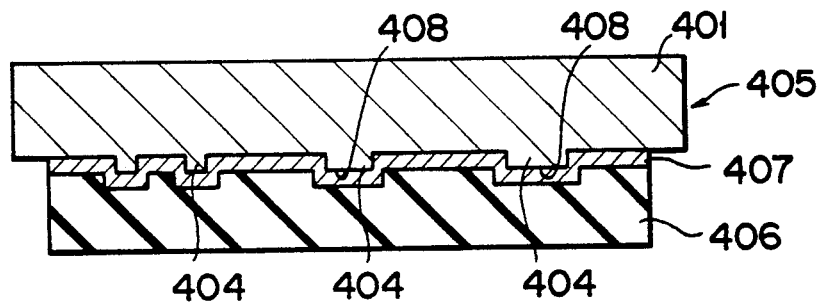
Figure 23G:
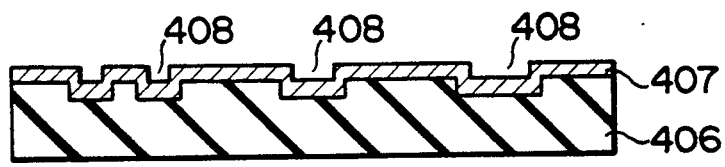
Figure 23H:
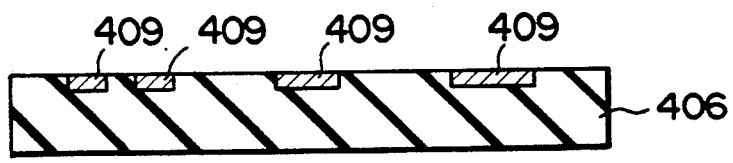

Subsequently, as shown in FIG. 23E, an 18 μm thick copper foil 407 was bonded on a 1 mm thick fluorine resin plate 406 to manufacture a copper-clad fluorine resin base. This base was set in a vacuum vessel (not shown), and the metal mold 405 was arranged above the base such that the protruding patterns 404 opposed the copper foil 407. The pressure in the vacuum vessel was reduced to be 10 torr, and the metal mold 405 was moved downward toward the base while being heated up to 270° C. and heated under pressure at a pressure of 3 kg/cm² for 20 seconds. In this step, recess patterns 408 at the same level as the surface of the plate 406 were formed in portions of the copper foil 407 on the surface of the plate 406 with which the protruding patterns 404 of the metal mold 405 were brought into contact, as shown in FIG. 23F. Subsequently, the metal mold 405 was moved upward, and the copper-clad fluorine resin base having the recess patterns 408 shown in FIG. 23G was removed from the vacuum vessel. Thereafter, while water was flowed on the surface on the side of the recess patterns 408, the protruding portions of the copper foil 407 were ground and removed by a drum wound by sandpaper, thereby manufacturing a printed circuit board having copper circuit patterns 409 buried at the same level as the surface of the plate 406, as shown in FIGS. 23H and 24. Note that FIG. 24 is a plan view of FIG. 23H.

When the peeling strength of the circuit patterns 409 of the obtained printed circuit board was measured, it was confirmed that the patterns had a high adhesion strength of 1.5 kg/cm².

In addition, the difference between the width of each protruding pattern 404 of the metal mold 405 and that of each circuit pattern 409 of the printed circuit board was measured. As a result, the width of the circuit pattern 409 was larger by 3% to 7% than that of the protruding pattern 404. The positional deviation of the circuit patterns 409 was as very small as 0.01 mm for 25 cm.

EXAMPLE 28

A 125 μm thick polyparabanic acid film, e.g. SOLDAX (tradename: available from Tonen Sekiyu Sha K.K.) was used as a plat to manufacture a printed circuit board following the same procedures as in Example 27 except that the temperature of heating under pressure was 300° C.

when the peeling strength of circuit patterns of the obtained printed circuit board was measured, it was confirmed that the patterns had a high adhesion strength of 1.8 kg/cm².

In addition, the difference between the width of the protruding pattern of the metal mold and that of the circuit pattern of the obtained printed circuit board was measured. As a result, the width of the circuit pattern was larger by 2% to 4% than that of the protruding pattern. The positional deviation of the circuit patterns was as very small as 0.005 mm for 25 cm.

EXAMPLE 29

FIG. 25 is a schematic view showing a continuous printed circuit film manufacturing apparatus used in Example 29. Reference numeral 501 denotes a hoop wound by a copper-clad fluorine resin film 502 manufactured by bonding an 18 μm thick copper foil on a 100 μm thick fluorine resin film. Two feed rolls 503a and 503b are arranged at the film 502 supply side of the hoop 501. A heating chamber 504 is arranged at the film 502 supply side of the back feed roll 503b. In the heating chamber 504, two feed rolls 505a and 505b, and a transfer roll 506 and a press roll 507 vertically arranged to oppose each other are arranged in the supply direction of the film 502. The transfer roll 506 is manufactured by coating a photosensitive film, e.g., LISTON (tradename: available from Du Pont de Nemours, E.I., Co.) on the surface of a metal roll, exposing and developing the film to form patterns, etching the roll surface to a depth of 20 μm by using the film patterns as a mask to form protruding patterns having the same shape as circuit patterns, and peeling the film patterns. A grinding roll 509, a feed roll 510, and a take-up roll 511 are sequentially arranged on the film 502 supply side of the heating chamber 504. Shower nozzles 508a and 508b for injecting water against a supplied film are arranged between the heating chamber 504 and the grinding roll 509 and between the grinding roll 509 and the feed roll 510.

A method for manufacturing a printed circuit film using the manufacturing apparatus shown in FIG. 25 will be described below.

First, the interior of the heating chamber 504 was heated up to 180° C. to 200° C., and the transfer roll 506 arranged in the chamber was heated up to 270° C. The copper-clad fluorine resin film 502 was supplied from the hoop 501 into the chamber 504 through the feed rolls 503a and 503b at a rate of 60 cm/min. In the chamber 504, the film 502 was supplied between the transfer roll 506 and the press roll 507 through the feed rolls 505a and 505b such that the copper foil of the film 502 opposed the transfer roll 506. In this step, a pressure of 1 kg/cm² was applied on the copper-clad fluorine resin film 502 by the press roll 507, and the copper foil side of the film 502 was heated under pressure by the transfer roll 506 arranged on the opposite side, thereby transferring protruding patterns of the transfer roll 506 onto the copper foil side of the film 502 as recess patterns.

The copper-clad fluorine resin film 502 having the transferred recess patterns was showered by water injected from the shower nozzle 508a, and protruding portions of the copper foil of the copper-clad fluorine resin film 502 were ground and removed as in Example 27 while the film passed the grinding roll 509, thereby forming copper circuit patterns buried at the same level as the film surface. Subsequently, the resultant film was washed with water injected from the shower nozzle 508b and taken up by the take-up roll 511 through the feed roll 510.

Deformation of the circuit patterns of the obtained continuous printed circuit film was checked on the basis of the film patterns used in the manufacture of the transfer roll. As a result, the patterns were extended at a rate of 0.08 cm per 30 cm in the direction of pull and contracted at a rate of 0.1 cm per 30 cm in a direction perpendicular to the pull direction. In the manufacturing steps, neither disconnection nor peeling of the circuit patterns were found.

EXAMPLE 30

Figure 26A:
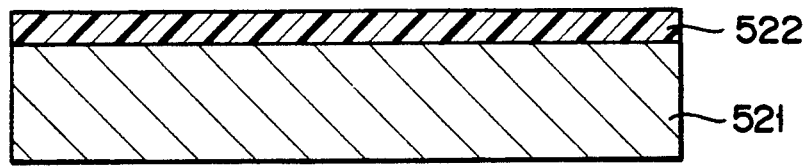
FIGS. 26A to 26C are sectional views showing manufacturing steps of a printed circuit board according to Example 30 of the present invention.
Figure 26B:
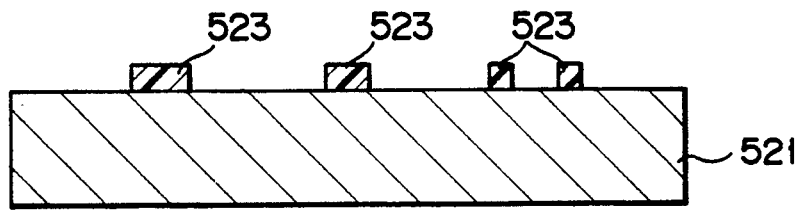
Figure 26C:
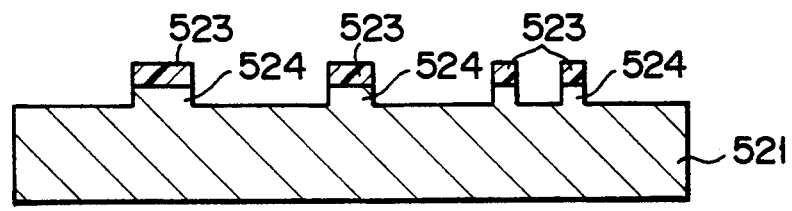
Figure 26D:
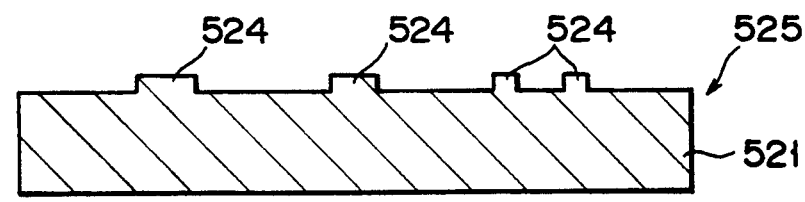

First, as shown in FIG. 26A, a photoresist was coated on a mirror-polished 30 cm×30 cm metal plate 521 by a spinner and dried to form a resist film 522. As shown in FIG. 26B, the resist film 522 was exposed and developed to form resist patterns 523. Subsequently, the resist patterns 523 were used as a mask to etch the exposed surface of the metal plate 521 to a depth of 20 μm, thereby forming protruding patterns 524 having the same shape as circuit patterns, as shown in FIG. 26C. Thereafter, the resist patterns 523 were peeled to manufacture a cavity core 525 having the protruding patterns 524, as shown in FIG. 26D.

Figure 26E:
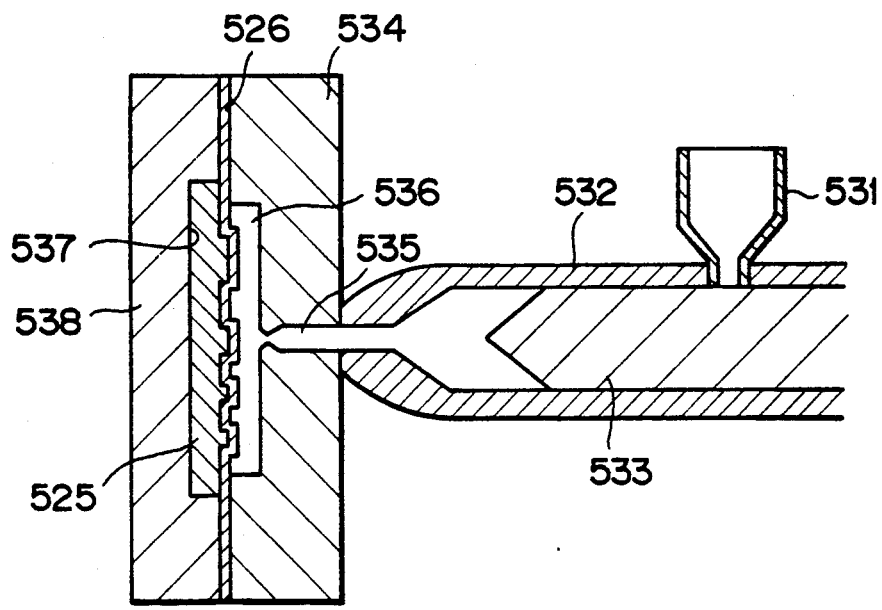

The core 525 was assembled in an injection molding machine shown in FIG. 26E. That is, this injection molding machine comprises a cylinder 532 having a hopper 531 for supplying resin pellets, a screw 533 inserted in the cylinder 532, a stationary mold 534 mounted on the distal end of the cylinder 532, a cavity 536 formed in the stationary mold 534 and communicating with the cylinder 532 through a runner 535, and a movable mold 538 to be clamped to the stationary mold 534 and having a cavity 537. The core 525 was mounted in the cavity 537 of the movable mold 538 of the injection molding machine having the above arrangement such that the protruding patterns of the core 525 were exposed to the opposing surface. The movable mold 538 and the stationary mold 534 were clamped with a copper foil 526 arranged therebetween. The stationary mold 534 and the movable mold 538 were heated up to 150° C., and pellets of a polyphenylenesulfide resin (PPS resin) were put in the hopper 531. The PPS resin was heat-melted at a temperature of 320° C. and supplied into the cylinder 532, and the screw 533 was moved forward to inject the molten PPS resin into the cavity 536 of the stationary mold 534 through the runner 535. In this step, the molten PPS resin was supplied into the cavity 536 to form a PPS resin film bonded to the copper foil 526 arranged between the stationary mold 534 and the movable mold 538, and the copper foil 526 was urged and deformed against the protruding patterns of the core 525 in the movable mold 538 by the injection pressure, thereby forming recess patterns.

Figure 26F:
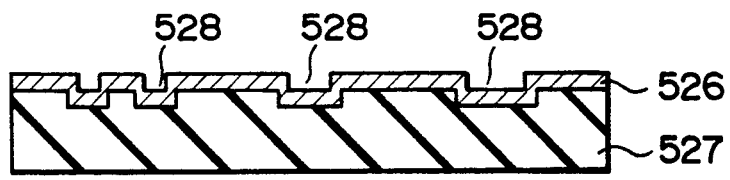
Figure 26G:
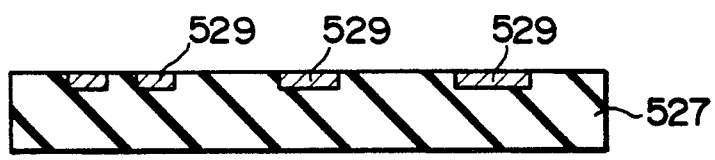

Subsequently, the movable mold 538 was opened to remove the PPS resin film together with the copper foil 526 from the stationary mold 534, and the copper foils extended from the two sides of the film were cut to manufacture a PPS resin film 527 to which the copper foil 526 having recess patterns 528 shown in FIG. 26F was integrally bonded. Thereafter, while water was flowed on the surface on the side of the recess patterns 528, protruding portions of the copper foil 526 of the 10 film 527 were ground and removed by a drum wound by sandpaper, thereby manufacturing a printed circuit board having copper circuit patterns 529 buried at the same level as the surface of the PPS resin film 527 as a base, as shown in FIG. 26G.

The peeling strength of the circuit patterns of the obtained printed circuit board was measured. As a result, the patterns had a high adhesion strength of 1.7 kg/cm².

EXAMPLE 31

Figure 27A:
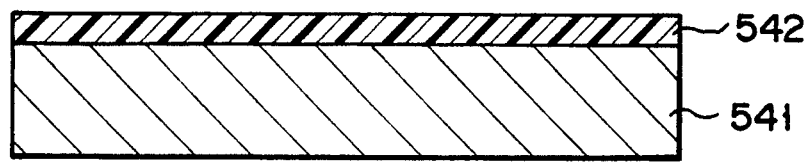
FIGS. 27A to 27H are sectional views showing manufacturing steps of a printed circuit board according to Example 31 of the present invention.
Figure 27B:
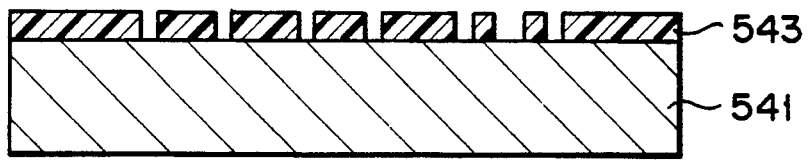
Figure 27C:
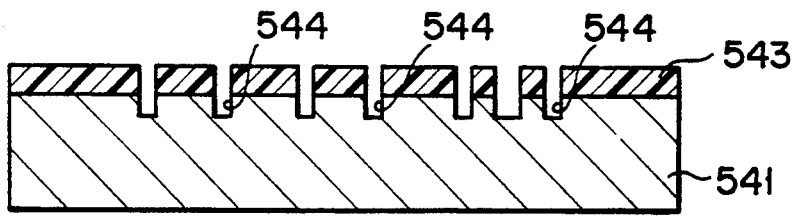
Figure 27D:
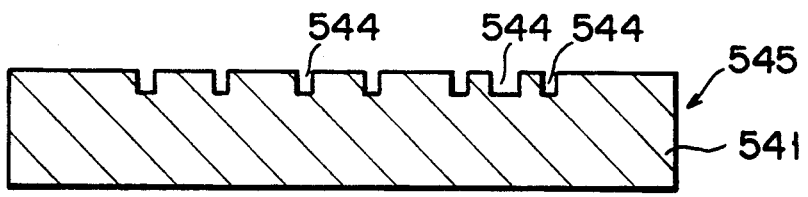

First, as shown in FIG. 27A, a photoresist was coated on a mirror-polished surface of a 30 cm×30 cm metal plate 541 by a spinner and dried to form a resist film 542. As shown in FIG. 27B, the resist film 542 was exposed and developed to form resist patterns 543. Subsequently, the resist patterns 543 were used as a mask to etch the exposed surface of the metal plate 541 to a depth of 30 μm, thereby forming trench patterns 544 corresponding to edges of circuit patterns, as shown in FIG. 27C. Thereafter, the resist patterns 543 were removed to manufacture a metal mold 545 having the trench patterns 544 corresponding to the circuit pattern edges, as shown in FIG. 27D.

Figure 27E:
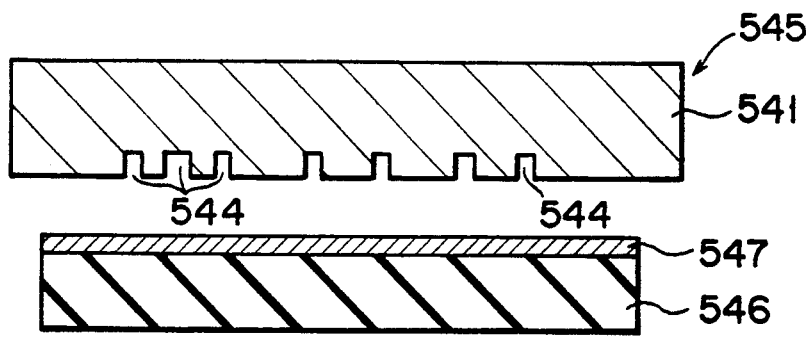
Figure 27F:
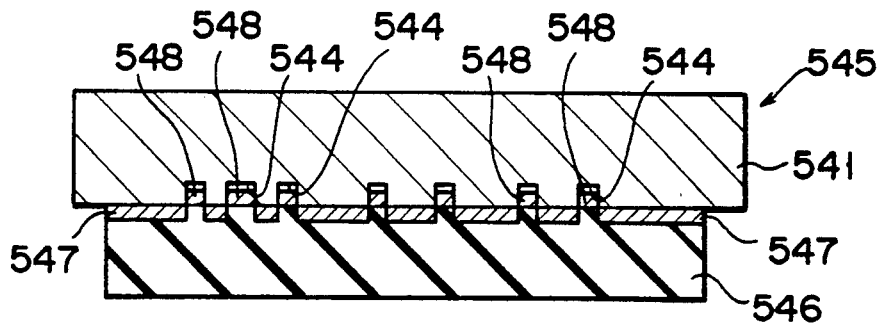
Figure 27G:
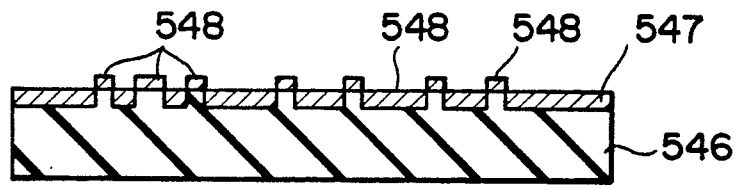
Figure 27H:
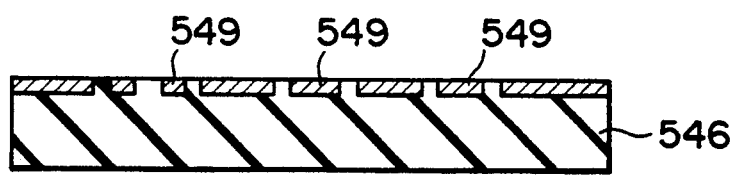
Figure 28:
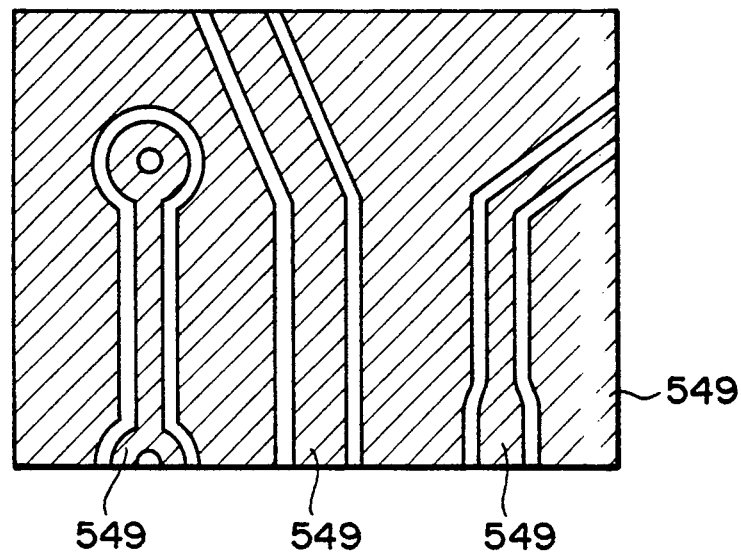
FIG. 28 is a plan view of FIG. 27H.

Subsequently, as shown in FIG. 27E, an 18 μm thick copper foil 547 was bonded on a 1 mm thick fluorine resin plate 546 to manufacture a copper-clad fluorine resin base. This base was set in a vacuum vessel (not shown), and the metal mold 545 was arranged above the base such that the trench patterns 544 opposed the copper foil 547. The pressure in the vacuum vessel was reduced to be 10 torr, and the metal mold 545 was moved downward to the base while being heated up to 270° C. and heated under pressure at a pressure of 3 kg/cm² for 20 seconds. In this step, as shown in FIG. 27F, portions of the copper foil 547 on the surface of the plate 546 and corresponding to the trench patterns 544 of the metal mold 545 protruded into the trench patterns 544 to form protruding patterns 548 of the copper foil on portions corresponding to a region where no circuit patterns were to be formed. At the same time, portions of the plate 546 below the protruding portions 548 also projected to the same level as the nonprotruding region of the copper foil 547. Subsequently, the metal mold 545 was moved upward, and the copper-clad fluorine resin base having the protruding patterns 548 shown in FIG. 27G was removed from the vacuum vessel. Thereafter, while water was flowed on the copper foil 547 on the surface of the plate 546, the protruding patterns 548 of the plate 546 were ground and removed by a drum wound by sandpaper. As a result, as shown in FIGS. 27H and 28, a printed circuit board constituted by the plate 546 and island-like copper circuit patterns 549 trimmed by the portions of the plate 546 protruding to the same level as the copper foil in the nonprotruding region was manufactured. Note that FIG. 28 is a plan view of FIG. 27H.

The peeling strength of the circuit patterns of the obtained printed circuit board was measured. As a result, it was confirmed that the patterns had a high adhesion strength of 1.5 kg/cm².

As has been described above, according to the present invention, there is provided a method capable of simply and inexpensively manufacturing a printed circuit board on which circuit patterns having a high adhesion strength with respect to a thermoplastic resin are formed, without posing a problem of waste liquors such as a plating solution and an etching solution.

In addition, according to the present invention, there is provided a method for manufacturing a printed circuit board such as a flexible double-sided printed circuit board or a flexible multilayered printed circuit board in which circuit patterns having a fine line width are precisely arranged at predetermined positions with a high adhesion strength with respect to a resin film, and circuit patterns on both the surfaces or of the respective layers are connected well, without producing waste liquors in which a large amount of copper is dissolved.

Furthermore, according to the present invention, there is provided a method for manufacturing a flat or three-dimensional printed circuit board in which circuit patterns having a fine line width are buried at the same level as a flat or curved surface by using a transfer film to retransfer the circuit patterns onto an insulating material such as a prepreg, without producing waste liquors in which a large amount of copper is dissolved.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a printed circuit board, comprising the steps of:

manufacturing a printed circuit original plate having protruding patterns which have the same shape as circuit patterns to be formed and a height at least the same as a thickness of a metal foil used and each of which is constituted by a flat or projecting curved surface to be brought into contact with said metal foil and side surfaces converging inwardly from said flat or projecting curved surface over at least a portion of said side surfaces; and heating under pressure said protruding patterns of said original plate against a thermoplastic resin with said metal foil interposed therebetween to transfer portions of said metal foil in contact with said protruding patterns onto a surface of said thermoplastic resin, thereby forming said circuit patterns.

2. The method according to claim 1, wherein said thermoplastic resin has a softening temperature of not less than 200° C.

3. A method for manufacturing a printed circuit board, comprising the steps of:

manufacturing a printed circuit original plate having protruding patterns which have the same shape as circuit patterns to be formed and a height at least the same as a thickness of a metal foil used and each of which is constituted by a flat or projecting curved surface to be brought into contact with said metal foil and side surfaces converging inwardly from said flat or projecting curved surface over at least a portion of said side surfaces;

heating under pressure said protruding patterns of said original plate against a resin film with said metal foil interposed therebetween to transfer portions of said metal foil in contact with said protruding patterns onto a surface of said resin film to form said circuit patterns, thereby manufacturing a single-sided printed circuit base plate;

folding said circuit patterns of said single-sided printed circuit base plate and desired portions of said film toward the lower surface of the film, thereby forming a large number of folded portions having conductive portions formed integrally with said circuit patterns; and superposing a plurality of single-sided printed circuit base plates having said folded portions, and laminating said base plates by heating under pressure.

4. The method according to claim 3, wherein said resin film consists of a thermoplastic resin having a softening temperature of not less than 200° C.

5. The method according to claim 3, wherein said resin film consists of a thermoplastic resin film having a softening temperature difference between upper and lower surfaces thereof.

6. The method according to claim 5, wherein said thermoplastic resin film is obtained by laminating two thermoplastic resin layers having different softening temperatures.

7. The method according to claim 6, wherein when said metal foil is brought into contact with a low-softening temperature thermoplastic resin layer of said thermoplastic resin film, a thickness of said low-softening temperature thermoplastic resin layer is equal to or smaller than that of said metal foil.

8. The method according to claim 5, wherein said laminating step is performed at a temperature at which a low-softening temperature thermoplastic resin layer of said thermoplastic resin film is melted.

9. The method according to claim 3, wherein said resin film has a softening temperature difference between upper and lower surfaces and an interior thereof.

10. The method according to claim 9, wherein said thermoplastic resin film is obtained by coating two surfaces of a thermoplastic resin layer with thermoplastic resin layers each having a thickness smaller than that of said metal foil and a softening temperature lower than that of said thermoplastic resin layer.

11. The method according to claim 9, wherein said laminating step is performed at a temperature at which a low-softening temperature thermoplastic resin layer of said thermoplastic resin film is melted.

12. The method according to claim 3, wherein said resin film consists of a thermoplastic resin film, a surface of which is to be brought into contact with said metal foil is coated with an adhesive layer.

13. The method according to claim 3, wherein said step of forming folded portions is performed by inserting a notching member having a single-edged blade at a distal end thereof into circuit patterns of said single-sided printed circuit base plate and desired portions of said film to extend notched portions constituted by said circuit patterns and said film downward in an insertion direction of said notching member, and folding said notched portions such that the film of each notched portion overlaps the lower surface of the film of said base plate.

14. A method for manufacturing a printed circuit board, comprising the steps of:

manufacturing a printed circuit original plate having protruding patterns which have the same shape as circuit patterns to be formed and a height at least the same as a thickness of a metal foil used and each of which is constituted by a flat or projecting curved surface to be brought into contact with said metal foil and side surfaces converging inwardly from said flat or projecting curved surface over at least a portion of said side surfaces;

pressing said protruding patterns of said original plate against a film consisting of a resin or rubber with a metal foil interposed therebetween to transfer portions of said metal foil in contact with said protruding patterns onto a surface of said film to form said circuit patterns, thereby manufacturing a transfer film; and retransferring said circuit patterns of said transfer film onto an insulating base.

15. The method according to claim 14, wherein said rubber is silicone rubber.

16. The method according to claim 14, wherein said insulating base is a prepreg obtained by impregnating a thermosetting resin into a glass cloth.

17. The method according to claim 14, wherein said insulating base is a thermoplastic resin film, at least one surface of which is coated with an adhesive layer.

18. A method for manufacturing a printed circuit board, comprising the steps of:

manufacturing a printed circuit original plate having protruding patterns which have the same shape as circuit patterns to be formed and a height at least the same as a thickness of a metal foil used, each of said protruding patterns having a flat or projecting curved surface to be brought into contact with said metal foil, said original plate having a plurality of holes positioned in non-protruding regions; and heating under pressure said protruding patterns of said original plate against a resin film with said metal foil interposed therebetween while drawing said metal foil for said original plate by suction through said holes of said original plate to transfer portions of said metal foil in contact with said protruding patterns onto a surface of said resin, thereby forming said circuit patterns.

19. The method according to claim 18, wherein said resin is a thermoplastic resin having a softening temperature of not less than 200° C.

20. A method for manufacturing a printed circuit board, comprising the steps of:

manufacturing a printed circuit original plate having protruding patterns which have the same shape as circuit patterns to be formed and a height at least the same as a thickness of a metal foil used, each of said protruding patterns having a flat or projecting curved surface to be brought into contact with said metal foil;

heating under pressure said protruding patterns of said original plate against a resin film with said metal foil interposed therebetween to transfer portions of said metal foil in contact with said protruding patterns onto a surface of said resin film to form said circuit patterns, thereby manufacturing a single-sided printed circuit base plate;

folding said circuit patterns of said single-sided printed circuit base plate and desired portions of said film toward the lower surface of the film, thereby forming a large number of folded portions having conductive portions formed integrally with said circuit patterns; and superposing a plurality of single-sided printed circuit base plates by heating under pressure.

21. The method according to claim 20, wherein said resin film consists of a thermoplastic resin having a softening temperature of not less than 200° C.

22. The method according to claim 20, wherein said resin film consists of a thermoplastic resin film having a softening temperature difference between upper and lower surfaces thereof.

23. The method according to claim 22, wherein said thermoplastic resin film is obtained by laminating two thermoplastic resin layers having different softening temperatures.

24. The method according to claim 23, wherein when said metal foil is brought into contact with a low-softening temperature thermoplastic resin layer of said thermoplastic resin film, a thickness of said low-softening temperature thermoplastic resin layer is equal to or smaller than that of said metal foil.

25. The method according to claim 22, wherein said laminating step is performed at a temperature at which a low-softening temperature thermoplastic resin layer of said thermoplastic resin film is melted.

26. The method according to claim 20, wherein said resin film has a softening temperature difference between upper and lower surfaces and an interior thereof.

27. The method according to claim 26, wherein said thermoplastic resin film is obtained by coating two surfaces of a thermoplastic resin layer with thermoplastic resin layers each having a thickness smaller than that of said metal foil and softening temperature lower than that of said thermoplastic resin layer.

28. The method according to claim 26, wherein said laminating step is performed at a temperature at which low-softening temperature thermoplastic resin layer of said thermoplastic resin film is melted.

29. The method according to claim 20, wherein said resin film consists of a thermoplastic resin film, a surface of which is to be brought into contact with said metal foil is coated with an adhesive layer.

30. The method according to claim 20, wherein said step of forming portions is performed by inserting a notching member having a single-edge blade at a distal end thereof into circuit patterns of said single-sided printed circuit base plate and desired portions of said film to extend notched portions constituted by said circuit patterns and said film downward in an insertion direction of said notching member, and folding said notched portions such that the film of each notched portions overlaps the lower surface of the film of said base plate.

31. A method for manufacturing a printed circuit board, comprising the steps of:

manufacturing a printed circuit original plate having protruding patterns which have the same shape as circuit patterns to be formed and a height at least the same as a thickness of a metal foil used, each of said protruding pattern having a flat or projecting curved surface to be brought into contact with said metal foil;

pressing said protruding patterns of said original plate against a film consisting of a resin or rubber with a metal foil interposed therebetween to transfer portions of said metal foil in contact with said protruding patterns onto a surface of said film to form said circuit patterns, thereby manufacturing a transfer film, and retransferring said circuit patterns of said transfer film onto an insulating base.

32. The method according to claim 31, wherein said rubber is silicone rubber.

33. The method according to claim 31, wherein said insulating base is a prepreg obtained by impregnating a thermosetting resin into a glass cloth.

34. The method according to claim 29, wherein said insulating base is a thermoplastic resin film, at least one surface of which is coated with an adhesive layer.

* * * * *